United States Patent
Tezuka et al.

(10) Patent No.: US 9,190,527 B2
(45) Date of Patent: Nov. 17, 2015

(54) SEMICONDUCTOR DEVICE AND MANUFACTURING METHOD OF SEMICONDUCTOR DEVICE

(71) Applicant: Semiconductor Energy Laboratory Co., Ltd., Atsugi-shi, Kanagawa-ken (JP)

(72) Inventors: Sachiaki Tezuka, Atsugi (JP); Hideomi Suzawa, Atsugi (JP); Akihisa Shimomura, Atsugi (JP); Tetsuhiro Tanaka, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 4 days.

(21) Appl. No.: 14/174,412

(22) Filed: Feb. 6, 2014

(65) Prior Publication Data

US 2014/0225103 A1   Aug. 14, 2014

(30) Foreign Application Priority Data

Feb. 13, 2013   (JP) .................................. 2013-025140
Feb. 28, 2013   (JP) .................................. 2013-038705

(51) Int. Cl.
*H01L 29/49* (2006.01)
*H01L 29/786* (2006.01)
*H01L 29/66* (2006.01)

(52) U.S. Cl.
CPC ...... *H01L 29/7869* (2013.01); *H01L 29/66969* (2013.01)

(58) Field of Classification Search
CPC .......................... H01I 29/7869; H01I 29/66969
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Michael Shingleton
(74) *Attorney, Agent, or Firm* — Eric J. Robinson; Robinson Intellectual Property Law Office, P.C.

(57) ABSTRACT

A highly reliable semiconductor device including an oxide semiconductor is provided. Oxygen is supplied from a base insulating layer provided below an oxide semiconductor layer to a channel formation region, whereby oxygen vacancies which might be generated in the channel formation region are filled. Further, a protective insulating layer containing a small amount of hydrogen and functioning as a barrier layer having a low permeability to oxygen is formed over the gate electrode layer so as to cover side surfaces of an oxide layer and a gate insulating layer that are provided over the oxide semiconductor layer, whereby release of oxygen from the gate insulating layer and/or the oxide layer is prevented and generation of oxygen vacancies in a channel formation region is prevented.

15 Claims, 22 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,378,351 B2 | 2/2013 | Fukumoto et al. |
| 8,921,853 B2 | 12/2014 | Yamazaki |
| 8,963,148 B2 | 2/2015 | Matsubayashi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0147740 A1* | 6/2011 | Jeong et al. ............ 257/43 |
| 2011/0240991 A1 | 10/2011 | Yamazaki |
| 2013/0320334 A1 | 12/2013 | Yamazaki et al. |
| 2013/0334523 A1 | 12/2013 | Yamazaki |
| 2013/0334533 A1 | 12/2013 | Yamazaki |
| 2014/0001465 A1 | 1/2014 | Yamazaki |
| 2014/0034946 A1 | 2/2014 | Yamazaki et al. |
| 2014/0042433 A1 | 2/2014 | Yamazaki |
| 2014/0042437 A1 | 2/2014 | Yamazaki |
| 2014/0042438 A1 | 2/2014 | Yamazaki |
| 2014/0077205 A1 | 3/2014 | Yamazaki et al. |
| 2014/0103337 A1 | 4/2014 | Yamazaki et al. |
| 2014/0103346 A1 | 4/2014 | Yamazaki |
| 2014/0175435 A1 | 6/2014 | Yamazaki et al. |
| 2014/0183530 A1 | 7/2014 | Yamazaki et al. |
| 2014/0203276 A1 | 7/2014 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2011-222767 | 11/2011 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

(56) References Cited

OTHER PUBLICATIONS

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies In ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO) films", Appl. Phys. Lett. (Applied Physics Letters) , Sep. 13, 2004, vol. 85, No. 11, pp. 1993-1995.

(56) References Cited

OTHER PUBLICATIONS

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 8A1
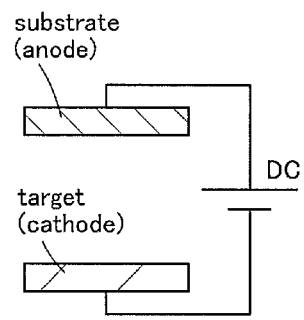
FIG. 8A2
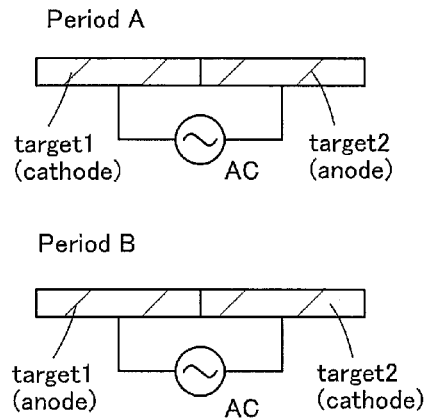
FIG. 8B1
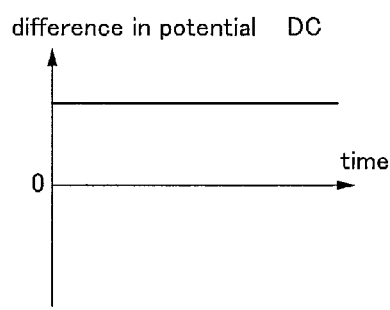
FIG. 8B2
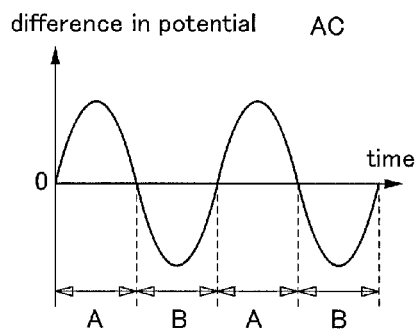
FIG. 8C1
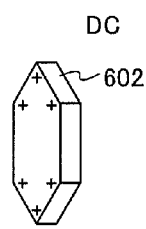
FIG. 8C2
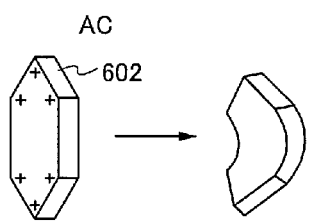

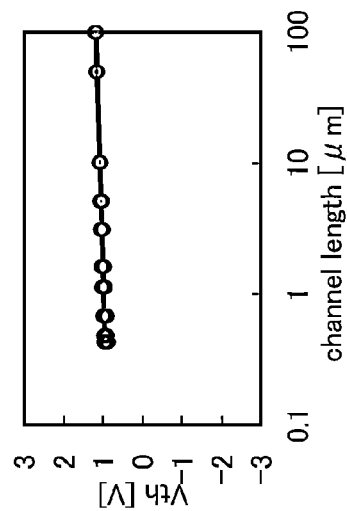
FIG. 17A
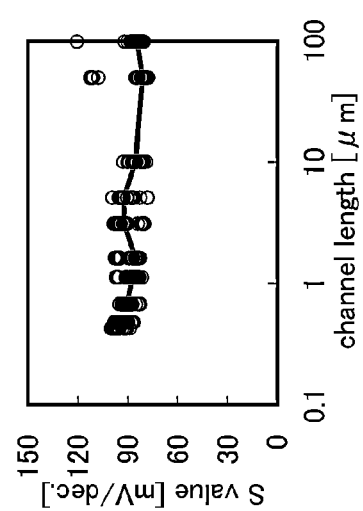
FIG. 17B
FIG. 17C
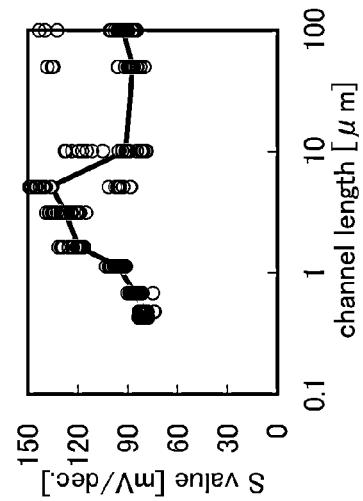
FIG. 17D
FIG. 17E
FIG. 17F

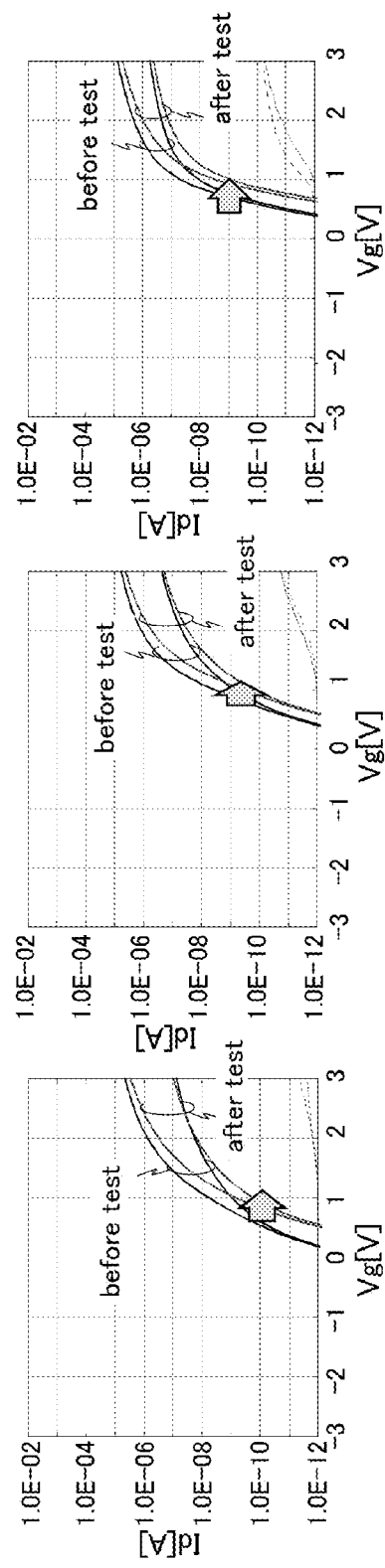

SEMICONDUCTOR DEVICE AND MANUFACTURING METHOD OF SEMICONDUCTOR DEVICE

BACKGROUND OF THE INVENTION

1. Field of the Invention

The present invention relates to an object (a product including a machine, a manufacture, and a composition of matter) and a method (a process including a simple method and a production method). In particular, one embodiment of the present invention relates to a semiconductor device, a light-emitting device, a power storage device, a driving method thereof, or a manufacturing method thereof.

In this specification, a semiconductor device refers to all the devices that can operate by utilizing semiconductor characteristics. An electrooptic device, a semiconductor circuit, and an electronic device may be included in the category of semiconductor devices or alternatively may include semiconductor devices in their categories.

2. Description of the Related Art

A technique by which transistors are formed using semiconductor thin films formed over a substrate having an insulating surface has been attracting attention. These transistors are applied to a wide range of electronic devices such as an integrated circuit (IC) or an image display device (also simply referred to as a display device). Although a silicon-based semiconductor material is widely known as a material of a semiconductor thin film applicable to a transistor, as another material, a semiconductor material using an oxide has been attracting attention.

For example, a transistor including an oxide (oxide semiconductor) containing indium (In), gallium (Ga), and zinc (Zn) is disclosed (see Patent Document 1).

Further, Patent Document 2 discloses that oxygen is released from an oxide semiconductor during a manufacturing process of a semiconductor device including an oxide semiconductor and thus oxygen vacancies are formed.

REFERENCE

Patent Document

[Patent Document 1] Japanese Published Patent Application No. 2006-165528
[Patent Document 2] Japanese Published Patent Application No. 2011-222767

SUMMARY OF THE INVENTION

An object of one embodiment of the present invention is to provide a semiconductor device including an oxide semiconductor, with favorable electrical characteristics.

Another object of one embodiment of the present invention is to provide a highly reliable semiconductor device including an oxide semiconductor by suppression of a change in electrical characteristics.

Another object of one embodiment of the present invention is to provide a semiconductor device with a reduced amount of defects. Further, another object of one embodiment of the present invention is to provide a semiconductor device with a reduced amount of impurities.

Note that the description of these objects does not disturb the description of other objects. In one embodiment of the present invention, there is no need to achieve all of these objects. Further, other objects will be apparent from and can be derived from the description of the specification, the drawings, the claims, and the like.

In a transistor formed using an oxide semiconductor, an oxygen vacancy is one factor generating a carrier in the oxide semiconductor. If many oxygen vacancies exist in an oxide semiconductor including a channel formation region in a transistor, carriers are generated in the channel formation region, which causes defective electrical characteristics of the transistor, such as a normally-on state, an increase in leakage current, and a shift (variation) of the threshold voltage due to stress application.

In the oxide semiconductor layer, hydrogen, silicon, nitrogen, carbon, and metal elements which are not the main components are impurities. For example, silicon in an oxide semiconductor layer forms impurity states, and the impurity states serve as traps to deteriorate electrical characteristics of the transistor.

Therefore, in order that a semiconductor device including an oxide semiconductor can have stable electrical characteristics, some measures need to be taken to reduce oxygen vacancies in the oxide semiconductor and to reduce the concentrations of impurities such as hydrogen and silicon in the oxide semiconductor.

In view of the foregoing, oxygen is supplied from a base insulating layer provided below an oxide semiconductor layer to a channel formation region in a semiconductor device of one embodiment of the present invention, whereby oxygen vacancies which might be generated in the channel formation region are filled. Further, a protective insulating layer containing a small amount of hydrogen and functioning as a barrier layer having a low permeability to oxygen is formed over a gate electrode layer so as to cover side surfaces of an oxide layer and a gate insulating layer that are provided over the oxide semiconductor layer, whereby release of oxygen from the gate insulating layer and/or the oxide layer is prevented and generation of oxygen vacancies in the channel formation region is thus prevented. Moreover, the base insulating layer is in contact with the protective insulating layer in a surrounding area of the island-shaped oxide semiconductor layer, whereby release (elimination) of oxygen from the base insulating layer to layers other than the oxide semiconductor layer is prevented.

Further, oxide layers containing one or more kinds of metal elements that are contained in the oxide semiconductor layer are provided in contact with an upper surface and a lower surface of the oxide semiconductor layer where the channel is formed. In this manner, the channel formation region can be separated away from insulating layers (e.g., gate insulating layer) that contain, as a main component, an element that works as an impurity in the oxide semiconductor layer, such as silicon. Further, an interface state is unlikely to be formed at the interface between the oxide semiconductor layer and each of the oxide layers, and thus variations in electrical characteristics of the transistor, such as a threshold voltage, can be reduced.

In the semiconductor device of one embodiment of the present invention, which has the above-described structure, the concentration of an impurity in the oxide semiconductor layer serving as a channel (serving as a main carrier path) can be reduced so that the oxide semiconductor layer is purified to be a highly purified intrinsic oxide semiconductor layer. The expression "highly purified intrinsic oxide semiconductor layer" means the intrinsic (i-type) or substantially intrinsic oxide semiconductor layer. Note that in this specification and the like, the substantially intrinsic oxide semiconductor layer has a carrier density of lower than $1 \times 10^{17}/cm^3$, lower than $1\times10^{15}/cm^3$, or lower than $1\times10^{13}/cm^3$. With a highly purified intrinsic oxide semiconductor layer, the transistor can have stable electrical characteristics.

More specifically, the following structures can be employed, for example.

One embodiment of the present invention is a semiconductor device which includes a first oxide layer, an oxide semiconductor layer over and in contact with the first oxide layer, a source electrode layer and a drain electrode layer electrically connected to the oxide semiconductor layer, a second oxide layer over the source electrode layer and the drain electrode layer and in contact with the oxide semiconductor layer, a gate insulating layer over the second oxide layer, a gate electrode layer overlapping with the oxide semiconductor layer with the gate insulating layer provided therebetween, and a protective insulating layer over the gate electrode layer that covers a side surface of the second oxide layer and a side surface of the gate insulating layer. In the semiconductor device, the first oxide layer and the second oxide layer include at least one metal element of metal elements included in the oxide semiconductor layer. In addition, the protective insulating layer is a layer having lower permeability to oxygen than the second oxide layer and the gate insulating layer.

Another embodiment of the present invention is a semiconductor device which includes a base insulating layer containing oxygen, a first oxide layer over and in contact with the base insulating layer, an oxide semiconductor layer over and in contact with the first oxide layer, a source electrode layer and a drain electrode layer electrically connected to the oxide semiconductor layer, a second oxide layer over the source electrode layer and the drain electrode layer and in contact with the oxide semiconductor layer, a gate insulating layer over the second oxide layer, a gate electrode layer overlapping with the oxide semiconductor layer with the gate insulating layer provided therebetween, and a protective insulating layer over the gate electrode layer that covers a side surface of the second oxide layer and a side surface of the gate insulating layer. In the semiconductor device, the first oxide layer and the second oxide layer include at least one metal element of metal elements included in the oxide semiconductor layer. In addition, the protective insulating layer is a layer having lower permeability to oxygen than the second oxide layer and the gate insulating layer.

In the above semiconductor device, it is preferable that the protective insulating layer be in contact with the base insulating layer in a surrounding area of the oxide semiconductor layer.

In each cross section of the above semiconductor devices, it is preferable that an upper edge of the second oxide layer coincide with a lower edge of the gate insulating layer and that an upper edge of the gate insulating layer coincide with a lower edge of the gate electrode layer.

In the above semiconductor devices, it is preferable that the first oxide layer, the second oxide layer, and the oxide semiconductor layer include at least indium and that an atomic ratio of the indium in the oxide semiconductor layer be higher than an atomic ratio of the indium in the first oxide layer and an atomic ratio of the indium in the second oxide layer.

Another embodiment of the present invention is a manufacturing method of a semiconductor device, which includes the steps of: forming a first oxide film and an oxide semiconductor film over a base insulating layer containing oxygen; processing the first oxide film and the oxide semiconductor film to form an island-shaped first oxide layer and an island-shaped oxide semiconductor layer; forming a source electrode layer and a drain electrode layer over and in contact with the oxide semiconductor layer; forming a second oxide film over the source electrode layer and the drain electrode layer and in contact with the oxide semiconductor layer; forming a gate insulating film over the second oxide film; forming a gate electrode layer over the gate insulating film; processing the gate insulating film and the second oxide film using the gate electrode layer as a mask, to form a gate insulating layer and a second oxide layer; forming a protective insulating layer that covers a side surface of the second oxide layer and a side surface of the gate insulating layer, over the gate electrode layer; and after formation of the protective insulating layer, performing heat treatment to supply oxygen contained in the base insulating layer to the oxide semiconductor layer.

With one embodiment of the present invention, a transistor including an oxide semiconductor that has favorable electrical characteristics can be provided.

Further, with one embodiment of the present invention, a highly reliable semiconductor device including an oxide semiconductor can be provided by suppression of a change in electrical characteristics.

BRIEF DESCRIPTION OF THE DRAWINGS

In the accompanying drawings:

FIGS. 8A1, 8B1, and 8C1 and FIGS. 8A2, 8B2, and 8C2 show plasma discharge in sputtering using a DC power source and an AC power source, respectively;

FIGS. 17A to 17F show evaluation results of the channel length dependence of electrical characteristics of transistors fabricated in Example 1;

FIGS. 18A to 18F show evaluation results of the reliability test of transistors fabricated in Example 1;

DETAILED DESCRIPTION OF THE INVENTION

Figure 1A:
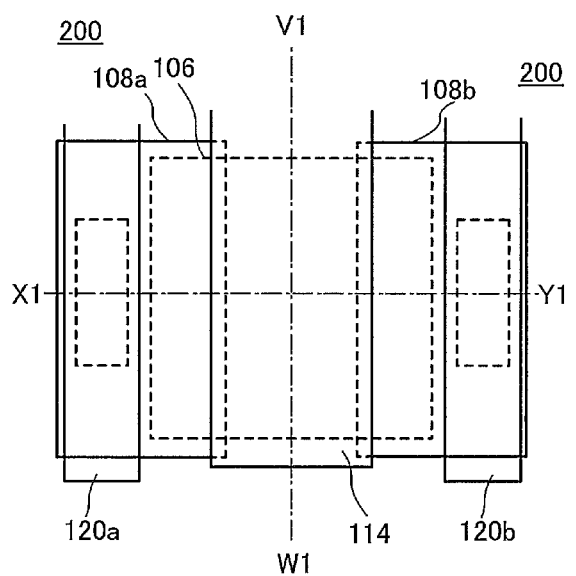
FIGS. 1A to 1C are a plan view and cross-sectional views illustrating one embodiment of a semiconductor device.

Hereinafter, embodiments of the present invention will be described in detail with reference to the accompanying drawings. However, the invention disclosed in this specification is not limited to the description below and it is easily understood by those skilled in the art that the mode and details can be modified in various ways. Therefore, the invention disclosed in this specification is not construed as being limited to the description of the embodiments given below.

Note that in structures of one embodiment of the present invention described below, the same portions or portions having similar functions are denoted by the same reference numerals in different drawings, and description thereof is not repeated. Further, the same hatching pattern is applied to portions having similar functions, and the portions are not especially denoted by reference numerals in some cases.

Note that in this specification and the like, ordinal numbers such as "first", "second", and the like are used in order to avoid confusion among components and do not limit the number.

Note that functions of a "source" and a "drain" of a transistor are sometimes replaced with each other when a transistor of opposite polarity is used or when the direction of current flow is changed in circuit operation, for example. Therefore, the terms "source" and "drain" can be used to denote the drain and the source, respectively, in this specification.

In this specification and the like, for example, when the shape of an object is described with use of a term such as "diameter", "grain size (diameter)", "dimension", "size", or "width", the term can be regarded as the length of one side of a minimal cube where the object fits, or an equivalent circle diameter of a cross section of the object. The term "equivalent circle diameter of a cross section of the object" refers to the diameter of a perfect circle having the same area as that of the cross section of the object.

Embodiment 1

In this embodiment, a semiconductor device and a manufacturing method of the semiconductor device according to one embodiment of the present invention will be described with reference to FIGS. 1A to 1C, FIGS. 2A and 2B, FIGS. 3A to 3E, and FIGS. 4A to 4C. In this embodiment, a top gate transistor including an oxide semiconductor layer will be described as an example of the semiconductor device.

<Structural Example of Semiconductor Device>

Figure 1B:
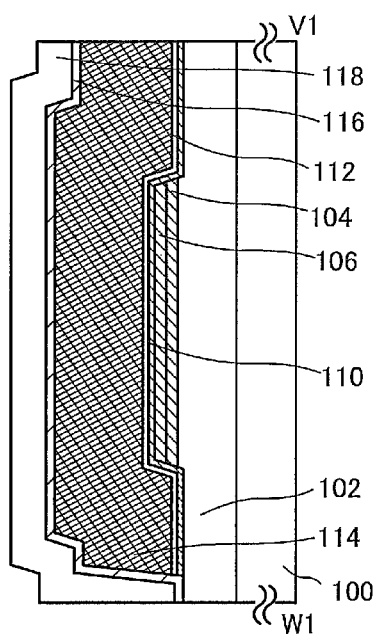
Figure 1C:
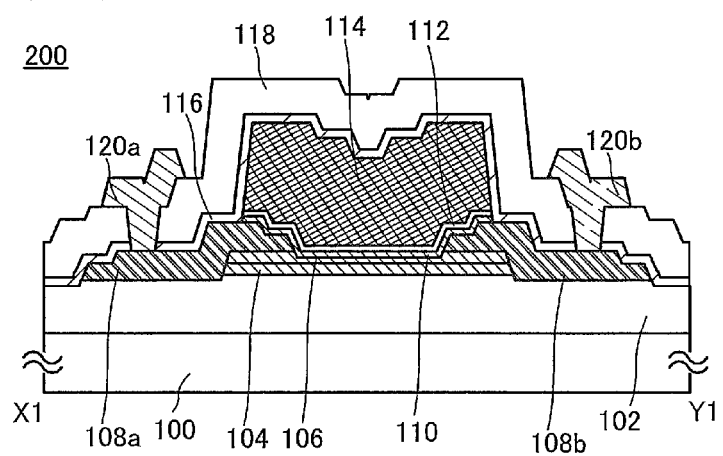

FIGS. 1A to 1C illustrate a structural example of a transistor 200. FIG. 1A is a plan view of the transistor 200, FIG. 1B is a cross-sectional view taken along line V1-W1 in FIG. 1A, and FIG. 1C is a cross-sectional view taken along line X1-Y1 in FIG. 1A. Note that in FIG. 1A, some components of the semiconductor device (e.g., a protective insulating layer 116) are not illustrated to avoid complexity.

The transistor 200 illustrated in FIGS. 1A to 1C includes, over a base insulating layer 102 provided over a substrate 100 having an insulating surface, an island-shaped first oxide layer 104, an island-shaped oxide semiconductor layer 106 over and in contact with the first oxide layer 104, a source electrode layer 108a and a drain electrode layer 108b that are electrically connected to the oxide semiconductor layer 106, a second oxide layer 110 over the source electrode layer 108a and the drain electrode layer 108b and in contact with the oxide semiconductor layer 106, a gate insulating layer 112 over the second oxide layer 110, a gate electrode layer 114 overlapping with the oxide semiconductor layer 106 with the gate insulating layer 112 provided therebetween, and a protective insulating layer 116 that is provided over the gate electrode layer 114 and covers side surfaces of the second oxide layer 110 and the gate insulating layer 112. Note that an insulating layer 118 over the protective insulating layer 116 may be regarded as a component of the transistor 200. Further, a wiring layer 120a and a wiring layer 120b that are electrically connected to the source electrode layer 108a and the drain electrode layer 108b may be regarded as components of the transistor 200.

As illustrated in FIG. 1B, the transistor 200 has a structure in the channel width direction in which the second oxide layer 110 covers side surfaces of the island-shaped first oxide layer 104 and the island-shaped oxide semiconductor layer 106, and the gate insulating layer 112 covers the side surface of the second oxide layer 110. With this structure, the influence of a parasitic channel which might be generated in an end portion in the channel width direction of the oxide semiconductor layer 106 can be reduced.

As illustrated in FIGS. 1A and 1C, the second oxide layer 110 and the gate insulating layer 112 have the same plan shape as that of the gate electrode layer 114. In other words, in the cross-section, an upper edge of the second oxide layer 110 coincides with a lower edge of the gate insulating layer 112, and an upper edge of the gate insulating layer 112 coincides with a lower edge of the gate electrode layer 114. This shape can be formed by processing the second oxide layer 110 and the gate insulating layer 112 using the gate electrode layer 114 as a mask (or using the same mask that is used for the gate electrode layer 114). In this specification and the like, the term "the same" or "coincide" does not necessarily mean exactly being the same or exactly coinciding and include the meaning of being substantially the same or substantially coinciding. For example, shapes obtained by etching using the same mask are expressed as being the same or coinciding with each other.

As illustrated in FIG. 1C, the side surfaces of the second oxide layer 110 and the gate insulating layer 112 are covered with the protective insulating layer 116. Further, the protective insulating layer 116 is in contact with the base insulating layer 102 in a surrounding area of the island-shaped oxide semiconductor layer 106.

The components of the transistor 200 will be described in detail below.

<<Substrate>>

The substrate 100 is not limited to a simple supporting substrate, and may be a substrate where a device such as a transistor is formed. In this case, at least one of the gate electrode layer 114, the source electrode layer 108a, the drain electrode layer 108b, the wiring layer 120a, and the wiring layer 120b of the transistor 200 may be electrically connected to the above device.

<<Base Insulating Layer>>

The base insulating layer 102 has a function of supplying oxygen to the first oxide layer 104 and/or the oxide semiconductor layer 106 as well as a function of preventing diffusion of an impurity from the substrate 100. Therefore, an insulating layer containing oxygen is used as the base insulating layer 102. The supply of oxygen from the base insulating layer 102 can reduce oxygen vacancies in the oxide semiconductor layer 106. Note that in the case where the substrate 100 is a substrate where another device is formed as described above, the base insulating layer 102 also has a function as an interlayer insulating film. In that case, the base insulating layer 102 is preferably subjected to planarization treatment such as chemical mechanical polishing (CMP) treatment so as to have a flat surface.

In the transistor 200 in this embodiment, the base insulating layer 102 containing oxygen is provided below the stacked structure including the oxide semiconductor layer. With this structure, oxygen contained in the base insulating layer 102 can be supplied to a channel formation region. The base insulating layer 102 preferably includes a region containing oxygen in excess of the stoichiometric composition. When the base insulating layer 102 contains excess oxygen, supply of oxygen to the channel formation region is promoted.

Note that in this specification and the like, excess oxygen means oxygen which can be transferred in an oxide semiconductor layer, silicon oxide, or silicon oxynitride; oxygen which exists in excess of the intrinsic stoichiometric composition; or oxygen having a function of filling Vo (oxygen vacancies) generated due to lack of oxygen.

<<First Oxide Layer, Oxide Semiconductor Layer, and Second Oxide Layer>>

The transistor 200 includes a stacked structure including the first oxide layer 104, the oxide semiconductor layer 106, and the second oxide layer 110, between the base insulating layer 102 and the gate insulating layer 112.

The first oxide layer 104 and the second oxide layer 110 are oxide layers containing one or more kinds of metal elements that are contained in the oxide semiconductor layer 106.

The oxide semiconductor layer 106 includes a layer represented by an In-M-Zn oxide, which contains at least indium, zinc, and M (M is a metal element such as Al, Ga, Ge, Y, Zr, Sn, La, Ce, or Hf). The oxide semiconductor layer 106 preferably contains indium, because carrier mobility of the transistor is increased.

The first oxide layer 104 under the oxide semiconductor layer 106 includes an oxide layer which is represented by an In-M-Zn oxide (M is a metal element such as Al, Ti, Ga, Ge, Y, Zr, Sn, La, Ce, or Hf) and which has a higher proportion of M with respect to In in atomic ratio than the oxide semiconductor layer 106. Specifically, the amount of the element M in the first oxide layer 104 in atomic ratio is 1.5 times or more, preferably twice or more, further preferably three times or more as much as that in the oxide semiconductor layer 106 in atomic ratio. The elements serving as the element M are more strongly bonded to oxygen than indium is, and thus have a function of suppressing generation of oxygen vacancies in the oxide layer. That is, oxygen vacancies are less likely to be generated in the first oxide layer 104 than in the oxide semiconductor layer 106.

Further, in a manner similar to the first oxide layer 104, the second oxide layer 110 over the oxide semiconductor layer 106 includes an oxide layer which is represented by an In-M-Zn oxide (M is a metal element such as Al, Ti, Ga, Ge, Y, Zr, Sn, La, Ce, or Hf) and which has a higher proportion of M with respect to In in atomic ratio than the oxide semiconductor layer 106. Specifically, the amount of the element M in the second oxide layer 110 in atomic ratio is 1.5 times or more, preferably twice or more, further preferably three times or more as much as that in the oxide semiconductor layer 106 in atomic ratio. Note that, if the proportion of M with respect to In is too high, the bandgap of the second oxide layer 110 is increased and the second oxide layer 110 might function as an insulating layer. Therefore, it is preferable to adjust the proportion of M such that the second oxide layer 110 functions as a semiconductor layer. Note that the second oxide layer 110 may function as part of the gate insulating layer, depending on the proportion of M.

When each of the first oxide layer 104, the oxide semiconductor layer 106, and the second oxide layer 110 is an In-M-Zn oxide containing at least indium, zinc, and M (M is a metal element such as Al, Ti, Ga, Ge, Y, Zr, Sn, La, Ce, or Hf), and the first oxide layer 104 has an atomic ratio of In to M and Zn which is $x_1:y_1:z_1$, the oxide semiconductor layer 106 has an atomic ratio of In to M and Zn which is $x_2:y_2:z_2$, and the second oxide layer 110 has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, further preferably 3 times or more as large as $y_2/x_2$. At this time, when $y_2$ is greater than or equal to $x_2$ in the oxide semiconductor layer 106, a transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case of using an In-M-Zn oxide for the first oxide layer 104, when Zn and O are eliminated from consideration, the proportion of In and the proportion of M are preferably less than 50 atomic % and greater than or equal to 50 atomic %, respectively, further preferably less than 25 atomic % and greater than or equal to 75 atomic %, respectively. In the case of using an In-M-Zn oxide for the oxide semiconductor layer 106, when Zn and O are eliminated from consideration, the proportion of In and the proportion of M are preferably greater than or equal to 25 atomic % and less than 75 atomic %, respectively, further preferably greater than or equal to 34 atomic % and less than 66 atomic %, respectively. In the case of using an In-M-Zn oxide for the second oxide semiconductor layer 110, when Zn and O are eliminated from consideration, the proportion of In and the proportion of M are preferably less than 50 atomic % and greater than or equal to 50 atomic %, respectively, further preferably less than 25 atomic % and greater than or equal to 75 atomic %, respectively.

The constituent elements of the first oxide layer 104 and the second oxide layer 110 may be different from each other, or their constituent elements may be the same at the same atomic ratios or different atomic ratios.

For the first oxide layer 104, the oxide semiconductor layer 106, and the second oxide layer 110, an oxide semiconductor containing indium, zinc, and gallium can be used, for example.

It is preferable that the thickness of the first oxide layer 104 be at least larger than that of the oxide semiconductor layer 106. The first oxide layer 104 with a large thickness can prevent trap states generated at the interface between the base insulating layer 102 and the first oxide layer 104 from influencing the channel. However, since the first oxide layer 104 is the path of oxygen from the base insulating layer 102 to the oxide semiconductor layer 106, an excessively large thickness of the first oxide layer 104 inhibits the supply of oxygen and is unpreferable. Specifically, the thickness of the first oxide layer 104 can be more than or equal to 20 nm and less than or equal to 200 nm, 120 nm, or 80 nm, for example.

Further, the thickness of the oxide semiconductor layer 106 is preferably larger than that of the second oxide layer 110 and smaller than that of the first oxide layer 104. For example, the thickness of the oxide semiconductor layer 106 is greater than or equal to 1 nm and less than or equal to 40 nm, preferably greater than or equal to 5 nm and less than or equal to 20 nm.

Furthermore, the thickness of the second oxide layer 110 is the thickness that prevents a constituent element of the gate insulating layer 112 that works as an impurity in the oxide semiconductor from entering the oxide semiconductor layer 106. Since the second oxide layer 110 is provided between the gate electrode layer 114 and the oxide semiconductor layer 106 serving as a channel, the thickness of the second oxide layer 110 is preferably as small as possible for an increase in the on-state current of the transistor. Specifically, the thickness of the second oxide layer 110 is, for example, greater than or equal to 0.3 nm and less than 10 nm, preferably greater than or equal to 0.3 nm and less than or equal to 5 nm.

Preferably, each of the first oxide layer 104 and the second oxide layer 110 is formed of an oxide semiconductor which contains one or more kinds of the metal elements that are contained in the oxide semiconductor layer 106 and has an energy at the conduction band minimum that is closer to the vacuum level than that of the oxide semiconductor layer 106 by 0.05 eV or more, 0.07 eV or more, 0.1 eV or more, or 0.15 eV or more and 2 eV or less, 1 eV or less, 0.5 eV or less, or 0.4 eV or less.

When an electric field is applied to the gate electrode layer 114 in such a structure, a channel is formed in the oxide semiconductor layer 106 that is the layer having the lowest conduction band minimum in the stacked structure including the oxide semiconductor layer. Accordingly, the second oxide layer 110 formed between the oxide semiconductor layer 106 and the gate insulating layer 112 enables prevention of the contact between the channel of the transistor and the gate insulating layer 112.

In addition, the oxide layers in which oxygen vacancies are less likely to be generated than in the oxide semiconductor layer 106 are provided in contact with an upper surface and a lower surface of the oxide semiconductor layer 106 where the channel is formed, whereby generation of oxygen vacancies in the channel of the transistor can be suppressed.

Note that in order to make the oxide semiconductor layer 106 intrinsic or substantially intrinsic, the concentration of silicon in the oxide semiconductor layer 106, which is measured by SIMS, is set to be lower than $1\times10^{19}$ atoms/cm$^3$, preferably lower than $5\times10^{18}$ atoms/cm$^3$, further preferably lower than $3\times10^{18}$ atoms/cm$^3$, still further preferably lower than $1\times10^{18}$ atoms/cm$^3$. The concentration of hydrogen is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. Further, the concentration of nitrogen is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In the case where the oxide semiconductor layer 106 includes crystals, high concentration of silicon or carbon might reduce the crystallinity of the oxide semiconductor layer 106. In order not to lower the crystallinity of the oxide semiconductor layer 106, the concentration of silicon in the oxide semiconductor layer 106 is set to be lower than $1\times10^{19}$ atoms/cm$^3$, preferably lower than $5\times10^{18}$ atoms/cm$^3$, further preferably lower than $1\times10^{18}$ atoms/cm$^3$. Moreover, the concentration of carbon is set to be lower than $1\times10^{19}$ atoms/cm$^3$, preferably lower than $5\times10^{18}$ atoms/cm$^3$, further preferably lower than $1\times10^{18}$ atoms/cm$^3$.

A transistor in which the highly purified oxide semiconductor layer 106 is used for a channel formation region as described above has an extremely low off-state current. For example, the drain current when the transistor including a highly purified oxide semiconductor layer is in an off state can be $1\times10^{-18}$ A or lower, preferably $1\times10^{-21}$ A or lower, further preferably $1\times10^{-24}$ A or lower at room temperature (approximately 25° C.), or the drain current can be $1\times10^{-15}$ A or lower, preferably $1\times10^{-18}$ A or lower, further preferably $1\times10^{-21}$ A or lower at 85° C. Note that an off state of an n-channel transistor refers to a state where the gate voltage is sufficiently lower than the threshold voltage. Specifically, the transistor is in an off state when the gate voltage is lower than the threshold voltage by 1V or more, 2V or more, or 3V or more.

<<Source Electrode Layer and Drain Electrode Layer>>

For the source electrode layer 108a and the drain electrode layer 108b, a conductive material which is easily bonded to oxygen can be preferably used. For example, Al, Cr, Cu, Ta, Ti, Mo, or W can be used. In particular, W with a high melting point is preferred because a relatively high process temperature can be employed in a later step. Note that the conductive material which is easily bonded to oxygen includes, in its category, a material to which oxygen is easily diffused.

When such a conductive material which is easily bonded to oxygen is in contact with the oxide semiconductor layer 106, oxygen in the oxide semiconductor layer 106 is taken into the conductive material. Some heating steps are performed in a manufacturing process of the transistor, and thus oxygen vacancies are generated in regions of the oxide semiconductor layer 106 which are in the vicinity of an interface between the oxide semiconductor layer 106 and each of the source electrode layer 108a and the drain electrode layer 108b, so that n-type regions are formed. The n-type regions can function as a source and a drain of the transistor 200. Note that the n-type regions can also be formed in the first oxide layer 104 in regions in contact with the source electrode layer 108a and the drain electrode layer 108b.

Note that a constituent element of the source electrode layer 108a and the drain electrode layer 108b may enter the n-type regions. Further, a region having high oxygen concentration may be formed in part of the source electrode layer 108a and part of the drain electrode layer 108b, which are in contact with the n-type regions. A constituent element of the oxide semiconductor layer 106 and/or the first oxide layer 104 may enter the source electrode layer 108a and the drain electrode layer 108b in contact with the n-type regions in some cases. That is, in the vicinity of the interface between the oxide semiconductor layer 106 and the source and drain electrode layers 108a and 108b and/or the interface between the first oxide layer 104 and the source and drain electrode layers 108a and 108b, a portion which can be called a mixed region or a mixed layer of the two contacting layers is formed in some cases.

Note that the n-type regions formed owing to the generation of oxygen vacancies may in some cases extend in the channel length direction of the transistor. When the channel length of the transistor is extremely short, the n-type regions extending in the channel length direction may deteriorate electrical characteristics such as the shift of the threshold voltage or the occurrence of a state in which on/off cannot be controlled with a gate voltage (conducting state). Accordingly, in the case of forming a transistor with an extremely short channel length, it is preferable that the conductive material which is not easily bonded to oxygen be used for the source electrode and the drain electrode. As the conductive material, tantalum nitride, titanium nitride, or the like is preferably used, for example. Note that the conductive material which is not easily bonded to oxygen includes, in its category, a material to which oxygen is not easily diffused.

<<Gate Insulating Layer>>

The gate insulating layer 112 can be formed using a silicon oxide film, a gallium oxide film, an aluminum oxide film, a silicon nitride film, a silicon oxynitride film, an aluminum oxynitride film, a silicon nitride oxide film, or the like. The gate insulating layer 112 is preferably a film containing oxygen because it can supply oxygen to the second oxide layer 110 or the oxide semiconductor layer 106. Further, as a material of the gate insulating layer 112, hafnium oxide, yttrium oxide, hafnium silicate ($HfSi_xO_y$ (x>0, y>0)), hafnium silicate to which nitrogen is added, hafnium aluminate ($HfAl_xO_y$, (x>0, y>0)), or lanthanum oxide may be used. The gate insulating layer 112 may have either a single-layer structure or a stacked structure.

<<Gate Electrode Layer>>

The gate electrode layer 114 can be formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like. Alternatively, a semiconductor film typified by a polycrystalline silicon film doped with an impurity element such as phosphorus, or a silicide film such as a nickel silicide film may be used as the gate electrode layer 114. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used. Moreover, the gate electrode layer 114 can have a stacked structure of the above conductive material and the above metal material.

The gate electrode layer 114 can be formed to have a single-layer structure or a stacked structure. As one layer of the gate electrode layer 114 which is in contact with the gate insulating layer 112, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (InN, SnN, or the like) film can be used. Such a film has a work function of higher than or equal to 5 eV, preferably higher than or equal to 5.5 eV, and the use of this film as the gate electrode layer enables the threshold voltage of the transistor to be shifted in the positive direction. Accordingly, a normally-off switching element can be obtained.

<<Protective Insulating Layer>>

As the protective insulating layer 116 provided over the gate electrode layer 114 and covering the side surfaces of the second oxide layer 110 and the gate insulating layer 112 in the transistor 200, an insulating layer having a lower permeability to oxygen (higher barrier property with respect to oxygen) than the second oxide layer 110 and the gate insulating layer 112 is provided. The protective insulating layer 116 having a barrier property with respect to oxygen that is in contact with the side surfaces of the second oxide layer 110 and the gate insulating layer 112 can prevent release of oxygen from the second oxide layer 110 and the gate insulating layer 112, which prevents oxygen vacancies in the second oxide layer 110 and the gate insulating layer 112. This leads to prevention of oxygen extraction from the oxide semiconductor layer 106 caused due to oxygen vacancies in the films; consequently, oxygen vacancies in the channel formation region can be prevented. Further, since the protective insulating layer 116 is in contact with the base insulating layer 102 in a surrounding area of the island-shaped oxide semiconductor layer 106, it is preferable to use the insulating layer having a lower permeability to oxygen than the base insulating layer 102 in order to prevent release of oxygen from the base insulating layer 102. As the protective insulating layer, an aluminum oxide film, a silicon nitride film, or a silicon nitride oxide film can be provided.

Further, in an oxide semiconductor, hydrogen behaves as a supply source of carriers in addition to oxygen vacancies. When the oxide semiconductor contains hydrogen, a donor is generated at a level close to the conduction band (a shallow level), and thus the oxide semiconductor has lower resistance (n-type conductivity). Therefore, an insulating layer having a low permeability to hydrogen is preferably used as the protective insulating layer 116. Accordingly, the concentration of hydrogen in the protective insulating layer 116 is preferably reduced. Specifically, the concentration of hydrogen in the protective insulating layer 116 is preferably lower than $5 \times 10^{19}$ atoms·cm$^{-3}$, further preferably lower than $5 \times 10^{18}$ atoms·cm$^{-3}$.

<Band Structure of Stacked Layers in Transistor>

Band structures of the base insulating layer 102, the first oxide layer 104, the oxide semiconductor layer 106, the second oxide layer 110, and the gate insulating layer 112 in the transistor 200 will be described with reference to FIGS. 2A and 2B.

Figure 2A:
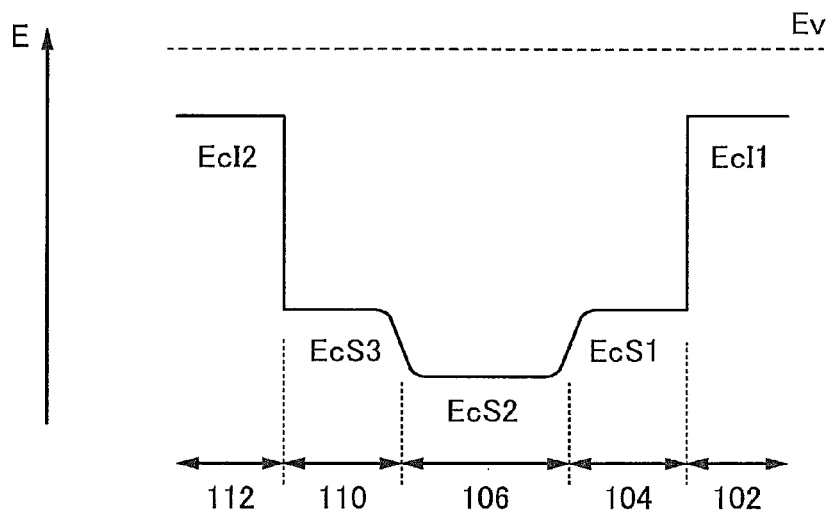
FIGS. 2A and 2B each show a band structure of stacked layers in a semiconductor device.
Figure 2B:
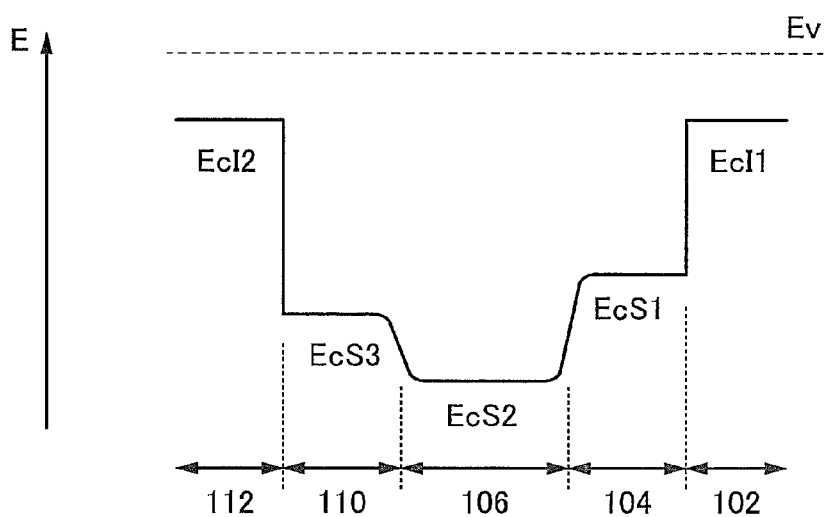

In FIGS. 2A and 2B, EcI1, EcS1, EcS2, EcS3, EcI2 schematically represent energies at the conduction band minimum of the base insulating layer 102, the first oxide layer 104, the oxide semiconductor layer 106, the second oxide layer 110, and the gate insulating layer 112, respectively. Note that the thicknesses of the layers in FIGS. 1A to 1C are not considered here for convenience.

Here, an energy difference between the vacuum level (Ev) and the conduction band minimum (Ec) (this difference is also referred to as electron affinity) corresponds to a value obtained by subtracting an energy gap from an energy difference between the vacuum level and the valence band maximum (this difference is also referred to as an ionization potential). Note that the energy gap can be measured using a spectroscopic ellipsometer (e.g., UT-300 manufactured by HORIBA JOBIN YVON SAS). Note that the energy difference between the vacuum level and the valence band maximum can be measured using an ultraviolet photoelectron spectroscopy (UPS) device (e.g., VersaProbe manufactured by ULVAC-PHI, Inc.).

As shown in FIG. 2A, energy at the conduction band minimum continuously changes from the first oxide layer 104 through the oxide semiconductor layer 106 to the second oxide layer 110, without an energy barrier therebetween. This is presumably because the compositions of the first oxide layer 104, the oxide semiconductor layer 106, and the second oxide layer 110 are close to one another and therefore oxygen easily diffuses among the layers to form a mixed layer.

Although the case where the first oxide layer 104 and the second oxide layer 110 are oxide layers having the same energy gap is shown in FIG. 2A, the first oxide layer 104 and the second oxide layer 110 may be oxide layers having different energy gaps. For example, part of the band structure in the case where EcS1 is higher than EcS3 is shown in FIG. 2B. Further, although not shown, EcS3 may be higher than EcS1.

It can be noticed from FIGS. 2A and 2B that the oxide semiconductor layer 106 serves as a well in the stacked structure including the oxide semiconductor layer, and a channel is thus formed in the oxide semiconductor layer 106 in the transistor including the stacked structure. Note that since the energy at the conduction band minimum is changed continuously in the oxide stack, the energy in the oxide stack can be described as having a U-shaped well. Further, a channel formed by such a structure can also be referred to as a buried channel.

Since each of the first oxide layer 104 and the second oxide layer 110 is an oxide layer containing one or more kinds of the metal elements that are contained in the oxide semiconductor layer 106, the stacked structure including these layers can also be referred to as an oxide stack in which oxide layers containing the same main components are stacked. The oxide stack in which oxide layers containing the same main components are stacked is formed not simply by stacking layers but to have a continuous junction (here, in particular, a U-shaped well structure in which energy of the conduction band minimum is changed continuously between the layers). This is because when impurities which form a defect state such as a trap center or a recombination center are mixed at each interface, the continuity of the energy band is lost, and thus carriers are trapped or disappear by recombination at the interface.

To form a continuous junction, it is necessary to stack the layers in succession without exposure to the air using a multi-chamber deposition apparatus (sputtering apparatus) provided with load lock chambers. Each chamber of the sputtering apparatus is preferably evacuated to a high vacuum (to about $5 \times 10^{-7}$ Pa to $1 \times 10^{-4}$ Pa) by an adsorption vacuum pump such as a cryopump so that water and the like acting as impurities for the oxide semiconductor are removed as much as possible. Alternatively, a combination of a turbo molecular pump and a cold trap is preferably used to prevent back-flow of a gas from an exhaust system into a chamber.

Not only high vacuum evaporation in a chamber but also high purity of a sputtering gas is necessary to obtain a highly purified intrinsic oxide semiconductor. An oxygen gas or an argon gas used as the sputtering gas is preferably highly purified to have a dew point of $-40°$ C. or lower, preferably $-80°$ C. or lower, further preferably $-100°$ C. or lower, whereby entry of moisture or the like into the oxide semiconductor can be prevented as much as possible.

The first oxide layer 104 and the second oxide layer 110 which are provided over and under the oxide semiconductor layer 106 each serve as a barrier layer and can prevent trap states formed at an interface between the oxide stack and each of the insulating layers that are in contact with the oxide stack (the base insulating layer 102 and the gate insulating layer 112) from adversely affecting the oxide semiconductor layer 106 that serves as a main carrier path for the transistor.

For example, oxygen vacancies contained in the oxide semiconductor layer appear as localized states in deep energy area in the energy gap of the oxide semiconductor. A carrier is trapped in such localized states, so that reliability of the transistor is lowered. For this reason, oxygen vacancies contained in the oxide semiconductor layer need to be reduced. In the transistor 200 of this embodiment, the oxide layers in which oxygen vacancies are less likely to be generated than in the oxide semiconductor layer 106 are provided in contact with the upper surface and the lower surface of the oxide semiconductor layer 106, whereby oxygen vacancies in the oxide semiconductor layer 106 can be reduced. For example, the absorption coefficient due to the localized states of the oxide semiconductor layer 106, which is obtained by measurement by a constant photocurrent method (CPM), can be lower than $1 \times 10^{-3}$/cm, preferably lower than $1 \times 10^{-4}$/cm.

In addition, when the oxide semiconductor layer 106 is in contact with an insulating layer including a different constituent element (e.g., a base insulating layer including a silicon oxide film), an interface state is sometimes formed at the interface of the two layers and the interface state forms a channel. At this time, in some cases, a second transistor having a different threshold voltage may be formed and accordingly an apparent threshold voltage of the transistor may fluctuate. However, since the first oxide layer 104 contains one or more kinds of the metal elements that are contained in the oxide semiconductor layer 106 in the transistor 200 of this embodiment, an interface state is less likely to be formed at the interface between the first oxide layer 104 and the oxide semiconductor layer 106. Thus, with the first oxide layer 104, variations in electrical characteristics of the transistors, such as a threshold voltage, can be reduced.

When a channel is formed at an interface between the gate insulating layer 112 and the oxide semiconductor layer 106, interface scattering occurs at the interface and the field-effect mobility of the transistor is decreased. However, since the second oxide layer 110 contains one or more kinds of the metal elements that are contained in the oxide semiconductor layer 106 in the transistor 200 of this embodiment, scattering of carriers is less likely to occur at an interface between the oxide semiconductor layer 106 and the second oxide layer 110, and thus the field-effect mobility of the transistor can be increased.

Further, the first oxide layer 104 and the second oxide layer 110 each also serve as a barrier layer which suppresses formation of an impurity state due to the entry of the constituent elements of the base insulating layer 102 and the gate insulating layer 112 into the oxide semiconductor layer 106.

For example, in the case of using a silicon-containing insulating layer as each of the base insulating layer 102 and the gate insulating layer 112 which are in contact with the first oxide layer 104 and the second oxide layer 110 respectively, silicon in the insulating layers or carbon which might be contained in the insulating layers enters the first oxide layer 104 or the second oxide layer 110 to a depth of several nanometers from the interface in some cases. If an impurity such as silicon or carbon enters the oxide semiconductor layer, impurity states may be formed, and these impurity states cause generation of electrons, so that the oxide semiconductor layer may become n-type.

However, when the thickness of the first oxide layer 104 and the second oxide layer 110 is larger than several nanometers, the impurity such as silicon or carbon does not reach the oxide semiconductor layer 106, so that the influence of impurity states is suppressed.

Note that the impurity concentrations of the oxide semiconductor layer can be measured by secondary ion mass spectrometry (SIMS).

If hydrogen or moisture is contained in the oxide semiconductor layer as an impurity, it forms an n-type region; therefore, in order to achieve a well-shaped structure, it is useful to cover a side surface of the second oxide layer 110 with a protective insulating layer 116 (e.g., a silicon nitride layer) in order to prevent entry of hydrogen or moisture from the outside.

<Method for Manufacturing Semiconductor Device>

A method for manufacturing the transistor 200 illustrated in FIGS. 1A to 1C will be described with reference to FIGS. 3A to 3E and FIGS. 4A to 4C.

Figure 3A:
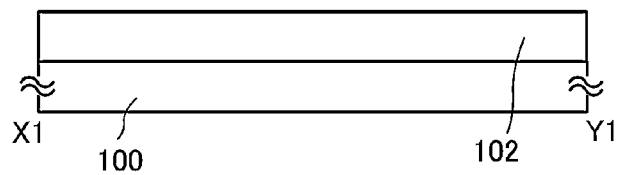
FIGS. 3A to 3E are cross-sectional views illustrating an example of a method for manufacturing a semiconductor device.

First, the base insulating layer 102 is formed over the substrate 100 having an insulating surface (see FIG. 3A).

The base insulating layer 102 may have a single-layer structure or a stacked structure. Note that at least a region in the base insulating layer 102 that is in contact with the first oxide layer 104 is formed of a material that contains oxygen in order to supply oxygen to the first oxide layer 104 and/or the oxide semiconductor layer 106. Further, the base insulating layer 102 is preferably a layer containing an excessive amount of oxygen.

In order to make the base insulating layer 102 contain an excessive amount of oxygen, the base insulating layer 102 may be formed in an oxygen atmosphere, for example. Alternatively, the base insulating layer 102 may be formed in such a manner that oxygen is introduced into the deposited base insulating layer 102. Further alternatively, both of these methods may be combined.

The base insulating layer 102 is an insulating layer in contact with the first oxide layer 104 and thus it is preferable that the hydrogen concentration in the base insulating layer 102 be reduced. After formation of the base insulating layer 102, it is preferable to perform heat treatment (dehydration treatment or dehydrogenation treatment) for the purpose of hydrogen removal.

The heat treatment is performed at a temperature of 250° C. to 650° C. inclusive, preferably 350° C. to 600° C. inclusive, or lower than the strain point of the substrate. For example, the substrate is put in an electric furnace which is one of heat treatment apparatuses, and the heat treatment is performed on the base insulating layer 102 at 450° C. in a vacuum (reduced-pressure) atmosphere for an hour.

Note that the heat treatment apparatus is not limited to an electric furnace, and an apparatus for heating an object by thermal conduction or thermal radiation from a heating element such as a resistance heating element may be used. For example, an RTA (rapid thermal annealing) apparatus such as a GRTA (gas rapid thermal annealing) apparatus or an LRTA (lamp rapid thermal annealing) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for performing heat treatment using a high-temperature gas. As the high-temperature gas, an inert gas that does not react with an object by heat treatment, such as nitrogen or a rare gas such as argon is used. Note that in the case where the GRTA apparatus is used as the heat treatment apparatus, the substrate may be heated in an inert gas heated to high temperature of 650° C. to 700° C. because the heat treatment time is short.

The heat treatment may be performed in an atmosphere of nitrogen, oxygen, ultra-dry air (air in which the water content is 20 ppm or less, preferably 1 ppm or less, further preferably 10 ppb or less), or a rare gas (argon, helium, or the like). Note that it is preferable that water, hydrogen, or the like be not contained in the atmosphere of nitrogen, oxygen, ultra-dry air, or a rare gas. The purity of nitrogen, oxygen, or a rare gas which is introduced into a heat treatment apparatus is preferably 6N (99.9999%) or higher, further preferably 7N (99.99999%) or higher (that is, the impurity concentration is preferably 1 ppm or lower, further preferably 0.1 ppm or lower).

Note that oxygen can be released from the base insulating layer 102 by heat treatment. Accordingly, treatment for introducing oxygen (at least including any of oxygen radicals, ozone, oxygen atoms, and oxygen ions (including oxygen molecular ions and oxygen cluster ions)) to the dehydrated or dehydrogenated base insulating layer 102 is preferably performed.

The introduction of oxygen to the base insulating layer 102 can be performed by an ion implantation method, an ion doping method, a plasma immersion ion implantation method, plasma treatment, or the like, for example. Note that for the oxygen introduction treatment, a gas containing oxygen can be used. As the gas containing oxygen, oxygen, dinitrogen monoxide, nitrogen dioxide, carbon dioxide, carbon monoxide, and the like can be used. Further, a rare gas may be included in the gas containing oxygen for the oxygen introduction treatment. By the oxygen introduction treatment on the base insulating layer 102, oxygen that is released by heat treatment can be compensated.

Figure 3B:
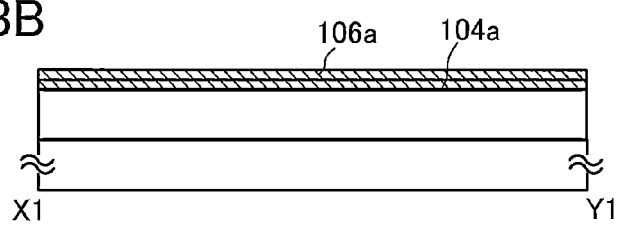

Next, a first oxide film 104a for forming the first oxide layer 104 and an oxide semiconductor film 106a for forming the oxide semiconductor layer 106 are formed over the base insulating layer 102 by a sputtering method, a CVD method, a molecular beam epitaxy (MBE) method, an atomic layer deposition (ALD) method, or a pulsed laser deposition (PLD) method (see FIG. 3B).

The first oxide film 104a and the oxide semiconductor film 106a can be formed using the above-described materials of the first oxide layer 104 and the oxide semiconductor layer 106.

For example, when the first oxide film 104a for forming the first oxide layer 104 is formed by a sputtering method, a sputtering target with a composition of In:Ga:Zn=1:3:2 in atomic ratio, a sputtering target with a composition of In:Ga:Zn=1:6:4 in atomic ratio, a sputtering target with a composition of In:Ga:Zn=1:9:6 in atomic ratio, or a sputtering target having a composition that is in the neighborhood of the compositions of the above targets is preferably used.

For example, when the oxide semiconductor film 106a for forming the oxide semiconductor layer 106 is formed by a sputtering method, a sputtering target with a composition of In:Ga:Zn=1:1:1 in atomic ratio, a sputtering target with a composition of In:Ga:Zn=3:1:2 in atomic ratio, or a sputtering target having a composition that is in the neighborhood of the compositions of the above targets is preferably used.

Note that the composition of the film formed by a sputtering method may be different from the composition of the target for forming the film. For example, when an oxide semiconductor film is formed using a sputtering target including ZnO, sublimation of ZnO or the like may occur during deposition, so that the atomic ratio of Zn to In and/or Ga in the deposited oxide semiconductor film becomes lower than that of the sputtering target.

As described above, a material of the first oxide film 104a is selected such that the first oxide film 104a has a lower electron affinity than the oxide semiconductor film 106a.

The first oxide semiconductor film 104a and the oxide semiconductor film 106a are preferably formed by a sputtering method. As the sputtering method, an RF sputtering method, a DC sputtering method, an AC sputtering method, or the like can be used. In particular, a DC sputtering method is preferably used because dust generated in the deposition can be reduced and the film thickness can be uniform.

In the formation of the first oxide film 104a and the oxide semiconductor film 106a, the hydrogen concentration in the films is preferably reduced as much as possible. To reduce the hydrogen concentration, for example, in the case where the films are formed by a sputtering method, oxygen, a high-purity rare gas (typically, argon) from which impurities such as hydrogen, water, a hydroxyl group, and hydride have been removed, or a mixed gas of oxygen and the rare gas is used as appropriate as an atmosphere gas supplied to a deposition chamber of a sputtering apparatus.

The first oxide film and the oxide semiconductor film are formed in such a manner that a sputtering gas from which hydrogen and moisture are removed is introduced into a deposition chamber while moisture remaining in the deposition chamber is removed, whereby the concentration of hydrogen in the films can be reduced. In order to remove the residual moisture in the deposition chamber, an entrapment vacuum pump, for example, a cryopump, an ion pump, or a titanium sublimation pump is preferably used. The evacuation unit may be a turbo molecular pump provided with a cold trap. When the deposition chamber is evacuated with the cryopump, which has a high capability in removing a hydrogen molecule, a compound containing a hydrogen atom such as water ($H_2O$) (preferably, also a compound containing a carbon atom), and the like, the impurity concentration in the oxide film and the oxide semiconductor film formed in the deposition chamber can be reduced.

Note that oxygen may be introduced into the first oxide film 104a at the timing that is after formation of the first oxide film 104a and before formation of the oxide semiconductor film 106a. By the oxygen introduction treatment, the first oxide film 104a excessively contains oxygen, so that the excess oxygen can be supplied to the oxide semiconductor film 106a by heat treatment in a later film formation step.

It is preferable to perform heat treatment after the formation of the first oxide film 104a and the oxide semiconductor film 106a. The heat treatment is preferably performed at a temperature of higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure atmosphere. Alternatively, the heat treatment may be performed in such a manner that heat treatment is performed in an inert gas atmosphere, and then another heat treatment is performed in an atmosphere containing an oxidizing gas at 10 ppm or more in order to compensate released oxygen. By this heat treatment, impurities such as hydrogen or water can be removed from at least one of the base insulating layer 102, the first oxide film 104a, and the oxide semiconductor film 106a.

Note that the above-described heat treatment may be performed after the first oxide film 104a and the oxide semiconductor film 106a are processed into an island shape. However, the heat treatment for dehydration or dehydrogenation before processing of the films into an island shape is preferable to prevent release of oxygen contained in the base insulating layer 102 from a region that is not covered with the island-shaped first oxide layer 104 and the island-shaped oxide semiconductor layer 106.

Figure 3C:
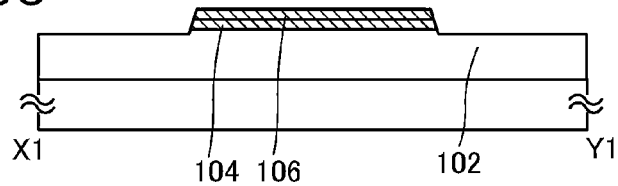

Next, the first oxide film 104a and the oxide semiconductor film 106a are processed into the island-shaped first oxide layer 104 and the island-shaped oxide semiconductor layer 106 (see FIG. 3C). Here, the first oxide layer 104 and the oxide semiconductor layer 106 can be obtained by etching using the same mask. Accordingly, the first oxide layer 104 and the oxide semiconductor layer 106 have the same plan shape and the upper edge of the first oxide layer 104 coincides with the lower edge of the oxide semiconductor layer 106.

In processing into the first oxide layer 104 and the oxide semiconductor layer 106, the first oxide film 104a may be over-etched, in which case part of the base insulating layer 102 (the region that is not covered with the island-shaped first oxide layer 104 and the island-shaped oxide semiconductor layer 106) is etched to cause a reduction in film thickness of the base insulating layer 102.

Figure 3D:
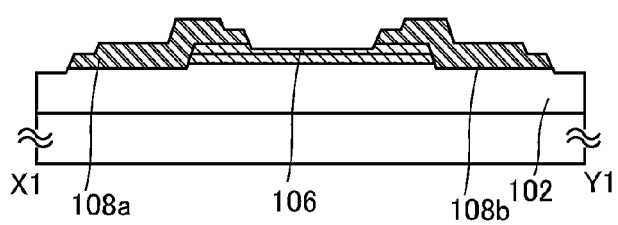

Next, a conductive film is formed over the oxide semiconductor layer 106 and then processed so that the source electrode layer 108a and the drain electrode layer 108b are formed (see FIG. 3D).

In this embodiment, the source electrode layer 108a and the drain electrode layer 108b have a step-like end portion with a plurality of steps. The end portion can be processed by alternately performing a step of making a resist mask recede by ashing and an etching step a plurality of times.

In this embodiment, each end portion of the source electrode layer 108a and the drain electrode layer 108b is provided with two steps; however, it may be provided with three or more steps, or alternatively may be provided with one step without performing resist ashing during the processing. It is preferable that the number of steps be increased as the thickness of the source electrode layer 108a and the drain electrode layer 108b is larger. Note that the end portions of the source electrode layer 108a and the drain electrode layer 108b are not necessarily symmetric to each other. Note that a curved surface having an arbitrary curvature radius may be provided between a top surface and a side surface of each step.

When the source electrode layer 108a and the drain electrode layer 108b have a shape including a plurality of steps as described above, coverage with the films formed over the source electrode layer 108a and the drain electrode layer 108b, specifically, coverage with the second oxide layer 110, the gate insulating layer 112, and the like is improved, so that the transistors can have more favorable electrical characteristics and higher long-term reliability.

In the processing into the source electrode layer 108a and the drain electrode layer 108b, the conductive film may be over-etched, in which case part of the base insulating layer 102 and part of the oxide semiconductor layer 106 (the region that is not covered with the source electrode layer 108a and the drain electrode layer 108b) is etched to cause a reduction in film thickness of the base insulating layer 102 and the oxide semiconductor layer 106.

Note that if the conductive film for forming the source electrode layer 108a and the drain electrode layer 108b remains over the oxide semiconductor layer 106 as a residue, the residue may form an impurity state in the oxide semiconductor layer 106 or at the interface thereof. Further, oxygen extraction from the oxide semiconductor layer 106 may be caused by the residue to form an oxygen vacancy.

Therefore, in order to prevent formation of an impurity state and formation of an oxygen vacancy which are caused by the residue, treatment for removing the residue may be performed on the surface of the oxide semiconductor layer 106 after the source electrode layer 108a and the drain electrode layer 108b are formed. As the treatment for removing the residue, etching treatment (e.g., wet etching) or plasma treatment using oxygen or dinitrogen monoxide may be employed. The treatment for removing the residue may reduce the thickness of the oxide semiconductor layer 106 between the source electrode layer 108a and the drain electrode layer 108b by 1 nm or more and 3 nm or less.

Figure 3E:
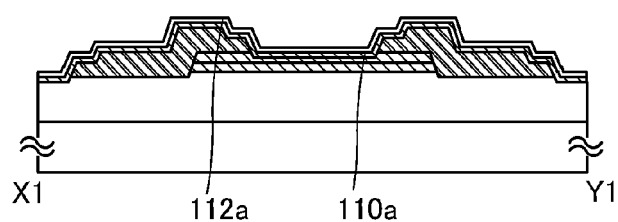
Figure 4A:
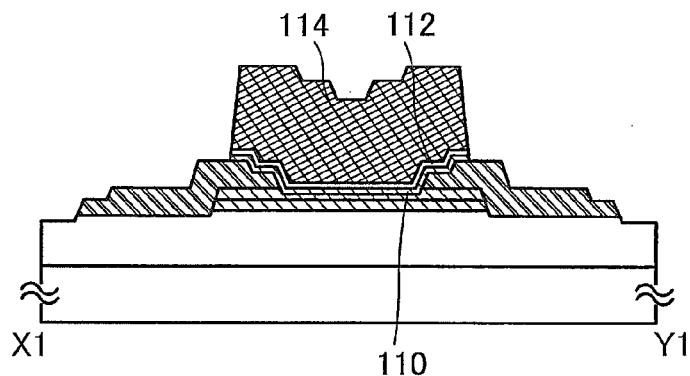
FIGS. 4A to 4C are cross-sectional views illustrating an example of a method for manufacturing a semiconductor device.
Figure 4B:
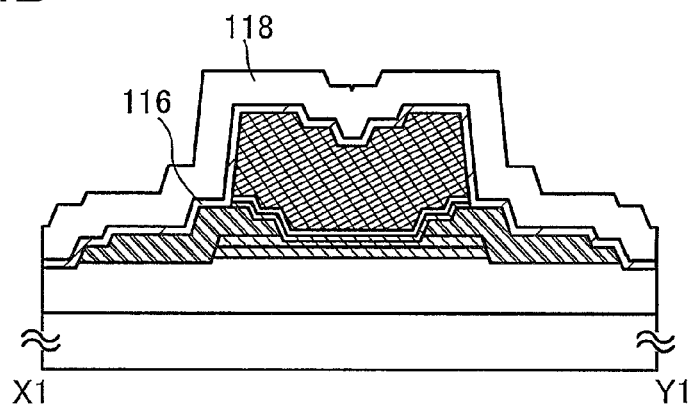
Figure 4C:
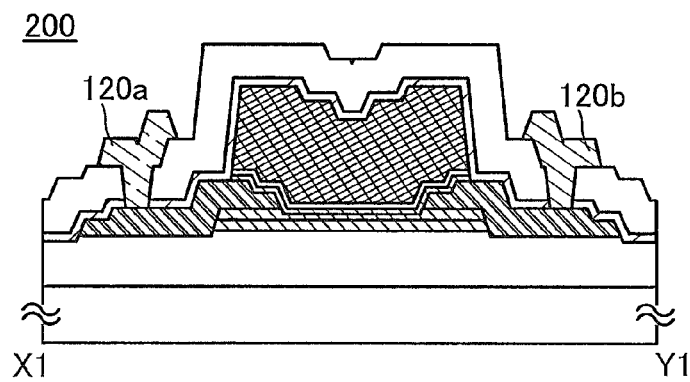

Next, a second oxide film 110a for forming the second oxide layer 110 and a gate insulating film 112a for forming the gate insulating layer 112 are stacked over the source electrode layer 108a and the drain electrode layer 108b (see FIG. 3E).

It is preferable to form the second oxide film 110a and the gate insulating film 112a in succession without exposure to the air, in order to prevent adsorption of an impurity such as hydrogen or moisture on the surface of the second oxide film 110a.

For the second oxide film 110a for forming the second oxide layer 110, the above-described material can be used. For example, in the case of forming the first oxide film 104a by a sputtering method, a sputtering target with a composition of In:Ga:Zn=1:3:2 in atomic ratio, a sputtering target with a composition of In:Ga:Zn=1:6:4 in atomic ratio, a sputtering target with a composition of In:Ga:Zn=1:9:6 in atomic ratio, or a sputtering target having a composition that is in the neighborhood of the compositions of the above targets is preferably used.

Note that a mixed layer (or a mixed region) of the oxide semiconductor layer 106 and the second oxide film 110a may be formed at the interface therebetween. In this case, in the transistor 200, the interface between the oxide semiconductor layer 106 and the second oxide layer 110 is unclear in some cases. The mixed layer (or the mixed region) at the interface can reduce interface scattering between the oxide semiconductor layer 106 and the second oxide film 110a.

The gate insulating film 112a can be formed by a sputtering method, an MBE method, a CVD method, a pulsed laser deposition method, an ALD method, or the like using the above-described material.

For example, the gate insulating film 112a is preferably formed by a high-density plasma CVD method using microwave (e.g., a frequency of 2.45 GHz), whereby the gate insulating film 112a can be formed dense with high withstand voltage.

Next, the gate electrode layer 114 is formed over the gate insulating film 112a. Then, using the gate electrode layer 114 as a mask, the second oxide film 110a and the gate insulating film 112a are processed to form the second oxide layer 110 and the gate insulating layer 112 (see FIG. 4A). To avoid an increase in the number of masks, it is favorable to form the second oxide layer 110 and the gate insulating layer 112 using the gate electrode layer 114 as a mask in a self-aligned manner.

The gate electrode layer 114 can be formed by a plasma CVD method, a sputtering method, or the like using the above-described material. Instead of the plasma CVD method or the sputtering method, a thermal CVD method may be used, for example. A metal organic chemical vapor deposition (MOCVD) method or an atomic layer deposition (ALD) method can be employed as an example of a thermal CVD method.

By processing the second oxide film 110a into the second oxide layer 110, outward diffusion of indium contained in the second oxide layer 110 can be prevented. The outward diffusion of indium is a factor causing variations in electrical characteristics of transistors or a factor of contamination in a deposition chamber in the process. Thus, the processing for forming the second oxide layer 110 using the gate electrode layer 114 as a mask is effective. Furthermore, the processing for forming the second oxide layer 110 can prevent generation of a residue for the following reason. If the second oxide film 110a remains in contact hole formation regions at the time of forming contact holes that electrically connect the source and drain electrode layers 108a and 108b to the wiring layers 120a and 120b, a residue tends to be generated owing to the difference in etching rate between the remaining second oxide film 110a and the protective insulating layer 116 and the insulating layer 118 that are formed later.

Note that the processing for forming the second oxide layer 110 and the gate insulating layer 112 can be performed before the gate electrode layer 114 is formed. In such a case, the mask used for the processing for forming the first oxide layer 104 and the oxide semiconductor layer 106 is preferably used for the processing for forming the second oxide layer 110 and the gate insulating layer 112 in order to reduce the number of masks. Note that if a resist mask is formed in contact with the second oxide layer 110, a surface of the second oxide layer 110 might be damaged (e.g., contamination with impurities, a reduction in thickness, or generation of oxygen vacancies) by chemical solution treatment for removing the resist mask or the like. Accordingly, the processing for forming the second oxide layer 110 is preferably performed in the same etching step for processing the gate insulating film 112a.

Further, if part of the base insulating layer 102 is exposed as a result of processing of the second oxide film 110a at the time of forming the gate insulating film 112a, oxygen released from the base insulating layer 102 by heating at the time of forming the gate insulating film 112a might be released to the outside (e.g., deposition atmosphere). The base insulating layer 102 is a layer serving as a supply source of oxygen to the oxide semiconductor layer 106, and the release of oxygen from the base insulating layer 102 to the outside means a reduction in oxygen supplied to the oxide semiconductor layer 106 and may consequently cause generation of oxygen vacancies in the oxide semiconductor layer 106. For this reason, it is preferable that the base insulating layer 102 be covered with the second oxide film 110a when the gate insulating film 112a is formed. In this manner, the second oxide film 110a can prevent oxygen released from the base insulating layer 102 by heat treatment at the time of forming the gate insulating film 112a from being released to the outside. Note that in the case of forming the gate insulating film 112a after processing the second oxide film 110a, the deposition temperature of the gate insulating film 112a is preferably lower than the deposition temperature of the second oxide film 110a for the prevention of the oxygen release from the base insulating layer 102.

Next, the protective insulating layer 116 is formed over the gate electrode layer 114 so as to cover side surfaces of the second oxide layer 110 and the gate insulating layer 112. Then, the insulating layer 118 is formed over the protective insulating layer 116 (see FIG. 4B).

As the protective insulating layer 116, an insulating layer having a lower permeability to oxygen (higher barrier property with respect to oxygen) than the second oxide layer 110 and the gate insulating layer 112 is provided. It is preferable to use, as the protective insulating layer 116, the insulating layer having a lower permeability to oxygen than the base insulating layer 102, in order to prevent release of oxygen from the base insulating layer 102 during and after formation of the protective insulating layer 116. As the protective insulating layer 116, an aluminum oxide film, a silicon nitride film, or a silicon nitride oxide film can be provided, for example.

Note that the protective insulating layer 116 is preferably formed by a sputtering method because it is preferable to reduce the concentration of hydrogen in the protective insulating layer 116. The concentration of hydrogen in the protective insulating layer 116 is preferably lower than $5 \times 10^{19}$ cm$^{-3}$, further preferably lower than $5 \times 10^{18}$ cm$^{-3}$.

For example, in the case of forming an aluminum oxide film as the protective insulating layer 116, the aluminum oxide film may be formed using a sputtering target including aluminum oxide or may be formed using an aluminum target in an oxygen atmosphere or an atmosphere of oxygen and a rare gas.

The insulating layer 118 is stacked over the protective insulating layer 116, whereby the withstand voltage of the transistor 200 can be increased. The insulating layer 118 can be formed using an inorganic insulating material, and the thickness of the insulating layer 118 is preferably larger than at least the thickness of the protective insulating layer 116. For example, as the insulating layer 118, a 300-nm-thick silicon oxynitride film can be formed by a plasma CVD method.

It is preferable to perform heat treatment after the protective insulating layer 116 and the insulating layer 118 are formed. The temperature of the heat treatment is preferably higher than or equal to 300° C. and lower than or equal to 450° C. By the heat treatment, oxygen is easily released from the base insulating layer 102, so that oxygen vacancies in the first oxide layer 104, the oxide semiconductor layer 106 and/or the second oxide layer 110 can be reduced.

In the case where the conductive film for forming the source electrode layer 108a and the drain electrode layer 108b is formed by a sputtering method, a surface of the oxide semiconductor layer 106 might be damaged by plasma at the time of the deposition and an oxygen vacancy might be formed. Further, hydrogen might occupy the formed oxygen vacancy. Thus, after the conductive film for forming the source electrode layer 108a and the drain electrode layer 108b is formed, the whole surface of the oxide semiconductor layer 106 which is in contact with the conductive film might have n-type conductivity.

These problems can be effectively solved by the following process in which the second oxide layer 110 is formed in contact with an n-type region of the oxide semiconductor layer 106; the protective insulating layer 116 that prevents release of oxygen from an end portion of the second oxide layer 110 is formed; and then the heat treatment for supplying oxygen is performed.

By performing the heat treatment after the formation of the protective insulating layer 116, release of oxygen from the base insulating layer 102 in the region that is not in contact with the first oxide layer 104 and from the side surfaces of the second oxide layer 110 and the gate insulating layer 112 can be prevented. In addition, oxygen can be effectively supplied to the stacked structure including the first oxide layer 104, the oxide semiconductor layer 106, and the second oxide layer 110. Therefore, in the case where an n-type region exists on the back channel side in the oxide semiconductor layer 106, oxygen vacancies in the region can be occupied by oxygen. That is, the supply of oxygen to the stacked structure (oxide stack) including the oxide semiconductor layer 106 by the heat treatment enables an n-type channel region to change into an i-type region.

Furthermore, the temperature and time of the heat treatment are adjusted as appropriate; consequently, the regions having n-type conductivity owing to the oxygen vacancies remain in regions in contact with the source electrode layer 108a and the drain electrode layer 108b, and at the same time the i-type channel region can be formed. In this case, the oxide semiconductor layer 106 can include the n-type regions that function as a source region and a drain region and a channel region that is intrinsic or substantially intrinsic.

Next, the contact holes that reach the source electrode layer 108a and the drain electrode layer 108b are formed in the protective insulating layer 116 and the insulating layer 118. Then, a conductive film is formed in the contact holes and over the insulating layer 118 and processed into the wiring layer 120a and the wiring layer 120b that are electrically connected to the source electrode layer 108a and the drain electrode layer 108b, respectively (see FIG. 4C). The conductive film for forming the wiring layers 120a and 120b can be formed using a material and a formation method that are similar to those of the conductive film for forming the source electrode layer 108a and the drain electrode layer 108b.

In this manner, the transistor 200 in this embodiment can be manufactured.

The transistor 200 described in this embodiment has the following structure: the oxide semiconductor layer 106 in which a channel is formed is provided between the first and second oxide layers whose main components are the same as those of the oxide semiconductor layer 106 and in which oxygen vacancies do not easily occur. With this structure of the transistor 200, an increase in oxygen vacancies in the oxide semiconductor layer 106 can be prevented and the impurity concentration can be reduced, whereby the oxide semiconductor layer 106 can be a highly purified intrinsic oxide semiconductor layer.

Accordingly, variations in electrical characteristics, such as variations in threshold voltage, which might occur due to oxygen vacancies in the channel formation region, can be suppressed. Specifically, prevention of the variations in threshold voltage can lead to stable normally-off state, for example. Thus, a semiconductor device which has favorable electrical characteristics and high long-term reliability can be provided.

Further, the side surface of the second oxide layer 110 that is in contact with an upper surface of the oxide semiconductor layer 106, the side surface of the gate insulating layer 112, and the base insulating layer 102 that is a supply source of oxygen to the oxide semiconductor layer 106 are covered with the protective insulating layer 116 that functions as a barrier film having a low permeability to oxygen. This prevents release of oxygen from the second oxide layer 110, the gate insulating layer 112 and/or the base insulating layer 102, whereby oxygen can be effectively supplied to the oxide semiconductor layer 106. By the supply of oxygen to the oxide semiconductor layer 106, oxygen vacancies are filled, so that transistor characteristics are stabilized. This makes it possible to provide a highly reliable semiconductor device.

The structures, the methods, and the like described in this embodiment can be combined as appropriate with any of the structures, the methods, and the like described in the other embodiments.

Embodiment 2

In this embodiment, an example of a semiconductor layer applicable to the transistor of Embodiment 1 will be described in detail with reference to drawings.

<Crystallinity of Oxide Semiconductor Layer>

The oxide semiconductor layer is classified roughly into a single crystal oxide semiconductor layer and a non-single-crystal oxide semiconductor layer. As examples of the non-single-crystal oxide semiconductor layer, an amorphous oxide semiconductor film, a c-axis aligned crystalline oxide semiconductor (CAAC-OS) film, a polycrystalline oxide semiconductor film, a microcrystalline oxide semiconductor film, and the like can be given.

For example, the oxide semiconductor layer in the transistor may include a CAAC-OS film. The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film.

In a transmission electron microscope (TEM) image of the CAAC-OS film, a boundary between crystal parts, that is, a grain boundary is not clearly observed. Thus, in the CAAC-OS film, a reduction in electron mobility due to a grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

In the structural analysis of the CAAC-OS film with an X-ray diffraction (XRD) apparatus, a peak appears at a diffraction angle (2θ) of around 31° in some cases when the CAAC-OS film including an $InGaZnO_4$ crystal is analyzed by an out-of-plane method, for example. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears at 2θ of around 56° in some cases. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal. Note that in this specification, a simple term "perpendicular" includes a range from 80° to 100°, preferably from 85° to 95°. In addition, the term "parallel" includes a range from −10° to 10°, preferably from −5° to 5°.

Figure 5A:
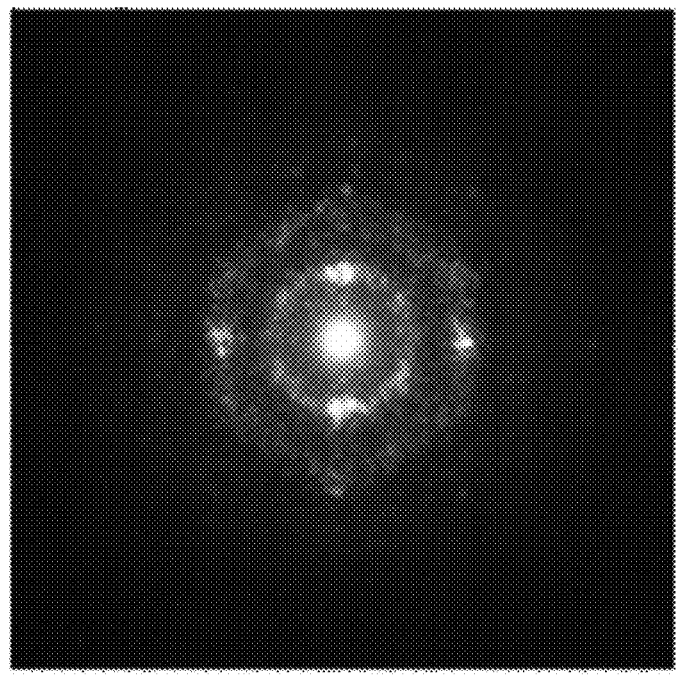
FIGS. 5A and 5B are nanobeam electron diffraction patterns of oxide semiconductors.

Further, for example, spots (luminescent spots) are shown in an electron diffraction pattern of the CAAC-OS film in some cases. An electron diffraction pattern obtained with an electron beam having a diameter of 10 nmφ or smaller, or 5 nmφ or smaller, is called a nanobeam electron diffraction pattern. FIG. 5A is an example of a nanobeam electron diffraction pattern of a sample including the CAAC-OS film. Here, the sample is cut in the direction perpendicular to a formation surface of the CAAC-OS film and the thickness thereof is reduced to about 40 nm. Further, an electron beam with a diameter of 1 nmφ enters from the direction perpendicular to the cut surface of the sample. In FIG. 5A, spots are observed in the nanobeam electron diffraction pattern of the CAAC-OS film.

The CAAC-OS film could be obtained by reducing the impurity concentration, for example. The impurity means here an element other than the main components of the oxide semiconductor, such as hydrogen, carbon, silicon, or a transition metal element. In particular, the strength to bond with oxygen of an element such as silicon is higher than that of a metal element included in the oxide semiconductor. Therefore, when the element takes oxygen away in the oxide semiconductor, the atomic arrangement in the oxide semiconductor is disrupted, whereby the crystallinity of the oxide semiconductor is lowered in some cases. In addition, a heavy metal such as iron or nickel, argon, carbon dioxide, or the like has a large atomic radius (or molecular radius), and thus disrupts the atomic arrangement in the oxide semiconductor, whereby the crystallinity of the oxide semiconductor is lowered in some cases. Hence, the CAAC-OS is an oxide semiconductor with a low impurity concentration. Note that the impurity included in the oxide semiconductor might serve as a carrier generation source.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where the shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to at around 31°. The peak of 2θ at around 36° indicates that a crystal having no c-axis alignment is included in part of the CAAC-OS film. It is preferable that in the CAAC-OS film, a peak of 2θ appears at around 31° and does not appear at around 36°.

Further, the CAAC-OS film can be formed by reducing the density of defect states for example. In an oxide semiconductor, for example, oxygen vacancies are defect states. The oxygen vacancies serve as trap states or serve as carrier generation sources when hydrogen is trapped therein. In order to form the CAAC-OS film, for example, it is important to prevent generation of oxygen vacancies in the oxide semiconductor. Thus, the CAAC-OS film is an oxide semiconductor film having a low density of defect states. In other words, the CAAC-OS film is an oxide semiconductor film having few oxygen vacancies.

Here, the oxide semiconductor layer with low impurity concentration and low density of defect states (small number of oxygen vacancies) is described as a highly purified intrinsic or substantially highly purified intrinsic oxide semiconductor layer. A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). Further, a highly purified intrinsic or substantially highly purified intrinsic oxide semiconductor has a low density of defect states and accordingly has a low density of trap states in some cases. Thus, the transistor including the oxide semiconductor in the channel formation region has a small variation in electrical characteristics and high reliability in some cases. A charge trapped by a trap state in the oxide semiconductor takes a long time to be released and may behave like a fixed charge. Thus, the transistor which includes the oxide semiconductor having a high density of trap states in the channel formation region has unstable electrical characteristics in some cases.

With the use of the CAAC-OS film in a transistor, variation in electrical characteristics of the transistor due to irradiation with visible light or ultraviolet light is small. Thus, the transistor has high reliability.

The CAAC-OS can be formed by a sputtering method using a DC power source, for example.

The oxide semiconductor layer used in the semiconductor device may be a polycrystalline oxide semiconductor film including a plurality of crystal grains. The typical size of a crystal grain in the polycrystalline oxide semiconductor film that is observed by TEM is greater than or equal to 2 nm and less than or equal to 300 nm, greater than or equal to 3 nm and less than or equal to 100 nm, or greater than or equal to 5 nm and less than or equal to 50 nm, for example. Moreover, in the TEM image, a boundary between crystal grains (a grain boundary) can be found in the polycrystalline oxide semiconductor film in some cases.

The polycrystalline oxide semiconductor film may include a plurality of crystal grains, and the alignment of crystals may be different in the plurality of crystal grains. When a polycrystalline oxide semiconductor film is analyzed by an out-of-plane method with use of an XRD apparatus, a single peak or a plurality of peaks appear in some cases. For example, in the case of a polycrystalline In—Ga—Zn—O film, a peak at 2θ of around 31° that shows an alignment or peaks showing a plurality of kinds of alignments appear in some cases. Further, spots are observed in a nanobeam electron diffraction pattern of the polycrystalline oxide semiconductor film in some cases.

The polycrystalline oxide semiconductor film has high crystallinity and thus has high electron mobility in some cases. Accordingly, a transistor using the polycrystalline oxide semiconductor film for a channel formation region has high field-effect mobility. Note that there are cases in which an impurity is segregated at the grain boundary in the polycrystalline oxide semiconductor film. Moreover, the grain boundary of the polycrystalline oxide semiconductor film serves as a defect state. Since the grain boundary of the polycrystalline oxide semiconductor film may serve as a trap state or a carrier generation source, a transistor using the polycrystalline oxide semiconductor film for a channel formation region has larger variations in electrical characteristics and lower reliability than a transistor using a CAAC-OS film for a channel formation region in some cases.

The polycrystalline oxide semiconductor film can be formed by high-temperature heat treatment or laser light treatment.

The oxide semiconductor layer used in the semiconductor device may be a microcrystalline oxide semiconductor film. In the TEM image of the microcrystalline oxide semiconductor film, crystal parts cannot be found clearly in some cases. The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order, that is, a lower density of defect states than the amorphous oxide semiconductor film. Further, in the TEM image of the microcrystalline oxide semiconductor film, a boundary between crystal parts cannot be found clearly in some cases, for example. Accordingly, in the microcrystalline oxide semiconductor film, segregation of impurities is less likely to occur, that is, the density of defect states is unlikely to be high. In addition, a reduction in electron mobility is small.

In the microcrystalline oxide semiconductor film, for example, a microscopic region (for example, a region with a size greater than or equal to 1 nm and less than or equal to 10 nm) has a periodic atomic order occasionally. In other words, there is a case where periodic atomic order is not observed macroscopically or a case where long-range order in atomic arrangement is not observed. Accordingly, in some cases, the microcrystalline oxide semiconductor film cannot be distinguished from an amorphous oxide semiconductor film depending on the analysis method. For example, when the microcrystalline oxide semiconductor film is analyzed by an out-of-plane method with an XRD apparatus using an X-ray having a beam diameter larger than the diameter of a crystal part, a peak that shows alignment does not appear in some cases. Further, for example, a halo pattern is shown in some cases in an electron diffraction pattern of the microcrystalline oxide semiconductor film obtained by using an electron beam having a diameter larger than the diameter of a crystal part (for example, a beam diameter of 20 nmϕ or more, or 50 nmϕ or more). Further, spots are shown in some cases in a nanobeam electron diffraction pattern of the microcrystalline oxide semiconductor film obtained by using an electron beam having a diameter smaller than or equal to the diameter of a crystal part (for example, a beam diameter of 10 nmϕ or less, or 5 nmϕ or less), for example. Further for example, in a nanobeam electron diffraction pattern of the microcrystalline oxide semiconductor film, regions with high luminance in a circular pattern are shown in some cases. In a nanobeam electron diffraction pattern of the microcrystalline oxide semiconductor film, for example, a plurality of spots are shown in the region in some cases.

Figure 5B:
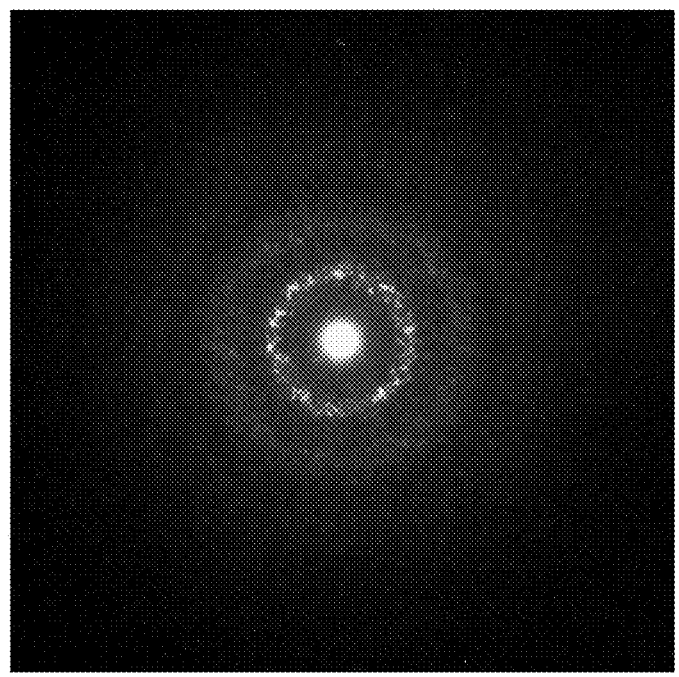

FIG. 5B shows an example of a nanobeam electron diffraction pattern of a sample including a microcrystalline oxide semiconductor film. Here, a sample of the microcrystalline oxide semiconductor film is cut in the direction perpendicular to a surface on which the microcrystalline oxide semiconductor film is formed, and the thickness thereof is reduced to about 40 nm. Further, an electron beam with a diameter of 1 nmϕ is emitted from the direction perpendicular to the cut surface of the sample. In the nanobeam electron diffraction pattern of the microcrystalline oxide semiconductor film in FIG. 5B, regions with high luminance in a circular pattern are shown, and in addition, a plurality of spots is also shown in the region.

Since the microscopic region in the microcrystalline oxide semiconductor film has a periodic atomic order occasionally, the microcrystalline oxide semiconductor film has lower density of defect states than the amorphous oxide semiconductor. Note that since crystal parts in the microcrystalline oxide semiconductor film are not regularly arranged, the microcrystalline oxide semiconductor film has higher density of defect states than the CAAC-OS film.

Accordingly, the microcrystalline oxide semiconductor film has a much higher carrier density than the CAAC-OS film, in some cases. Since an oxide semiconductor with high carrier density tends to have high electron mobility, a transistor including the microcrystalline oxide semiconductor film for a channel formation region can have a high field-effect mobility in some cases. Further, since the microcrystalline oxide semiconductor film has higher density of defect states than the CAAC-OS film, the microcrystalline oxide semiconductor film tends to have higher density of trap states. Accordingly, a transistor using the microcrystalline oxide semiconductor film for a channel formation region has larger variations in electrical characteristics and lower reliability than a transistor using the CAAC-OS film for a channel formation region. The microcrystalline oxide semiconductor film can be formed easily as compared to the CAAC-OS film because the microcrystalline oxide semiconductor film can be formed even when a relatively large amount of impurities are included; thus, depending on the purpose, the microcrystalline oxide semiconductor film can be favorably used in some cases. For example, the microcrystalline oxide semiconductor film may be formed by a deposition method such as a sputtering method using an AC power source. In this case, since the sputtering method using an AC power source allows a film to be formed with high uniformity over a large substrate, a semiconductor device including a transistor using the microcrystalline oxide semiconductor film for a channel formation region can be manufactured with high productivity.

The oxide semiconductor layer used in the semiconductor device may be an amorphous oxide semiconductor film, for example. The amorphous oxide semiconductor film has disordered atomic arrangement and includes no crystalline component. A typical amorphous oxide semiconductor film is the one that is amorphous in the whole area. For example, in the TEM image of the amorphous oxide semiconductor film, crystal parts cannot be found.

When the amorphous oxide semiconductor film is subjected to the analysis by an out-of-plane method with an XRD apparatus, a peak that shows alignment does not appear. Further, a halo pattern is observed in the electron diffraction pattern or the nanobeam electron diffraction pattern of the amorphous oxide semiconductor film.

The amorphous oxide semiconductor film can be formed in some cases, for example, by introducing a high-concentration impurity such as hydrogen. Hence, the amorphous oxide semiconductor film is, for example, an oxide semiconductor film containing a high-concentration impurity.

When an oxide semiconductor layer contains a high-concentration impurity, a defect state such as an oxygen vacancy is formed in the oxide semiconductor layer. This means that an amorphous oxide semiconductor film with a high-concentration impurity has a high density of defect states. In addition, since the amorphous oxide semiconductor film has low crystallinity, the density of defect states of the amorphous oxide semiconductor film is higher than those of the CAAC-OS film and the microcrystalline oxide semiconductor film.

Accordingly, the amorphous oxide semiconductor film has higher carrier density than the microcrystalline oxide semiconductor film. Therefore, a transistor using the amorphous oxide semiconductor film for a channel formation region tends to be normally on, and the amorphous oxide semiconductor film sometimes can preferably be used for a transistor which needs to have normally on electrical characteristics. The amorphous oxide semiconductor film has a high density of defect states and thus has a high density of trap states in some cases. Therefore, a transistor using the amorphous oxide semiconductor for a channel formation region has larger variation in electrical characteristics and lower reliability than a transistor using the CAAC-OS film or the microcrystalline oxide semiconductor film for a channel formation region in some cases. Note that the amorphous oxide semiconductor film can be formed by a deposition method that causes a relatively large amount of impurity to be contained in the deposited film, and thus can be easily obtained and preferably used depending on the use. For example, the amorphous oxide semiconductor film may be formed by a deposition method such as a spin coating method, a sol-gel method, an immersion method, a spray method, a screen printing method, a contact printing method, an ink-jet printing method, a roll coating method, or a mist CVD method. Hence, a semiconductor device including a transistor using the amorphous oxide semiconductor film for a channel formation region can be manufactured with high productivity.

Note that the oxide semiconductor layer may be a mixed film including two or more of the CAAC-OS film, the polycrystalline oxide semiconductor film, the microcrystalline oxide semiconductor film, and the amorphous oxide semiconductor film. For example, the mixed film includes two or more of an amorphous oxide semiconductor region, a microcrystalline oxide semiconductor region, a polycrystalline oxide semiconductor region, and a CAAC-OS region, in some cases. Further for example, the mixed film has a stacked-layer structure of two or more of an amorphous oxide semiconductor region, a microcrystalline oxide semiconductor region, a polycrystalline oxide semiconductor region, and a CAAC-OS region, in some cases.

The oxide semiconductor layer used in the semiconductor device may be a single crystal oxide semiconductor film. The single crystal oxide semiconductor film has a low impurity concentration and a low density of defect states (a small number of oxygen vacancies), and thus has a low carrier density. Therefore, a transistor using the single crystal oxide semiconductor film for a channel formation region is unlikely to be normally on. Further, the single crystal oxide semiconductor film has a low density of defect states and thus has a low density of trap states in some cases. Therefore, a transistor using the single crystal oxide semiconductor film for a channel formation region has a small variation in electrical characteristics and a high reliability in some cases The density of the oxide semiconductor layer becomes higher as the quantity of defects in the layer is smaller or as the crystallinity of the layer is higher. In addition, as the oxide semiconductor layer has a lower concentration of impurities such as hydrogen, the density of the layer is increased. For example, the density of a single crystal oxide semiconductor film is higher than that of a CAAC-OS film in some cases. For example, the density of a CAAC-OS film is higher than that of a microcrystalline oxide semiconductor film in some cases. For example, the density of a polycrystalline oxide semiconductor film is higher than that of a microcrystalline oxide semiconductor film in some cases. For example, the density of a microcrystalline oxide semiconductor film is higher than that of an amorphous oxide semiconductor film.

Although the crystallinity of the oxide semiconductor layer has been described in detail here, since the first oxide layer and the second oxide layer provided over and under the oxide semiconductor layer are oxide layers including the same main components as the oxide semiconductor layer in the semiconductor device of one embodiment of the present invention, the first oxide layer and the second oxide layer may include a CAAC-OS film, a polycrystalline oxide semiconductor film, a microcrystalline oxide semiconductor film, an amorphous oxide semiconductor film, or a single crystal oxide semiconductor film, or a mixed film including two or more kinds of these crystal states, as in the oxide semiconductor layer.

<Method 1 for Forming Crystalline Oxide Film>

One model of a method for forming a crystalline oxide film by sputtering method will be described. Note that an oxide film in the following description corresponds to the first oxide film, the oxide semiconductor film and/or the second oxide film in the manufacturing process of the transistor in Embodiment 1.

Figure 6A:
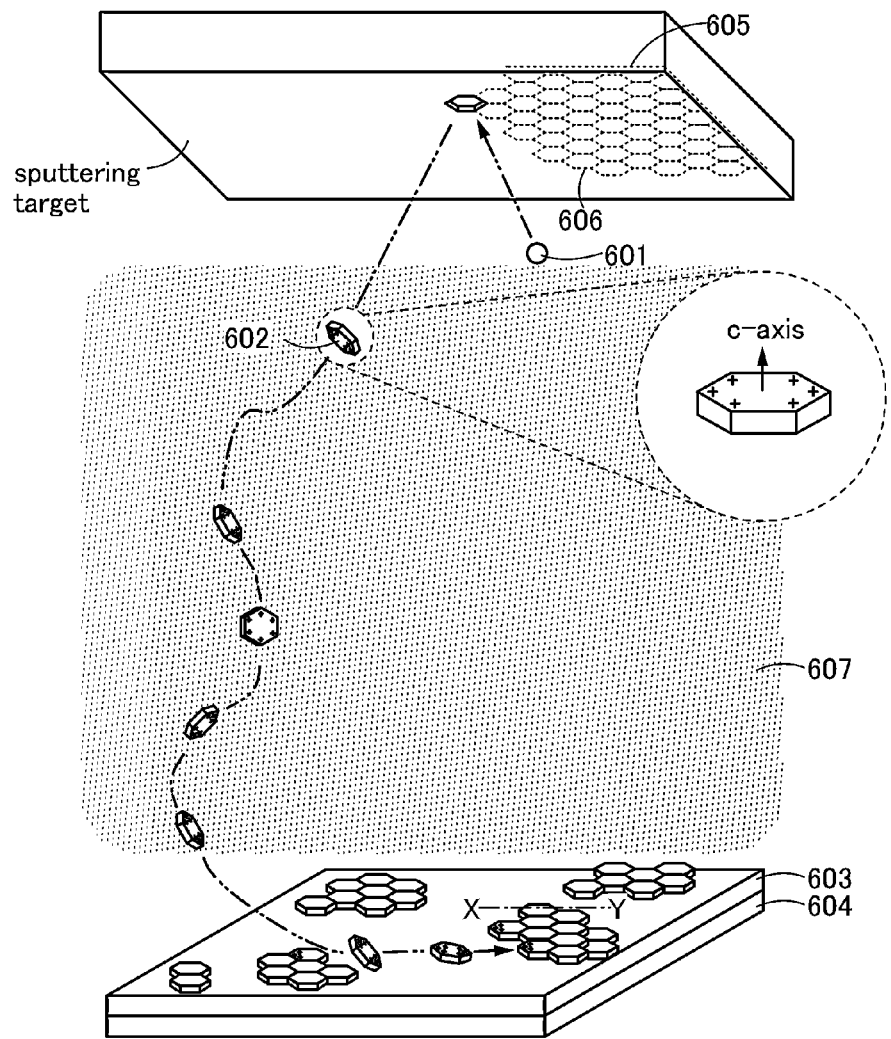
FIGS. 6A and 6B are schematic views illustrating a sputtered particle that is separated from a target and deposited on a deposition surface.
Figure 6B:
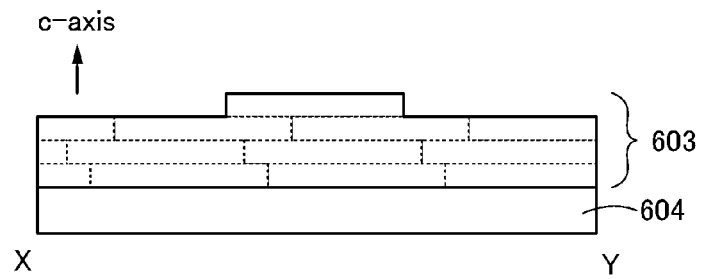

FIGS. 6A and 6B are schematic views illustrating a crystalline sputtered particle 602 that is separated from a polycrystalline oxide target by collision of an ion 601 and deposited on a deposition surface 604 to form an oxide film 603. A crystal grain included in the target has a cleavage plane 605 that is, for example, parallel to a-b plane of a crystal. Further, a crystal grain included in the target has a weak bond 606 between atoms, for example. Note that the deposition surface 604 may be an amorphous surface, an amorphous insulating surface, or an amorphous oxide surface.

When the ion 601 collides with the crystal grain included in the target, the interatomic bonds in the cleavage plane 605 and the bond 606 are cut, and the sputtered particle 602 is emitted.

Alternatively, when the ion 601 collides with the crystal grain included in the target, the interatomic bond in the cleavage plane 605 is cut, and a crystalline particle having a shape like a slice of the crystal grain included in the target is emitted. Then, the particle emitted from the target is exposed to plasma 607, whereby the interatomic bond is cut in the bond 606 and the sputtered particle 602 having crystallinity is generated.

The sputtered particle 602 has a flat plate shape, for example. The flat plate has two parallel faces (each face is called a flat plate face), for example. In particular, a flat plate having two parallel hexagonal faces with an interior angle of 120° (regular hexagonal faces) is referred to as a pellet. In the pellet-shaped sputtered particle 602, the hexagonal faces and a-b plane are parallel to each other, for example. In addition, in the pellet-shaped sputtered particle 602, the direction perpendicular to the hexagonal faces is the c-axis direction of the crystal, for example (see FIG. 6B). Further, the hexagonal face of the pellet-shaped sputtered particle 602 has a diameter of more than or equal to 1 nm and less than or equal to 100 nm, more than or equal to 1 nm and less than or equal to 30 nm, or more than or equal to 1 nm and less than or equal to 10 nm, for example. In a model shown below, the shape of the sputtered particle 602 is not limited to the flat plate shape with two parallel hexagonal faces. The period from generation to disappearance of the sputtered particle 602 is short, and thus it is difficult to directly observe the sputtered particle 602. Here, description is given under the assumption that the sputtered particle 602 has a flat plate shape having two parallel hexagonal faces.

The ions 601 include a cation of oxygen, for example. In the case where the ions 601 include a cation of oxygen, plasma damage at the deposition can be reduced, for example. Further, in the case where the ions 601 include a cation of oxygen, a reduction in crystallinity of the target or the change of the target into an amorphous state which might be caused by collision of the ions 601 with the surface of the target can be prevented, for example. Furthermore, in the case where the ions 601 include a cation of oxygen, the crystallinity of the target can be sometimes increased by the collision of the ions 601 with the surface of the target, for example. Note that the ions 601 may include a cation of a rare gas (e.g., helium, neon, argon, krypton, xenon), for example.

Figure 7A:
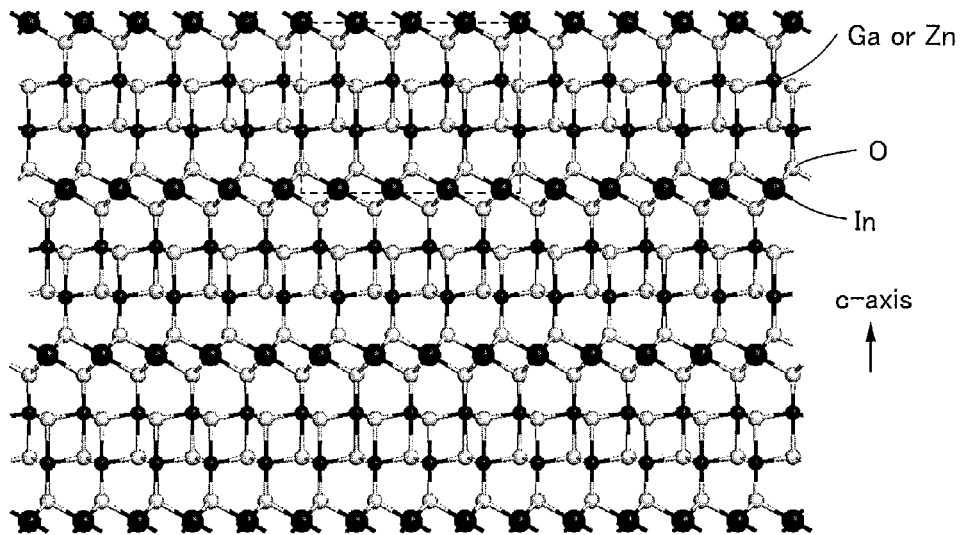
FIGS. 7A and 7B show an example of a crystal structure of a target.

Here, as an example of the crystal included in the target, a crystal structure of a homologous compound $InGaO_3(ZnO)_m$ (m is a natural number) when m=1 that is observed from a direction parallel with the a-b plane is shown (see FIG. 7A). Further, FIG. 7B shows an enlarged portion surrounded by a dashed line in FIG. 7A.

Figure 7B:
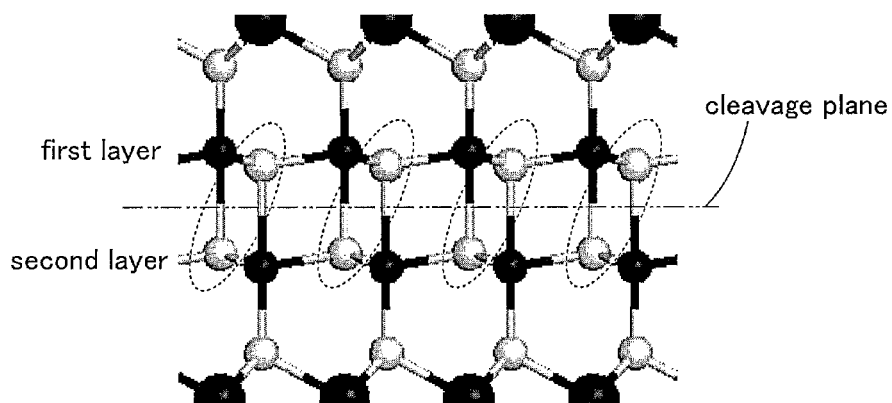

For example, in the crystal included in the target, a cleavage plane sometimes exists between a first layer including gallium atoms and/or zinc atoms and oxygen atoms, and a second layer including gallium atoms and/or zinc atoms and oxygen atoms, as shown in FIG. 7B. This is due to the short distance between the oxygen atoms in the first layer and the oxygen atoms in the second layer (see the surrounded portions in FIG. 7B). The oxygen atoms have negative charges, for example, and the short distance between the oxygen atoms weakens the bond between the layers. As shown in the drawing, the cleavage plane is a plane parallel to the a-b plane, in some cases. In the crystal structure shown in FIGS. 7A and 7B, metal atoms are arranged in a regular triangular or regular hexagonal configuration when seen from the direction perpendicular to the a-b plane. Therefore, in the case of using the target including the crystal having the crystal structure shown in FIGS. 7A and 7B, there is a high probability that the sputtered particle 602 has a regular hexagonal shape (pellet shape) with an interior angle of 120°.

It is preferable that the sputtered particle 602 be electrically charged. Note that it is preferable that corner portions of the sputtered particle 602 have charges with the same polarity because interaction within the sputtered particle occurs (the corner portions repel with each other) so that the shape of the sputtered particle 602 maintains. For example, the sputtered particle 602 may be positively charged. There is no particular limitation on the timing at which the sputtered particle 602 is positively charged. For example, the sputtered particle 602 can be positively charged by receiving a charge at the time of collision of the ion 601. Alternatively, the sputtered particle 602 can be positively charged by being exposed to the plasma 607. Further alternatively, the sputtered particle 602 can be positively charged when the ion 601 which is a cation of oxygen is bonded to a side face, a top face, or a bottom face of the sputtered particle 602.

To positively charge the corner portions of the sputtered particle 602, a direct-current (DC) power source is preferably used, for example. Alternatively, a radio frequency (RF) power source or an alternating-current (AC) power source can be used. However, in the case of using a sputtering method with an RF power source, uniform plasma discharge to a large area is difficult. Therefore, it is sometimes inappropriate to employ a sputtering method using an RF power source for deposition on a large-sized substrate. In addition, a DC power source is preferred to an AC power source from the following viewpoint.

In a sputtering method using a DC power source, a DC voltage is applied between a target and a substrate as illustrated in FIG. 8A1, for example. Accordingly, the difference in potential between the target and the substrate during the DC voltage application is constant as shown in FIG. 8B1. Thus, the sputtering method using a DC power source can maintain constant plasma discharge.

In the sputtering method using a DC power source, an electric field keeps being applied to the sputtered particle 602; accordingly, charges of the corner portions of the sputtered particle 602 are never lost. The sputtered particle 602 can maintain the shape by holding charges at the corner portions (see FIG. 8C1).

In contrast, in a sputtering method using an AC power source, a cathode and an anode switch between adjacent targets on the period basis (period A and period B) as illustrated in FIG. 8A2, for example. In period A in FIG. 8B2, for example, a target 1 functions as a cathode and a target 2 functions as an anode. Further, in period B in FIG. 8B2, for example, the target 1 functions as an anode and the target 2 functions as a cathode. The sum of period A and period B is approximately 20 microseconds to 50 microseconds, for example. Thus, in the sputtering method using an AC power source, plasma is discharged during alternating periods A and B.

In the sputtering method using an AC power source, there is a moment when an electric field is not applied to the sputtered particle 602, and thus the charges at the corner portions might be lost. The lost of the charges at the corner portions may lead to a change in the shapes of the sputtered particle 602 (see FIG. 8C2). Therefore, to maintain the shapes of the sputtered particle 602, a DC power source is preferred to an AC power source in some cases.

The sputtered particle 602 emitted from the target flies in the plasma 607 like a kite, and then flutters down to the deposition surface. Then, the sputtered particle 602 glides over the deposition surface like a hang glider when the deposition surface is at high temperatures (e.g., 150° C. or higher) by substrate heating. At this time, the sputtered particle 602 has charges at the corner portions, and thus repulsion between the sputtered particle 602 and another sputtered particle 602 that has already been deposited is generated, for example. In addition, migration of the sputtered particle 602 occurs over the high-temperature deposition surface, for example. Therefore, the sputtered particle 602 migrates to an area where no sputtered particle 602 is deposited on an outer surface and bonds to the side of another sputtered particle 602, thereby being deposited. In this manner, the sputtered particles 602 are spread with flat plate faces being parallel with the deposition surface. The oxide film 603 formed in this manner has, for example, crystals with c-axes aligned in the direction perpendicular to the deposition surface (c-axis aligned crystal, CAAC). In addition, the oxide film 603 is, for example, an oxide film having a uniform thickness and aligned orientations of crystals.

The oxide film formed in this manner has a high crystallinity even over an amorphous surface, an amorphous insulating surface, an amorphous oxide surface, or the like.

Next, a formation method of an oxide film when the temperature of a deposition surface is low by no substrate heating or the like is described with reference to FIG. 9 (for example, the temperature is lower than 130° C., lower than 100° C., lower than 70° C. or at room temperatures (20° C. to 25° C.)).

Figure 9:
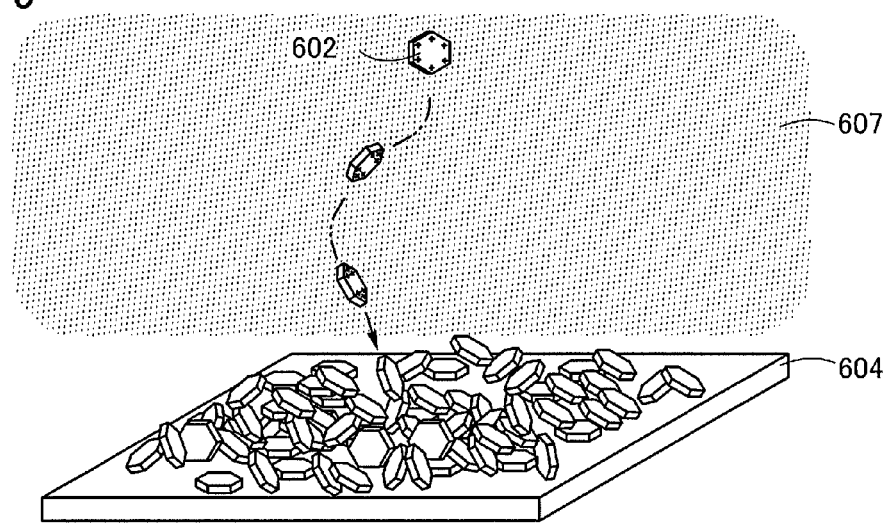
FIG. 9 is a schematic view illustrating a sputtered particle that is deposited on a deposition surface.

In FIG. 9, when the deposition surface has a low temperature, the sputtered particle 602 flutters down to the deposition surface randomly. The sputtered particle 602 does not migrate and thus is deposited at random in areas including an area where another sputtered particle 602 has already been deposited, for example. In other words, the thickness of the deposited oxide film is not uniform and the orientation of crystals is irregular in some cases. The oxide film deposited in this manner has a crystal part (nanocrystal) because the crystallinity of the sputtered particle 602 has been maintained to some degree.

In addition, for example, when the pressure during deposition is high, the sputtered particle 602 that is flying collides with another particle (such as atom, molecule, ion, radical, or the like) of argon or the like in higher frequency. The crystal structure of the sputtered particle 602 may be broken when the sputtered particle 602 that is flying collides with another particle (the sputtered particle 602 is re-sputtered). For example, when the sputtered particle 602 collides with another particle, the flat-plate shape of the sputtered particle 602 cannot be maintained and is broken into pieces (separated into atoms) in some cases. At this time, each atom separated from the sputtered particle 602 is deposited on the deposition surface so that an amorphous oxide film is formed in some cases.

In addition, when a process in which a liquid is used or a process in which a solid target is vaporized is employed instead of a sputtering method using a target having a polycrystalline oxide, separated atoms fly and are deposited on a deposition surface and thus an amorphous oxide film is formed in some cases. In addition, for example, in a laser ablation method, atoms, molecules, ions, radicals, clusters, or the like released from a target fly and are deposited on the deposition surface, so that an amorphous oxide film is formed in some cases.

<Method 2 for Forming Crystalline Oxide Film>

In the case of forming an oxide film including CAAC, the oxide film may be formed by the following method. In the following description of an example, the oxide film including CAAC is a CAAC-OS film.

First, a first oxide semiconductor film is formed to a thickness of greater than or equal to 1 nm and less than 10 nm. The first oxide semiconductor film is formed by a sputtering method. Specifically, the substrate temperature is set at higher than or equal to 100° C. and lower than or equal to 500° C., preferably higher than or equal to 150° C. and lower than or equal to 450° C., and the proportion of oxygen in a deposition gas is set at higher than or equal to 30 vol %, preferably 100 vol %.

Next, heat treatment is performed so that the first oxide semiconductor film becomes a first CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidizing atmosphere. The heat treatment in an inert atmosphere can reduce the concentration of impurities in the first oxide semiconductor film in a short time. At the same time, the heat treatment in an inert atmosphere may generate oxygen vacancies in the first oxide semiconductor film. In such a case, the heat treatment in an oxidizing atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the first oxide semiconductor film in a shorter time.

By the heat treatment, the first oxide semiconductor film can be crystallized easier in the case where the thickness is greater than or equal to 1 nm and less than 10 nm than in the case where the thickness is greater than or equal to 10 nm.

Next, a second oxide semiconductor film having the same composition as the first oxide semiconductor film is formed to a thickness of greater than or equal to 10 nm and less than or equal to 50 nm. The second oxide semiconductor film is formed by a sputtering method. Specifically, the substrate temperature is set at higher than or equal to 100° C. and lower than or equal to 500° C., preferably higher than or equal to 150° C. and lower than or equal to 450° C., and the proportion of oxygen in a deposition gas is set at higher than or equal to 30 vol %, preferably 100 vol %.

Next, heat treatment is performed so that solid phase growth of the second oxide semiconductor film is performed using the first CAAC-OS film, thereby forming a second CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidizing atmosphere. It is preferable to perform heat treatment in an inert atmosphere and then perform heat treatment in an oxidizing atmosphere. The heat treatment in an inert atmosphere can reduce the concentration of impurities in the second oxide semiconductor film in a short time. At the same time, the heat treatment in an inert atmosphere may generate oxygen vacancies in the second oxide semiconductor film. In such a case, the heat treatment in an oxidizing atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the second oxide semiconductor film in a shorter time.

In the above-described manner, a CAAC-OS film with a total thickness of greater than or equal to 10 nm can be formed.

An oxide layer or an oxide semiconductor layer in any of the above crystal states may be used for the first oxide layer, the oxide semiconductor layer, and the second oxide layer in the stacked structure including oxide layers and an oxide semiconductor layer and included in the transistor of one embodiment of the present invention. However, it is preferable to use a CAAC-OS film as the oxide semiconductor layer functioning as a channel because defect states due to oxygen vacancies in the oxide semiconductor layer can be reduced.

In the case of using the CAAC-OS film as the oxide semiconductor layer, the second oxide layer provided over and in contact with the oxide semiconductor layer tends to have a crystal structure that is grown using a crystal of the oxide semiconductor layer as a seed crystal. Accordingly, even when the first oxide layer and the second oxide layer are formed using the same material and the same manufacturing method, the second oxide layer might have a higher crystallinity than the first oxide layer. Further, a region in contact with the oxide semiconductor layer and a region that is not in contact with the oxide semiconductor layer in the second oxide layer might have different crystallinities.

The structures, the methods, and the like described in this embodiment can be combined as appropriate with any of the structures, the methods, and the like described in the other embodiments.

Embodiment 3

Figure 10A:
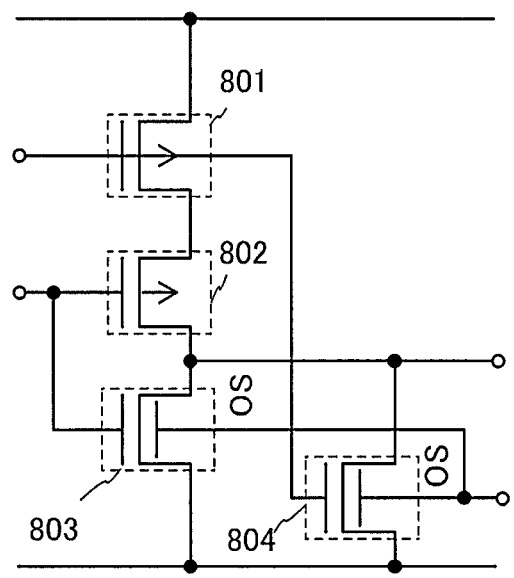
FIGS. 10A and 10B are circuit diagrams each illustrating a semiconductor device of one embodiment of the present invention.
Figure 10B:
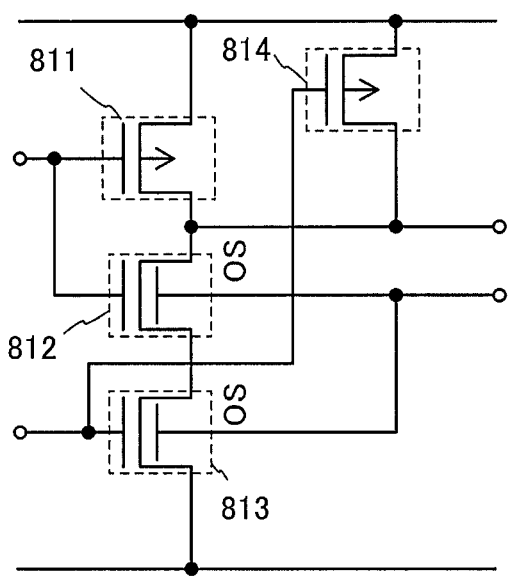

FIG. 10A illustrates an example of a circuit diagram of a NOR circuit, which is a logic circuit, as an example of the semiconductor device described in one embodiment of the present invention. FIG. 10B is a circuit diagram of a NAND circuit.

In the NOR circuit in FIG. 10A, p-channel transistors 801 and 802 are transistors in each of which a channel formation region is formed using a semiconductor material (e.g., silicon) other than an oxide semiconductor, and n-channel transistors 803 and 804 each include an oxide stack including an oxide semiconductor layer and each have a structure similar to that of the transistor described in Embodiment 1.

A transistor including a semiconductor material such as silicon can easily operate at high speed. On the other hand, a transistor including an oxide semiconductor enables charge to be held for a long time owing to its characteristics.

To miniaturize the logic circuit, it is preferable that the n-channel transistors 803 and 804 be stacked over the p-channel transistors 801 and 802. For example, the transistors 801 and 802 can be formed using a single crystal silicon substrate, and the transistors 803 and 804 can be formed over the transistors 801 and 802 with an insulating layer provided therebetween.

In the NAND circuit in FIG. 10B, p-channel transistors 811 and 814 are transistors in each of which a channel formation region is formed using a semiconductor material (e.g., silicon) other than an oxide semiconductor, and n-channel transistors 812 and 813 each include an oxide stack including an oxide semiconductor and each have a structure similar to that of the transistor described in Embodiment 1.

As in the NOR circuit shown in FIG. 10A, to miniaturize the logic circuit, it is preferable that the n-channel transistors 812 and 813 be stacked over the p-channel transistors 811 and 814.

By applying a transistor including an oxide semiconductor for a channel formation region and having extremely small off-state current to the semiconductor device in this embodiment, power consumption of the semiconductor device can be sufficiently reduced.

A semiconductor device which is miniaturized, is highly integrated, and has stable and excellent electrical characteristics by stacking semiconductor elements including different semiconductor materials and a method for manufacturing the semiconductor device can be provided.

In addition, by employing the structure of the transistor described in Embodiment 1, a NOR circuit and a NAND circuit with high reliability and stable characteristics can be provided.

Note that the NOR circuit and the NAND circuit including the transistor described in Embodiment 1 are described as examples in this embodiment; however, the present invention is not particularly limited to those circuits, and an AND circuit, an OR circuit, or the like can be formed.

The structures, the methods, and the like described in this embodiment can be combined as appropriate with any of the structures, the methods, and the like described in the other embodiments.

Embodiment 4

In this embodiment, an example of a semiconductor device (memory device) which includes the transistor described in Embodiment 1, which can hold stored data even when not powered, and which has an unlimited number of write cycles will be described with reference to drawings.

Figure 11A:
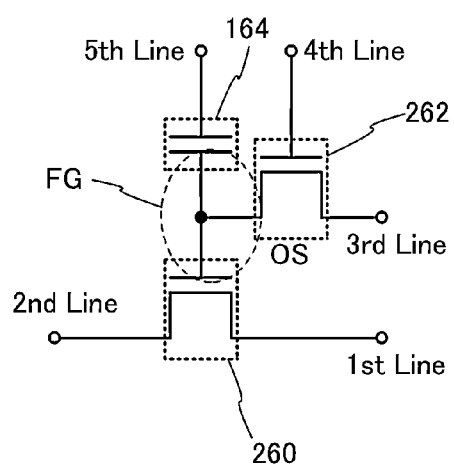
FIGS. 11A to 11C are circuit diagrams and a conceptual diagram of a semiconductor device of one embodiment of the present invention.

FIG. 11A is a circuit diagram illustrating the semiconductor device of this embodiment.

A transistor including a semiconductor material (e.g., silicon) other than an oxide semiconductor can be applied to a transistor 260 illustrated in FIG. 11A and thus the transistor 260 can easily operate at high speed. Further, a structure similar to that of the transistor described in Embodiment 1, which includes an oxide stack including an oxide semiconductor, can be applied to a transistor 262 to enable charge to be held for a long time owing to its characteristics.

Although all the transistors are n-channel transistors here, p-channel transistors can be used for the semiconductor device described in this embodiment.

In FIG. 11A, a first wiring (1st Line) is electrically connected to a source electrode layer of the transistor 260, and a second wiring (2nd Line) is electrically connected to a drain electrode layer of the transistor 260. A third wiring (3rd Line) is electrically connected to one of a source electrode layer and a drain electrode layer of the transistor 262, and a fourth wiring (4th Line) is electrically connected to a gate electrode layer of the transistor 262. A gate electrode layer of the transistor 260 and the other of the source electrode layer and the drain electrode layer of the transistor 262 are electrically connected to one electrode of a capacitor 264. A fifth wiring (5th Line) and the other electrode of the capacitor 264 are electrically connected to each other.

The semiconductor device in FIG. 11A can write, hold, and read data as described below, utilizing the potential holding characteristics of the transistor 260 by which the potential of the gate electrode layer can be held.

Writing and holding of data will be described. First, the potential of the fourth wiring is set to a potential at which the transistor 262 is on, so that the transistor 262 is turned on. Thus, the potential of the third wiring is applied to the gate electrode layer of the transistor 260 and the capacitor 264. In other words, a predetermined charge is supplied to the gate electrode layer of the transistor 260 (writing). Here, one of two kinds of charges providing different potential levels (hereinafter referred to as a low-level charge and a high-level charge) is supplied. After that, the potential of the fourth wiring is set to a potential at which the transistor 262 is off, so that the transistor 262 is turned off. Thus, the charge given to the gate electrode layer of the transistor 260 is held (holding).

Since the off-state current of the transistor 262 is extremely low, the charge of the gate electrode layer of the transistor 260 is held for a long time.

Next, reading of data is described. By supplying an appropriate potential (reading potential) to the fifth wiring while supplying a predetermined potential (constant potential) to the first wiring, the potential of the second wiring varies depending on the amount of charge held in the gate electrode layer of the transistor 260. This is because in general, when the transistor 260 is an n-channel transistor, an apparent threshold voltage $V_{th\_H}$ in the case where a High level charge is given to the gate electrode layer of the transistor 260 is lower than an apparent threshold voltage $V_{th\_L}$ in the case where a Low level charge is given to the gate electrode layer of the transistor 260. Here, an apparent threshold voltage refers to the potential of the fifth wiring, which is needed to turn on the transistor 260. Thus, the potential of the fifth wiring is set to a potential $V_0$ which is between $V_{th\_H}$ and $V_{th\_L}$, whereby charge supplied to the gate electrode layer of the transistor 260 can be determined. For example, in the case where High level charge is given in writing, when the potential of the fifth wiring is set to $V_0$ ($>V_{th\_H}$), the transistor 260 is turned on. In the case where Low level charge is given in writing, even when the potential of the fifth wiring is set to $V_0$ ($<V_{th\_L}$), the transistor 260 remains in an off state. Therefore, the stored data can be read by the potential of the second wiring.

Note that in the case where memory cells are arrayed to be used, only data of desired memory cells needs to be read. In the case where such reading is not performed, a potential at which the transistor 260 is off regardless of the state of the gate electrode layer, that is, a potential smaller than $V_{th\_H}$ may be supplied to the fifth wiring. Alternatively, a potential at which the transistor 260 is on regardless of the state of the gate electrode layer, that is, a potential larger than $V_{th\_L}$, may be supplied to the fifth wiring.

Figure 11B:
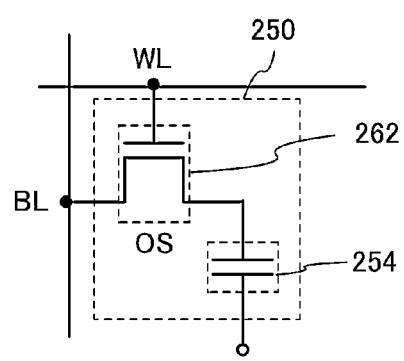
Figure 11C:
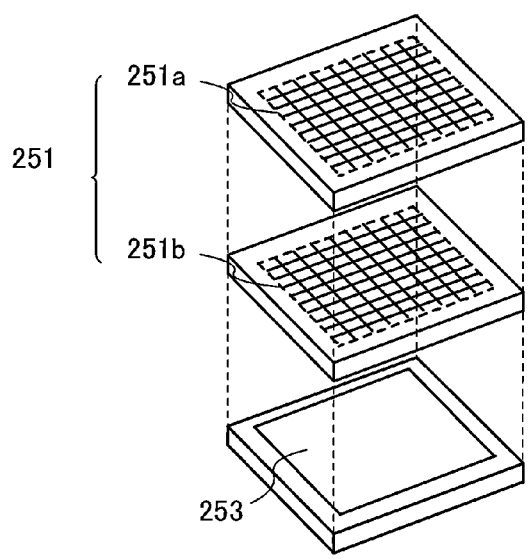

FIG. 11B illustrates another example of one embodiment of a structure of a memory device. FIG. 11B illustrates an example of a circuit configuration of a semiconductor device, and FIG. 11C is a schematic diagram illustrating an example of a semiconductor device. First, the semiconductor device illustrated in FIG. 11B will be described, and then the semiconductor device illustrated in FIG. 11C will be described.

In the semiconductor device illustrated in FIG. 11B, a bit line BL is electrically connected to the source electrode layer or the drain electrode layer of the transistor 262, a word line WL is electrically connected to the gate electrode layer of the transistor 262, and the source electrode layer or the drain electrode layer of the transistor 262 is electrically connected to a first terminal of a capacitor 254.

Here, the transistor 262 including an oxide semiconductor has extremely low off-state current. For that reason, a potential of the first terminal of the capacitor 254 (or a charge accumulated in the capacitor 254) can be held for an extremely long time by turning off the transistor 262.

Next, writing and holding of data in the semiconductor device (a memory cell 250) illustrated in FIG. 11B will be described.

First, the potential of the word line WL is set to a potential at which the transistor 262 is on, so that the transistor 262 is turned on. Accordingly, the potential of the bit line BL is supplied to the first terminal of the capacitor 254 (writing). After that, the potential of the word line WL is set to a potential at which the transistor 262 is off, so that the transistor 262 is turned off. Thus, the potential of the first terminal of the capacitor 254 is held (holding).

Because the off-state current of the transistor 262 is extremely small, the potential of the first terminal of the capacitor 254 (or the charge accumulated in the capacitor) can be held for a long time.

Next, reading of data will be described. When the transistor 262 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is expressed as $(C_B \times V_{B0} + C \times V)/(C_B + C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 11B can hold charge that is accumulated in the capacitor 254 for a long time because the amount of the off-state current of the transistor 262 is extremely small. In other words, power consumption can be adequately reduced because refresh operation becomes unnecessary or the frequency of refresh operation can be extremely low. Moreover, stored data can be stored for a long time even when power is not supplied.

Next, the semiconductor device illustrated in FIG. 11C will be described.

The semiconductor device illustrated in FIG. 11C includes a memory cell array 251 (memory cell arrays 251a and 251b) including a plurality of memory cells 250 illustrated in FIG. 11B as memory circuits in the upper portion, and a peripheral circuit 253 in the lower portion which is necessary for operating the memory cell array 251. Note that the peripheral circuit 253 is electrically connected to the memory cell array 251.

In the structure illustrated in FIG. 11C, the peripheral circuit 253 can be provided under the memory cell array 251 (the memory cell arrays 251*a* and 251*b*), which leads to smaller the semiconductor device size.

It is preferable that a semiconductor material of a transistor provided in the peripheral circuit 253 be different from that of the transistor 262. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, the transistor can favorably realize a variety of circuits (e.g., a logic circuit or a driver circuit) which needs to operate at high speed.

Note that FIG. 11C illustrates, as an example, the semiconductor device in which two memory cell arrays 251 (the memory cell arrays 251*a* and 251*b*) are stacked; however, the number of memory cell arrays which are stacked is not limited thereto. Three or more memory cells arrays may be stacked.

When a transistor including the oxide semiconductor in a channel formation region is used as the transistor 262, stored data can be held for a long time. In other words, power consumption can be sufficiently reduced because a semiconductor memory device in which refresh operation is unnecessary or the frequency of refresh operation is extremely low can be provided.

Further, a transistor described in Embodiment 1, which includes an oxide stack including an oxide semiconductor layer where a channel formation region is formed apart from the surface of the oxide stack is used in the semiconductor device of this embodiment. Thus, a highly reliable semiconductor device having stable electrical characteristics can be provided.

Embodiment 5

In this embodiment, application examples of the semiconductor device described in any of the above embodiments to electronic devices such as cellular phones, smartphones, or e-book readers will be described with reference to FIG. 12, FIG. 13, FIG. 14, and FIGS. 15A and 15B.

Figure 12:
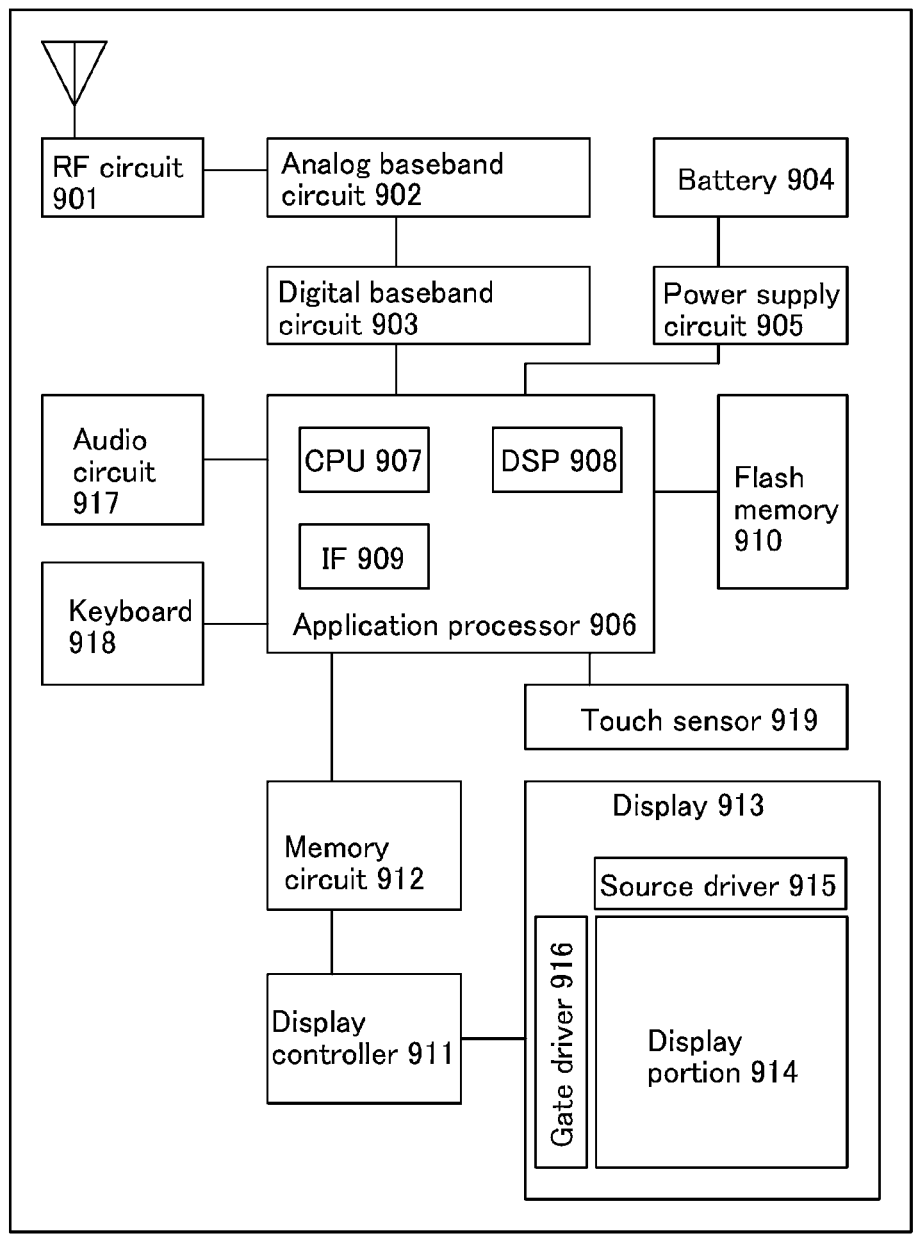
FIG. 12 is a block diagram of a semiconductor device of one embodiment of the present invention.

FIG. 12 is a block diagram of an electronic device. An electronic device illustrated in FIG. 12 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. In general, the memory circuit 912 includes an SRAM or a DRAM; by employing any of the semiconductor devices described in the above embodiments for the memory circuit 912, writing and reading of data can be performed at high speed, data can be held for a long time, and power consumption can be sufficiently reduced.

Figure 13:
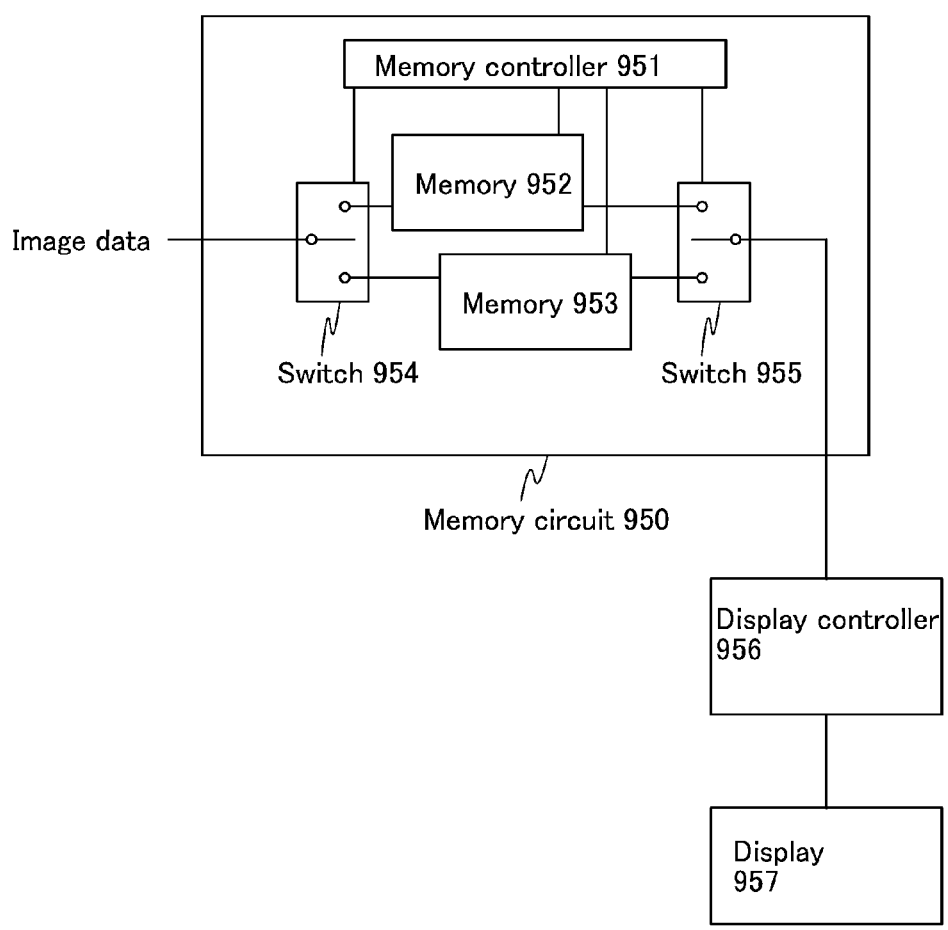
FIG. 13 is a block diagram of a semiconductor device of one embodiment of the present invention.

FIG. 13 illustrates an example in which any of the semiconductor devices described in the above embodiments is used for a memory circuit 950 in a display. The memory circuit 950 illustrated in FIG. 13 includes a memory 952, a memory 953, a switch 954, a switch 955, and a memory controller 951. Further, the memory circuit is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not illustrated). The input image data A is stored in the memory 952 though the switch 954. The image data (stored image data A) stored in the memory 952 is transmitted to the display 957 through the switch 955 and the display controller 956, and is displayed on the display 957.

In the case where the input image data A is not changed, the stored image data A is read from the memory 952 through the switch 955 by the display controller 956 normally at a frequency of approximately 30 Hz to 60 Hz.

Next, for example, when a user performs an operation to rewrite a screen (i.e., when the input image data A is changed), the application processor produces new image data (input image data B). The input image data B is stored in the memory 953 through the switch 954. Also during this time, the stored image data A is regularly read from the memory 952 through the switch 955. After the completion of storing the new image data (stored image data B) in the memory 953, from the next frame for the display 957, the stored image data B starts to be read, is transmitted to the display 957 through the switch 955 and the display controller 956, and is displayed on the display 957. This reading operation continues until another new image data is stored in the memory 952.

By alternately writing and reading image data to and from the memory 952 and the memory 953 as described above, images are displayed on the display 957. Note that the memory 952 and the memory 953 are not necessarily separate memories, and a single memory may be divided and used. By employing any of the semiconductor devices described in the above embodiments for the memory 952 and the memory 953, data can be written and read at high speed and held for a long time, and power consumption can be sufficiently reduced. Further, a semiconductor device which is hardly affected by entry of water, moisture, and the like from the outside and has high reliability can be provided.

Figure 14:
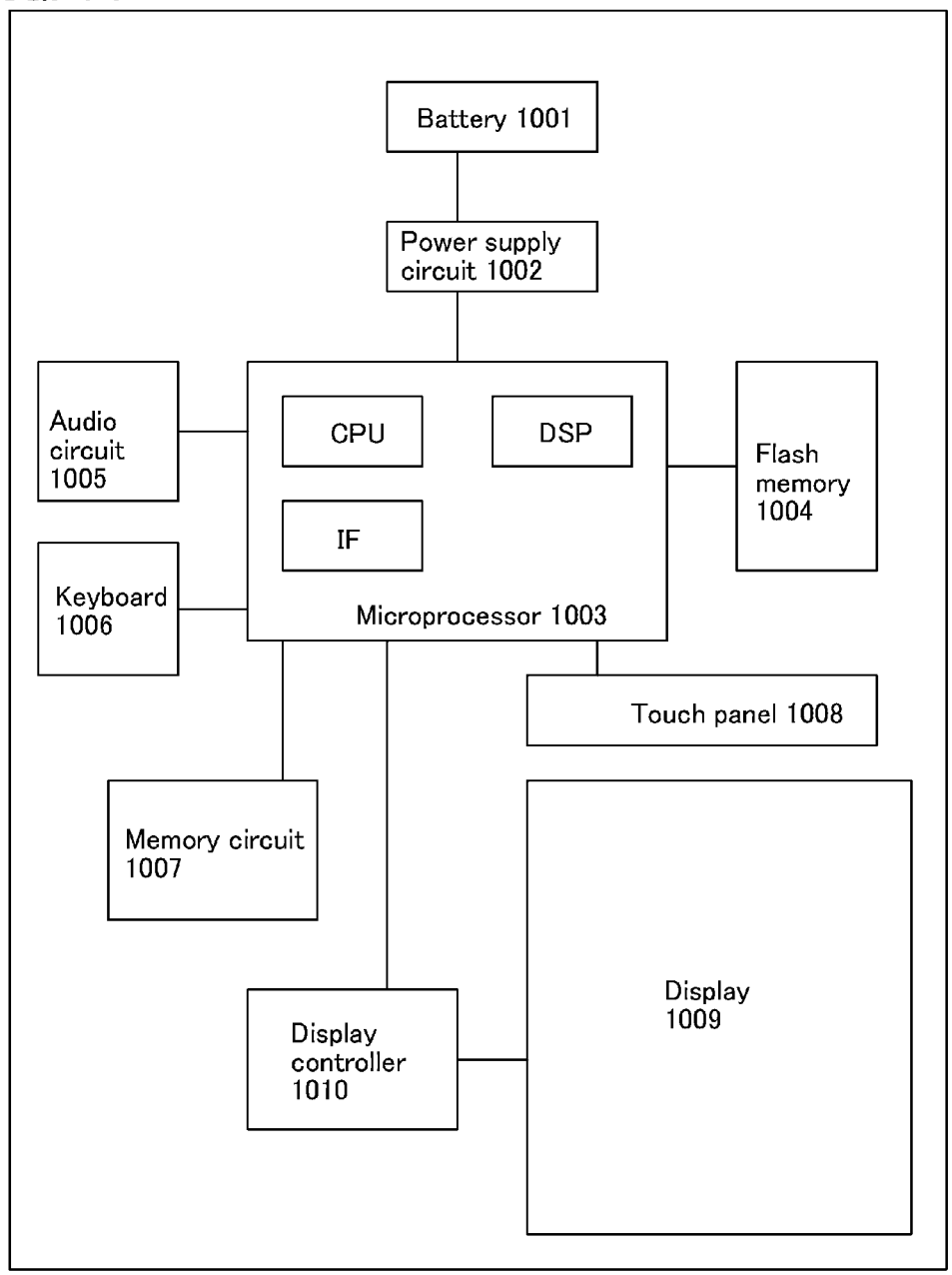
FIG. 14 is a block diagram of a semiconductor device of one embodiment of the present invention.

FIG. 14 is a block diagram of an electronic book. The electronic book in FIG. 14 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 14. The memory circuit 1007 has a function of temporarily storing the contents of a book. For example, when a user uses a highlight function, the memory circuit 1007 stores and holds data of a portion specified by the user. Note that the highlight function is a function of marking a specific portion while reading an e-book, e.g. by changing the display color, underlining, making characters bold, changing the font of characters, or the like, to make a difference between the specific portion and the other portions. In order to store the data for a short time, the data may be stored in the memory circuit 1007. In order to store the data for a long time, the data stored in the memory circuit 1007 may be copied to the flash memory 1004. In such a case also, by employing the semiconductor device described in any of the above embodiments, data can be written and read at high speed and held for a long time, and power consumption can be sufficiently reduced. Further, a semiconductor device which is hardly affected by entry of water, moisture, and the like from the outside and which has high reliability can be provided.

Figure 15A:
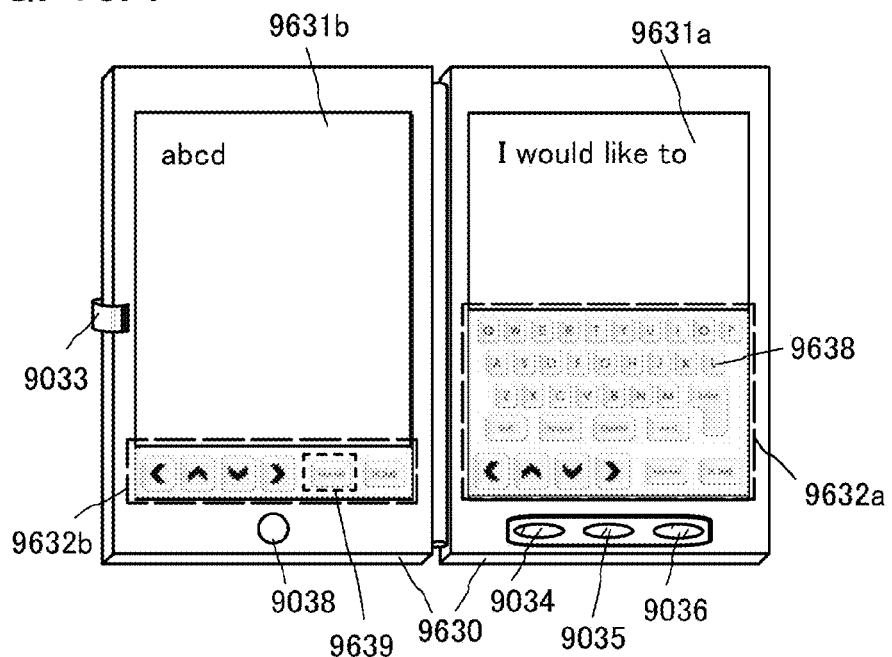
FIGS. 15A and 15B illustrate an electronic device to which a semiconductor device of one embodiment of the present invention can be applied.
Figure 15B:
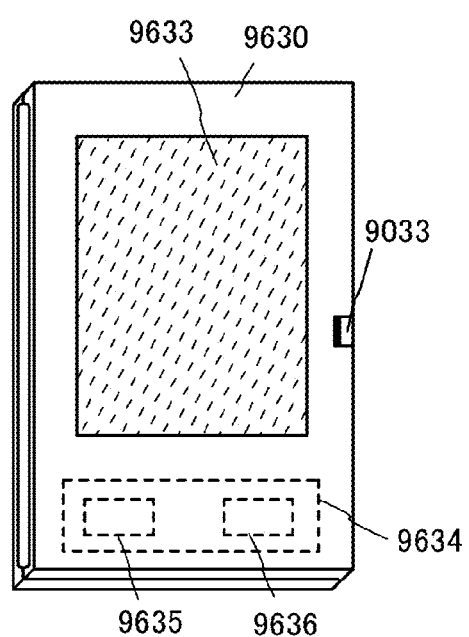

FIGS. 15A and 15B illustrate a specific example of an electronic device. FIGS. 15A and 15B illustrate a foldable tablet terminal. The tablet terminal is opened in FIG. 15A.

The tablet terminal includes a housing 9630, a display portion 9631*a*, a display portion 9631*b*, a display mode switch 9034, a power switch 9035, a power saver switch 9036, a clasp 9033, and an operation switch 9038.

The semiconductor device described in any of the above embodiments can be used for the display portion 9631*a* and the display portion 9631*b*, so that the tablet terminal can have high reliability. In addition, the memory device described in any of the above embodiments may be applied to the semiconductor device of this embodiment.

Part of the display portion 9631*a* can be a touch panel region 9632*a* and data can be input when a displayed operation key 9638 is touched. Although a structure in which a half region in the display portion 9631*a* has only a display function and the other half region also has a touch panel function is shown as an example, the display portion 9631*a* is not limited to this structure. For example, the display portion 9631*a* can display keyboard buttons in the whole region to be a touch panel, and the display portion 9631*b* can be used as a display screen.

As in the display portion 9631*a*, part of the display portion 9631*b* can be a touch panel region 9632*b*. When a keyboard display switching button 9639 displayed on the touch panel is touched with a finger, a stylus, or the like, a keyboard can be displayed on the display portion 9631*b*.

Touch input can be performed in the touch panel region 9632*a* and the touch panel region 9632*b* at the same time.

The display mode switch 9034 can switch the display between portrait mode, landscape mode, and the like, and between monochrome display and color display, for example. The power saver switch 9036 can control display luminance in accordance with the amount of external light in use of the tablet terminal detected by an optical sensor incorporated in the tablet terminal In addition to the optical sensor, another detection device including a sensor for detecting inclination, such as a gyroscope or an acceleration sensor, may be incorporated in the tablet terminal.

Although the display portion 9631*a* and the display portion 9631*b* have the same display area in FIG. 15A, one embodiment of the present invention is not limited to this structure. The display portion 9631*a* and the display portion 9631*b* may have different areas or different display quality. For example, one of them may be a display panel that can display higher-definition images than the other.

The tablet terminal is closed in FIG. 15B. The tablet terminal includes the housing 9630, a solar cell 9633, a charge and discharge control circuit 9634, a battery 9635, and a DCDC converter 9636. In FIG. 15B, a structure including the battery 9635 and the DCDC converter 9636 is illustrated as an example of the charge and discharge control circuit 9634.

Since the tablet terminal is foldable, the housing 9630 can be closed when the tablet terminal is not used. As a result, the display portion 9631*a* and the display portion 9631*b* can be protected; thus, a tablet terminal which has excellent durability and excellent reliability in terms of long-term use can be provided.

In addition, the tablet terminal illustrated in FIGS. 15A and 15B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The structures, the methods, and the like described in this embodiment can be combined as appropriate with any of the structures, the methods, and the like described in the other embodiments.

Example 1

In Example 1, transistors according to one embodiment of the present invention were fabricated, and initial characteristics and the long-term reliability of the transistors were evaluated. The evaluation results will be described.

First, the fabrication method of the transistors used in this example will be described below. In this example, transistors having a structure similar to that of the transistor 200 illustrated in FIGS. 1A to 1C were formed.

In this example, a silicon wafer was used as the substrate. First of all, a 100-nm-thick thermal oxide film was formed by performing heat treatment on the silicon wafer in an oxidizing atmosphere to which hydrogen chloride was added. The heat treatment temperature was set at 950° C.

Then, as a base insulating layer, a 300-nm-thick silicon oxynitride film was formed over the thermal oxide film by a CVD method.

Further, a surface of the silicon oxynitride film was polished to be flat by chemical mechanical polishing (CMP) treatment. The CMP treatment conditions were set as follows: a polyurethane-based polishing cloth was used as a polishing pad for CMP; a 5-fold dilution of NP8020 (produced by Nitta Haas Incorporated) was used as slurry; the slurry temperature was room temperature; the polishing pressure was 0.01 MPa; the number of spindle rotations on the side where the substrate was fixed was 60 rpm; and the number of rotations of a table where the polishing cloth was fixed was 56 rpm. The CMP treatment time was 2 minutes. The polishing amount of the silicon oxynitride film was approximately 12 nm.

Next, heat treatment was performed at 450° C. in a reduced (vacuum) atmosphere for 1 hour.

After the heat treatment, oxygen ions were implanted to the base insulating layer by an ion implantation method. The oxygen ion implantation conditions were set as follows: acceleration voltage, 60 kV; dosage, $2.0 \times 10^{16}$ ions/cm$^2$; tilt angle, 7°; and twist angle, 72°.

Next, as the first oxide film, a 20-nm-thick In—Ga—Zn oxide film was formed over the base insulating layer by a sputtering method using an oxide target with an atomic ratio of In:Ga:Zn=1:3:2. The deposition conditions were set as follows: an atmosphere of argon and oxygen (argon:oxygen=30 sccm:15 sccm) was used; the pressure was 0.4 Pa; the power was 0.5 kW (DC); the substrate temperature was 200° C.; and the distance between the substrate and the target was 60 mm.

After the first oxide film was formed, an oxide semiconductor film was successively formed without exposure to the air. As the oxide semiconductor film, a 15-nm-thick In—Ga—Zn oxide film was deposited by a sputtering method using an oxide target with In:Ga:Zn=1:1:1 in atomic ratio. The deposition conditions were set as follows: an atmosphere of argon and oxygen (argon:oxygen=30 sccm:15 sccm) was used; the pressure was 0.4 Pa; the power was 0.5 kW (DC); the substrate temperature was 300° C.; and the distance between the substrate and the target was 60 mm.

Next, heat treatment was performed at 450° C. for 1 hour in a nitrogen atmosphere, and then heat treatment was performed at 450° C. for 1 hour in an oxygen atmosphere in the same treatment chamber.

The first oxide film and the oxide semiconductor film which have been subjected to the heat treatment were processed using a mask that was formed by photolithography, so that an island-shaped first oxide layer and an island-shaped oxide semiconductor layer were formed. For this processing, an inductively coupled plasma (ICP) etching method was employed. The etching conditions were set as follows: a mixed gas of boron trichloride and chlorine ($BCl_3$:$Cl_2$=60 sccm:20 sccm) was used as etching gas; the power was 450 W; the bias power was 100 W; and the pressure was 1.9 Pa.

As a conductive film for forming a source electrode layer and a drain electrode layer, a 100-nm-thick tungsten film was formed over the island-shaped oxide semiconductor layer by a sputtering method. The deposition conditions of the tungsten film were set as follows: an argon atmosphere (flow rate: 80 sccm) was used; the pressure was 0.8 Pa; the power was 1 kW (DC); the substrate temperature was 200° C.; and the distance between the substrate and the target was 60 mm.

The tungsten film was selectively etched to form the source electrode layer and the drain electrode layer through a first etching step, a recession step of a resist mask by ashing, and a second etching step in succession, so that the tungsten film had a step-like end portion.

The conditions of the first etching step of the tungsten film were set as follows: a mixed gas of chlorine, tetrafluoromethane, and oxygen ($Cl_2$:$CF_4$:$O_2$=45 sccm:55 sccm:55 sccm) was used as etching gas; the power was 3000 W; the bias power was 110 W; the pressure was 0.67 Pa; the substrate temperature was 40° C.; and the etching time was 13 seconds. Next, the resist mask was made to recede by etching under the following conditions: the flow rate of oxygen as an etching gas was 100 sccm, the power was 2000 W, the bias power was 0 W, the pressure was 3.00 Pa, the substrate temperature was 40° C., and the etching time was 15 seconds. Then, using this receding resist mask, the tungsten film was subjected to the second etching step under the following conditions: a mixed gas of chlorine, tetrafluoromethane, and oxygen ($Cl_2$:$CF_4$:$O_2$=45 sccm:55 sccm:55 sccm) was used as etching gas; the power was 3000 W; the bias power was 110 W; the pressure was 0.67 Pa; the substrate temperature was 40° C.; and the etching time was 12 seconds. In this manner, the source electrode layer and the drain electrode layer were formed.

As a second oxide film, a 5-nm-thick In—Ga—Zn oxide film was formed over the source electrode layer and the drain electrode layer by a sputtering method using an oxide target with In:Ga:Zn=1:3:2 in atomic ratio. The deposition conditions were set as follows: an atmosphere of argon and oxygen (argon:oxygen=30 sccm:15 sccm) was used; the pressure was 0.4 Pa; the power was 0.5 kW (DC); the substrate temperature was 200° C.; and the distance between the substrate and the target was 60 mm.

Next, as a gate insulating film, a 20-nm-thick silicon oxynitride film was formed over the second oxide film by a CVD method at a film deposition temperature of 350° C. and a pressure of 200 Pa.

A 30-nm-thick tantalum nitride film and a 135-nm-thick tungsten film were stacked over the gate insulating film by a sputtering method, and then etched to form a gate electrode layer. The deposition conditions of the tantalum nitride film were set as follows: an atmosphere of argon and nitrogen (Ar:$N_2$=50 sccm:10 sccm) was used; the pressure was 0.6 Pa; the power was 1 kW (DC); and the distance between the substrate and the target was 60 mm. The deposition conditions of the tungsten film were set as follows: an argon atmosphere (flow rate: 100 sccm) was used; the pressure was 2.0 Pa; the power was 4 kW (DC); the distance between the substrate and the target was 60 mm; and the flow rate of heated argon gas that was for heating the substrate was 10 sccm.

The above etching of the tantalum nitride film and the tungsten film was performed as follows. The tungsten film was etched under first conditions where a mixed gas of chlorine, tetrafluoromethane, and oxygen ($Cl_2$:$CF_4$:$O_2$=45 sccm: 55 sccm:55 sccm) was used as etching gas; the power was 3 kW; the bias power was 110 W; the pressure was 0.67 Pa; and the substrate temperature was 40° C. Then, the tantalum nitride film was etched under second conditions where chlorine gas ($Cl_2$=100 sccm) was used as etching gas; the power was 2 kW; and the bias power was 50 W.

After removing the resist mask used for the processing of the gate electrode layer, the gate insulating film and the second oxide film were etched using the gate electrode layer as a mask; thus, the gate insulating layer and the second oxide layer were formed. The etching conditions were set as follows: boron trichloride (flow rate: 80 sccm) was used as etching gas; the power was 450 W; the bias power was 100 W; the pressure was 1.0 Pa; and the substrate temperature was 70° C.

Next, as a protective insulating layer, a 70-nm-thick aluminum oxide film was formed over the gate electrode layer so as to cover side surfaces of the second oxide layer and the gate insulating layer. The aluminum oxide film was deposited by a sputtering method using an aluminum oxide target, and the deposition conditions were set as follows: an atmosphere of argon and oxygen (argon:oxygen=25 sccm:25 sccm) was used; the pressure was 0.4 Pa; the power was 2.5 kW (RF); the substrate temperature was 250° C.; and the distance between the substrate and the target was 60 mm.

As an inorganic insulating layer, a 300-nm-thick silicon oxynitride film was deposited over the protective insulating layer by a CVD method.

Then, the substrate that was provided with the protective insulating layer and the insulating layer over the protective insulating layer (this stacked structure is hereinafter also referred to as an interlayer insulating layer) was subjected to heat treatment. In this example, heat treatment was performed under three different conditions after the formation of the interlayer insulating layer, and thus three kinds of samples were fabricated.

In the heat treatment condition 1, heat treatment was performed at 350° C. in an oxygen atmosphere for 1 hour. In the heat treatment condition 2, heat treatment was performed at 400° C. in an oxygen atmosphere for 1 hour. The samples of the heat treatment condition 3 were not subjected to heat treatment for comparison.

Then, in the samples of each kind, contact holes reaching the source electrode layer and the drain electrode layer were formed in the insulating layer and the protective insulating layer. The contact holes were formed as follows. First, the silicon oxynitride film was selectively removed in such a manner that etching was performed for approximately 1 minute using a mixed gas of trifluoromethane and helium ($CHF_3$:He=7.5 sccm:142.5 sccm) as etching gas, at a power of 475 W, a bias power of 300 W, a pressure of 5.5 Pa, and a substrate temperature of 70° C.; and then, the bias power was changed to 150 W and etching was performed for approximately 40 seconds. Then, the aluminum oxide film was selectively etched using boron trichloride ($BCl_3$; 80 sccm) as etching gas, at a power of 450 W, a bias power of 100 W, a pressure of 1.9 Pa, and a substrate temperature of 70° C.

In the contact holes and over the insulating layer, a conductive film for forming wiring layers was formed by a sputtering method. The conductive film had a structure in which a 50-nm-thick titanium film, a 200-nm-thick aluminum film, and a 50-nm-thick titanium film were stacked.

The deposition conditions of the titanium film were set as follows: an argon atmosphere (flow rate: 20 sccm) was used; the pressure was 0.1 Pa; the power was 12 kW (DC); the substrate temperature was room temperature; and the distance between the substrate and the target was 400 mm. Further, the deposition conditions of the aluminum film were set as follows: an argon atmosphere (flow rate: 50 sccm) was used; the pressure was 0.4 Pa; the power was 1 kW (DC); the substrate temperature was room temperature; and the distance between the substrate and the target was 60 mm.

Then, the conductive film having the stacked structure was selectively etched to form the wiring layers that are electrically connected to the source electrode layer or the drain electrode layer. The processing to the wiring layers was performed as follows. First, first etching was performed for approximately 100 seconds using a mixed gas of boron trichloride and chlorine ($BCl_3:Cl_2=60$ sccm:20 sccm) as etching gas, at a power of 450 W, a bias power of 100 W, a pressure of 1.9 Pa, and a substrate temperature of 70° C. Then, second etching was performed for approximately 15 seconds using tetrafluoromethane (flow rate: 80 sccm) as etching gas, at a power of 500 W, a bias power of 50 W, a pressure of 2.0 Pa, and a substrate temperature of 70° C.

Then, a 1.5-μm-thick polyimide film was formed by a coating method and subjected to heat treatment at 300° C. in an air atmosphere for 1 hour.

Through the above-described process, transistors of this example were fabricated.

Figure 16A:
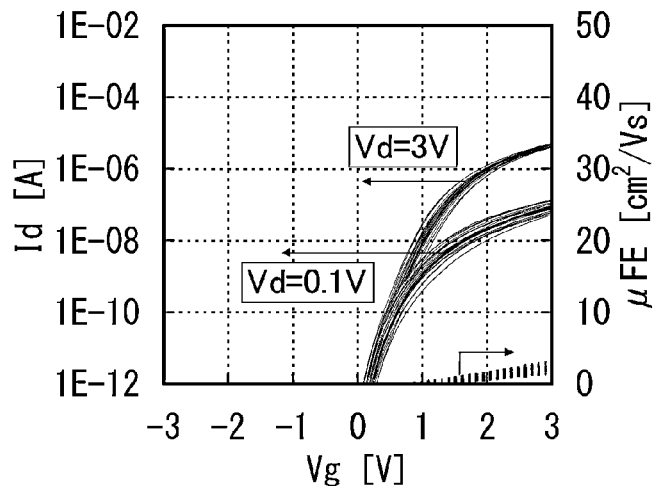
FIGS. 16A to 16C show evaluation results of electrical characteristics of transistors fabricated in Example 1.
Figure 16B:
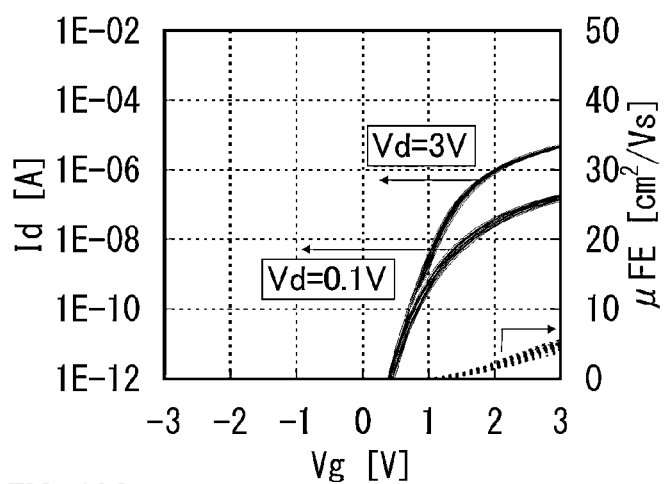
Figure 16C:
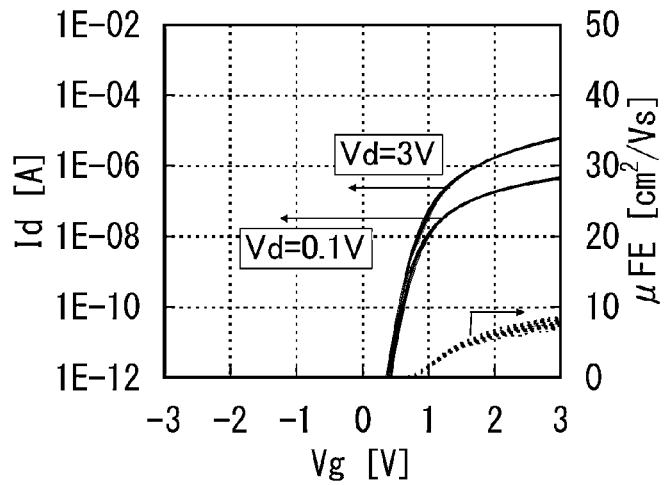

FIGS. 16A to 16C show evaluation results of electrical characteristics of the fabricated transistors. The transistors evaluated in FIGS. 16A to 16C have a channel length (L) of 0.48 μm and a channel width (W) of 1 μm. FIGS. 16A to 16C show gate voltage ($V_g$)-drain current ($I_d$) characteristics at a drain voltage ($V_d$) of 3 V or 0.1 V and a gate voltage ($V_g$) of 3 V and also show field-effect mobility at a drain voltage ($V_d$) of 0.1 V.

FIG. 16A shows evaluation results of electrical characteristics of the transistors (the number of samples n was 25) of the heat treatment condition 3 (without heat treatment), FIG. 16B shows evaluation results of electrical characteristics of the transistors (the number of samples n was 25) of the heat treatment condition 1 (at 350° C. in an oxygen atmosphere for 1 hour), and FIG. 16C shows evaluation results of electrical characteristics of the transistors (the number of samples n was 25) of the heat treatment condition 2 (at 400° C. in an oxygen atmosphere for 1 hour).

FIGS. 16A to 16C demonstrate that the transistors of this example including the comparative example have normally-off characteristics. Further, the results show that the heat treatment after the formation of the interlayer insulating layer reduces variations in electrical characteristics among the transistors.

In addition, the increase in the drain current around the threshold voltage becomes sharp by heat treatment. The subthreshold swing (S value) at a drain voltage of 0.1 V was 164.6 (mV/dec.) in the transistors of the heat treatment condition 3 (without heat treatment), 163.4 (mV/dec.) in the transistors of the heat treatment condition 1 (at 350° C. in an oxygen atmosphere for 1 hour), and 97.6 (mV/dec.) in the transistors of the heat treatment condition 2 (at 400° C. in an oxygen atmosphere for 1 hour). This indicates that the S value can be lowered by heat treatment after formation of the interlayer insulating layer. Note that the S value mentioned above for each condition is the median value of 25 transistor samples.

Further, the field-effect mobility at a drain voltage of 0.1 V was 2.2 ($cm^2/Vs$) in the transistors of the heat treatment condition 3 (without heat treatment), 4.9 ($cm^2/Vs$) in the transistors of the heat treatment condition 1 (at 350° C. in an oxygen atmosphere for 1 hour), and 7.7 ($cm^2/Vs$) in the transistors of the heat treatment condition 2 (at 400° C. in an oxygen atmosphere for 1 hour). This indicates that the field-effect mobility is increased by heat treatment after formation of the interlayer insulating layer. Note that the field-effect mobility mentioned above for each condition is the median value of 25 transistor samples.

The above results show that the heat treatment after formation of the interlayer insulating layer leads to a reduction of variations and favorable initial characteristics.

Next, to investigate the channel length (L) dependence of initial characteristics of the transistors of this example, the threshold voltage and the S value of transistors having a channel width (W) of 1 μm and various channel lengths (L) of from 0.2 μm to 100 μm were measured.

The evaluation results are shown in FIGS. 17A to 17F. In FIGS. 17A to 17C, the horizontal axis represents the channel length (μm) and the vertical axis represents the threshold voltage (V) at a drain voltage of 3 V. FIG. 17A shows evaluation results of the transistors of the heat treatment condition 3, FIG. 17B shows evaluation results of the transistors of the heat treatment condition 1, and FIG. 17C shows evaluation results of the transistors of the heat treatment condition 2.

In FIG. 17A, the threshold voltage decreases as the channel length becomes shorter, and the decrease is significant at a channel length of 1 μm or less. While in FIGS. 17B and 17C, a decrease in the threshold voltage at short channel lengths is not observed and the threshold voltage is substantially constant regardless of the channel length. These results show that a shift in the negative direction of the threshold voltage, which is caused when the channel length is small, is prevented by performing heat treatment after formation of the interlayer insulating layer.

In FIGS. 17D to 17F, the horizontal axis represents the channel length (μm) and the vertical axis represents the S value at a drain voltage of 0.1 V. FIG. 17D shows evaluation results of the transistors of the heat treatment condition 3, FIG. 17E shows evaluation results of the transistors of the heat treatment condition 1, and FIG. 17F shows evaluation results of the transistors of the heat treatment condition 2.

In FIG. 17D, large variations in S value are also observed between the transistors having the same channel length. While in FIGS. 17B and 17C, both variations between the transistors having the same channel length and variations between the transistors having different channel lengths are reduced. In particular, under the heat treatment condition 2 with the higher heat treatment temperature, both a reduction in variations and a decrease in S value can be achieved.

The above results show that variations in characteristics that are dependent on the channel length can be prevented by the heat treatment after formation of the interlayer insulating layer.

To investigate the dependence of initial characteristics of the transistors of this example on the length in the channel length direction of a region where the gate electrode layer overlaps with the source electrode layer or the drain electrode layer (Lov length), the shift value of the transistors having a channel length (L) of 1.13 μm, a channel width (W) of 10 μm, and Lov lengths of from 0 μm to 1 μm was measured.

Note that the shift value is defined as the value of gate voltage at the time when drain current rises. Specifically, in a graph showing the relation between gate voltage and drain current, the shift value can be defined as the voltage at the intersection of the steepest tangent of the gate voltage-drain current curve and the line representing the drain current=the lowest drain current. Here, the shift value is the value at the time when drain voltage is 3 V.

Figure 22A:
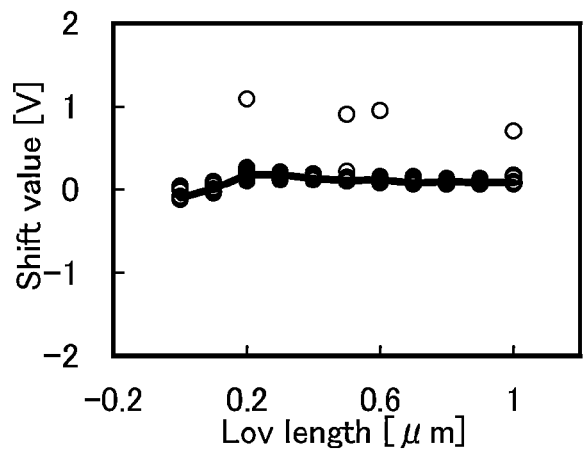
FIGS. 22A to 22C show evaluation results of the Lov length dependence of electrical characteristics of transistors fabricated in Example 1.
Figure 22B:
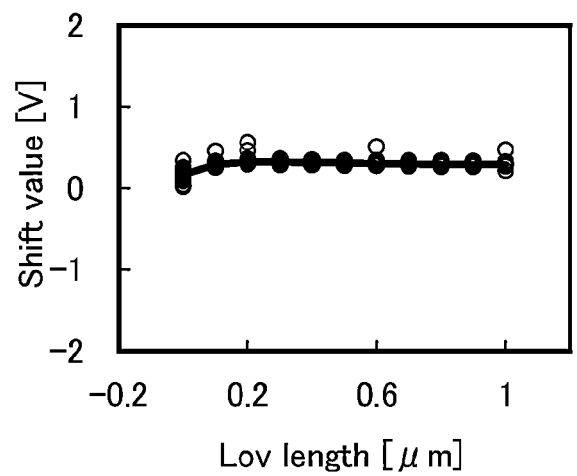
Figure 22C:
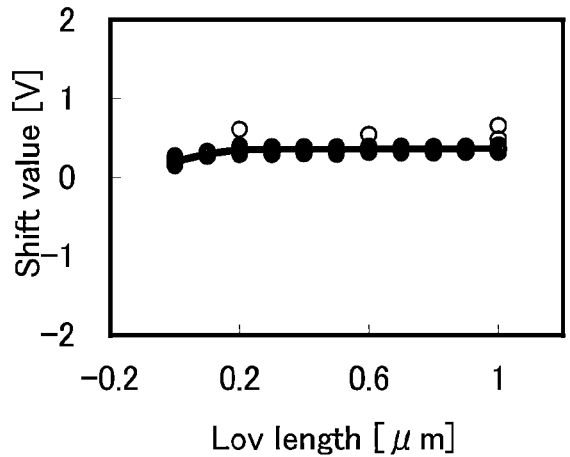

The evaluation results are shown in FIGS. 22A to 22C, where the horizontal axis represents the Lov length (μm) and the vertical axis represents the shift value (V). FIG. 22A shows evaluation results of the transistors of the heat treatment condition 3, FIG. 22B shows evaluation results of the transistors of the heat treatment condition 1, and FIG. 22C shows evaluation results of the transistors of the heat treatment condition 2.

In FIG. 22A, variations in shift value are also observed between the transistors having the same Lov length. While in FIGS. 22B and 22C, both variations between the transistors having the same Lov length and variations between the transistors having different Lov lengths are reduced.

The above results show that variations in characteristics that are dependent on the Lov length can be prevented by the heat treatment after formation of the interlayer insulating layer.

Next, to measure the reliability of the transistors fabricated in this example, plus gate BT (+GBT: plus gate bias temperature) test and minus gate BT (−GBT: minus gate bias temperature) test were performed. For these tests, the transistors having a channel length (L) of 0.48 μm and a channel width (W) of 1 μm were used.

In the plus gate BT test, the substrate temperature was first set at 40° C. and the gate voltage ($V_g$)-drain current ($I_d$) characteristics were measured. Then, the substrate temperature was set at 150° C., the gate voltage ($V_g$) was set at 3.3 V, the drain voltage ($V_d$) was set at 0 V, and the transistors were held for 1 hour. Then, the gate voltage ($V_g$) was set at 0 V and the substrate temperature was set at 40° C., and the gate voltage ($V_g$)-drain current ($I_d$) characteristics were measured.

In the minus gate BT test, the substrate temperature was first set at 40° C. and the gate voltage ($V_g$)-drain current ($I_d$) characteristics were measured, and then the substrate temperature was set at 150° C., the gate voltage ($V_g$) was set at −3.3 V, the drain voltage ($V_d$) was set at 0 V, and the transistors were held for 1 hour. Then, the gate voltage ($V_g$) was set at 0 V and the substrate temperature was set at 40° C., and the gate voltage ($V_g$)-drain current ($I_d$) characteristics were measured.

FIGS. 18A to 18C show the results of the plus gate BT test. FIG. 18A shows evaluation results of the transistors of the heat treatment condition 3, FIG. 18B shows evaluation results of the transistors of the heat treatment condition 1, and FIG. 18C shows evaluation results of the transistors of the heat treatment condition 2. Note that an arrow in each of FIGS. 18A to 18C indicates the shift (variation) of the gate voltage ($V_g$)-drain current ($I_d$) curve caused by the test.

The results of FIGS. 18A to 18C indicate that the difference of the heat treatment condition does not cause a big difference between the results of the plus gate BT test and that the shift (variation) in threshold voltage is small in the samples of each heat treatment condition.

Further, FIGS. 18D to 18F show the results of the minus gate BT test. FIG. 18D shows evaluation results of the transistors of the heat treatment condition 3, FIG. 18E shows evaluation results of the transistors of the heat treatment condition 1, and FIG. 18F shows evaluation results of the transistors of the heat treatment condition 2. Note that an arrow in each of FIGS. 18D to 18F indicates the shift (variation) of the gate voltage ($V_g$)-drain current ($I_d$) curve caused by the test.

As shown in FIG. 18D, threshold voltage of the samples that were not subjected to heat treatment after the formation of the interlayer insulating layer was shifted (varied) by the minus gate BT test. The amount of shift (ΔVth) was 0.77 (V).

Further, as shown in FIGS. 18E and 18F, the shift (variation) in threshold voltage was reduced in the samples that were subjected to heat treatment after the formation of the interlayer insulating layer. Under the heat treatment condition 1, the amount of shift (ΔVth) was reduced to 0.20 (V). Under the heat treatment condition 2 with the higher heat treatment temperature, the amount of shift (ΔVth) was only 0.03 (V). Note that the value of ΔVth mentioned above for each condition is the median value of 25 transistor samples.

The above results show that the transistor of one embodiment of the present invention can have a reduced variation in electrical characteristics, favorable initial characteristics and reliability, by being subjected to heat treatment after formation of the interlayer insulating layer. Further, using high temperature (in this example, 400° C.) for the heat treatment after the formation of the interlayer insulating layer, the transistor can have higher characteristics.

Example 2

In Example 2, transistors according to one embodiment of the present invention were fabricated, and initial characteristics and the long-term reliability of the transistors were evaluated. The evaluation results will be described.

First, the fabrication method of the transistors used in this example will be described below. In this example, transistors having a structure similar to that of the transistor 200 illustrated in FIGS. 1A to 1C were formed.

In this example, a silicon wafer was used as the substrate. First of all, a 100-nm-thick thermal oxide film was formed by performing heat treatment on the silicon wafer in an oxidizing atmosphere to which hydrogen chloride was added. The heat treatment temperature was set at 950° C. Then, as a base insulating layer, a 300-nm-thick silicon oxynitride film was formed over the thermal oxide film by a CVD method.

Further, a surface of the silicon oxynitride film was polished to be flat by chemical mechanical polishing (CMP) treatment. The CMP treatment conditions were set as follows: a polyurethane-based polishing cloth was used as a polishing pad for CMP; a 5-fold dilution of NP8020 (produced by Nitta Haas Incorporated) was used as slurry; the slurry temperature was room temperature; the polishing pressure was 0.01 MPa; the number of spindle rotations on the side where the substrate was fixed was 60 rpm; and the number of rotations of a table where the polishing cloth was fixed was 56 rpm. The CMP treatment time was 2 minutes. The polishing amount of the silicon oxynitride film was approximately 12 nm.

Next, heat treatment was performed at 450° C. in a reduced (vacuum) atmosphere for 1 hour.

After the heat treatment, oxygen ions were implanted to the base insulating layer by an ion implantation method. The oxygen ion implantation conditions were set as follows: acceleration voltage, 60 kV; dosage, $2.0 \times 10^{16}$ ions/cm$^2$; tilt angle, 7°; and twist angle, 72°.

Next, as the first oxide film, an In—Ga—Zn oxide film was formed over the base insulating layer by a sputtering method using an oxide target with an atomic ratio of In:Ga:Zn=1:3:2. The deposition conditions were set as follows: an atmosphere of argon and oxygen (argon:oxygen=30 sccm:15 sccm) was used; the pressure was 0.4 Pa; the power was 0.5 kW (DC); the substrate temperature was 200° C.; and the distance between the substrate and the target was 60 mm. In this example, five thickness conditions of the first oxide film were prepared: 20 nm, 40 nm, 50 nm, 60 nm, and 80 nm.

After the first oxide film was formed, an oxide semiconductor film was successively formed without exposure to the air. As the oxide semiconductor film, a 15-nm-thick In—Ga—Zn oxide film was deposited by a sputtering method using an oxide target with In:Ga:Zn=1:1:1 in atomic ratio. The deposition conditions were set as follows: an atmosphere of argon and oxygen (argon:oxygen=30 sccm:15 sccm) was used; the pressure was 0.4 Pa; the power was 0.5 kW (DC); the substrate temperature was 300° C.; and the distance between the substrate and the target was 60 mm.

Next, heat treatment was performed at 450° C. for 1 hour in a nitrogen atmosphere, and then heat treatment was performed at 450° C. for 1 hour in an oxygen atmosphere in the same treatment chamber.

The first oxide film and the oxide semiconductor film which have been subjected to the heat treatment were processed using a mask that was formed by photolithography, so that an island-shaped first oxide layer and an island-shaped oxide semiconductor layer were formed. For this processing, an inductively coupled plasma (ICP) etching method was employed.

The etching conditions for the samples having the 20-nm-thick and 40-nm-thick first oxide films were set as follows: a mixed gas of boron trichloride and chlorine ($BCl_3:Cl_2$=60 sccm:20 sccm) was used as etching gas; the power was 450 W; the bias power was 100 W; the pressure was 1.9 Pa; and the substrate temperature was 70° C. Further, the etching conditions for the samples having the 50-nm-thick, 60-nm-thick, and 80-nm-thick first oxide films were set as follows: boron trichloride ($BCl_3$; 80 sccm) was used as etching gas; the power was 450 W; the bias power was 100 W; the pressure was 1.0 Pa; and the substrate temperature was 70° C.

As a conductive film for forming a source electrode layer and a drain electrode layer, a 100-nm-thick tungsten film was formed over the island-shaped oxide semiconductor layer by a sputtering method. The deposition conditions of the tungsten film were set as follows: an argon atmosphere (flow rate: 80 sccm) was used; the pressure was 0.8 Pa; the power was 1 kW (DC); the substrate temperature was 200° C.; and the distance between the substrate and the target was 60 mm.

The tungsten film was selectively etched to form the source electrode layer and the drain electrode layer through a first etching step, a recession step of a resist mask by ashing, and a second etching step in succession, so that the tungsten film had a step-like end portion.

The conditions of the first etching step of the tungsten film were set as follows: a mixed gas of chlorine, tetrafluoromethane, and oxygen ($Cl_2:CF_4:O_2$=45 sccm:55 sccm:55 sccm) was used as etching gas; the power was 3000 W; the bias power was 110 W; the pressure was 0.67 Pa; and the substrate temperature was 40° C. Next, the resist mask was made to recede by etching under the following conditions: the flow rate of oxygen as an etching gas was 100 sccm, the power was 2000 W, the bias power was 0 W, the pressure was 3.00 Pa, and the substrate temperature was 40° C. Then, using this receding resist mask, the tungsten film was subjected to the second etching step under the following conditions: a mixed gas of chlorine, tetrafluoromethane, and oxygen ($Cl_2:CF_4:O_2$=45 sccm:55 sccm:55 sccm) was used as etching gas; the power was 3000 W; the bias power was 110 W; the pressure was 0.67 Pa; and the substrate temperature was 40° C. In this manner, the source electrode layer and the drain electrode layer were formed.

As a second oxide film, a 5-nm-thick In—Ga—Zn oxide film was formed over the source electrode layer and the drain electrode layer by a sputtering method using an oxide target with In:Ga:Zn=1:3:2 in atomic ratio. The deposition conditions were set as follows: an atmosphere of argon and oxygen (argon:oxygen=30 sccm:15 sccm) was used; the pressure was 0.4 Pa; the power was 0.5 kW (DC); the substrate temperature was 200° C.; and the distance between the substrate and the target was 60 mm.

Next, as a gate insulating film, a 20-nm-thick silicon oxynitride film was formed over the second oxide film by a CVD method at a film deposition temperature of 350° C. and a pressure of 200 Pa.

A 30-nm-thick tantalum nitride film and a 135-nm-thick tungsten film were stacked over the gate insulating film by a sputtering method, and then etched to form a gate electrode layer. The deposition conditions of the tantalum nitride film were set as follows: an atmosphere of argon and nitrogen ($Ar:N_2$=50 sccm:10 sccm) was used; the pressure was 0.6 Pa; the power was 1 kW (DC); and the distance between the substrate and the target was 60 mm. The deposition conditions of the tungsten film were set as follows: an argon atmosphere (flow rate: 100 sccm) was used; the pressure was 2.0 Pa; the power was 4 kW (DC); the distance between the substrate and the target was 60 mm; and the flow rate of heated argon gas that was for heating the substrate was 10 sccm.

The above etching of the tantalum nitride film and the tungsten film was performed as follows. The tungsten film was etched under first conditions where a mixed gas of chlorine, tetrafluoromethane, and oxygen ($Cl_2:CF_4:O_2$=45 sccm: 55 sccm:55 sccm) was used as etching gas; the power was 3 kW; the bias power was 110 W; the pressure was 0.67 Pa; and the substrate temperature was 40° C. Then, the tantalum nitride film was etched under second conditions where chlorine gas ($Cl_2$=100 sccm) was used as etching gas; the power was 2 kW; the bias power was 50 W; the pressure was 0.67 Pa; and the substrate temperature was 40° C.

After removing the resist mask used for the processing of the gate electrode layer, the gate insulating film and the second oxide film were etched using the gate electrode layer as a mask; thus, the gate insulating layer and the second oxide layer were formed. The etching conditions were set as follows: boron trichloride (flow rate: 80 sccm) was used as etching gas; the power was 450 W; the bias power was 100 W; the pressure was 1.0 Pa; and the substrate temperature was 70° C.

Next, as a protective insulating layer, a 70-nm-thick aluminum oxide film was formed over the gate electrode layer so as to cover side surfaces of the second oxide layer and the gate insulating layer. The aluminum oxide film was deposited by a sputtering method using an aluminum oxide target, and the deposition conditions were set as follows: an atmosphere of argon and oxygen (argon:oxygen=25 sccm:25 sccm) was used; the pressure was 0.4 Pa; the power was 2.5 kW (RF); the substrate temperature was 250° C.; and the distance between the substrate and the target was 60 mm.

As an inorganic insulating layer, a 300-nm-thick silicon oxynitride film was deposited over the protective insulating layer by a CVD method.

Then, the substrate that was provided with the protective insulating layer and the insulating layer over the protective insulating layer (this stacked structure is hereinafter also referred to as an interlayer insulating layer) was subjected to heat treatment at 400° C. in an oxygen atmosphere for 1 hour.

After the heat treatment, contact holes reaching the source electrode layer and the drain electrode layer were formed in the insulating layer and the protective insulating layer. The contact holes were formed as follows. First, the silicon oxynitride film was selectively removed in such a manner that etching was performed for approximately 1 minute using a mixed gas of trifluoromethane and helium ($CHF_3:He$=7.5 sccm:142.5 sccm) as etching gas, at a power of 475 W, a bias power of 300 W, a pressure of 5.5 Pa, and a substrate temperature of 70° C.; and then, the bias power was changed to 150 W and etching was performed for approximately 40 seconds. Then, the aluminum oxide film was selectively etched using boron trichloride (BCl$_3$; 80 sccm) as etching gas, at a power of 450 W, a bias power of 100 W, a pressure of 1.9 Pa, and a substrate temperature of 70° C.

In the contact holes and over the insulating layer, a conductive film for forming wiring layers was formed by a sputtering method. The conductive film had a structure in which a 50-nm-thick titanium film, a 200-nm-thick aluminum film, and a 50-nm-thick titanium film were stacked.

The deposition conditions of the titanium film were set as follows: an argon atmosphere (flow rate: 20 sccm) was used; the pressure was 0.1 Pa; the power was 12 kW (DC), the substrate temperature was room temperature; and the distance between the substrate and the target was 400 mm. Further, the deposition conditions of the aluminum film were set as follows: an argon atmosphere (flow rate: 50 sccm) was used; the pressure was 0.4 Pa; the power was 1 kW (DC); the substrate temperature was room temperature; and the distance between the substrate and the target was 60 mm.

Then, the conductive film having the stacked structure was selectively etched to form the wiring layers that are electrically connected to the source electrode layer or the drain electrode layer. The processing to the wiring layers was performed as follows. First, first etching was performed for approximately 100 seconds using a mixed gas of boron trichloride and chlorine (BCl$_3$:Cl$_2$=60 sccm:20 sccm) as etching gas, at a power of 450 W, a bias power of 100 W, a pressure of 1.9 Pa, and a substrate temperature of 70° C. Then, second etching was performed for approximately 15 seconds using tetrafluoromethane (flow rate: 80 sccm) as etching gas, at a power of 500 W, a bias power of 50 W, a pressure of 2.0 Pa, and a substrate temperature of 70° C.

Then, a 1.5-μm-thick polyimide film was formed by a coating method and subjected to heat treatment at 300° C. in an air atmosphere for 1 hour.

Through the above-described process, transistors of this example were fabricated.

Figure 19A:
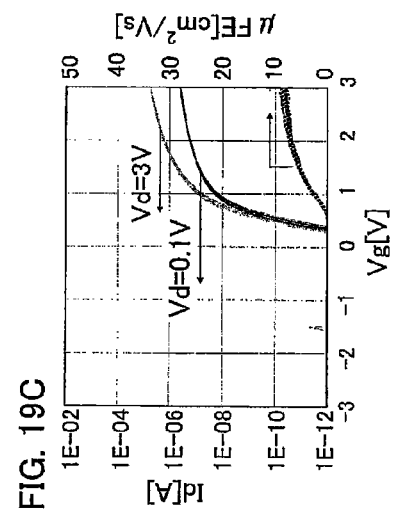
FIGS. 19A to 19E show evaluation results of electrical characteristics of transistors fabricated in Example 2.
Figure 19B:
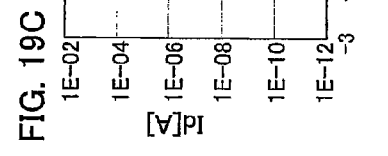
Figure 19C:
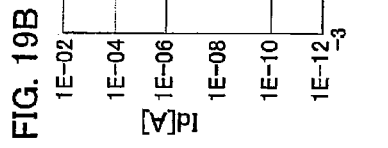

FIGS. 19A to 19E show evaluation results of electrical characteristics of the fabricated transistors. FIGS. 19A to 19C show gate voltage ($V_d$)-drain current ($I_d$) characteristics at a drain voltage ($V_d$) of 3 V or 0.1 V and a gate voltage ($V_g$) of 3 V and also show field-effect mobility at a drain voltage ($V_d$) of 0.1 V.

The transistors evaluated in FIGS. 19A to 19E have a channel length (L) of 0.47 μm and a channel width (W) of 0.8 μm. Here, the length in the channel length direction of a region where the oxide semiconductor layer overlaps with the source electrode layer or the drain electrode layer (Lov length) was set at 0.2 μm in the samples having the 20-nm-thick and 40-nm-thick first oxide layers. Further, the Lov length in the samples having the 50-nm-thick, 60-nm-thick, and 80-nm-thick first oxide layers was set at 1.0 μm.

Figure 19D:
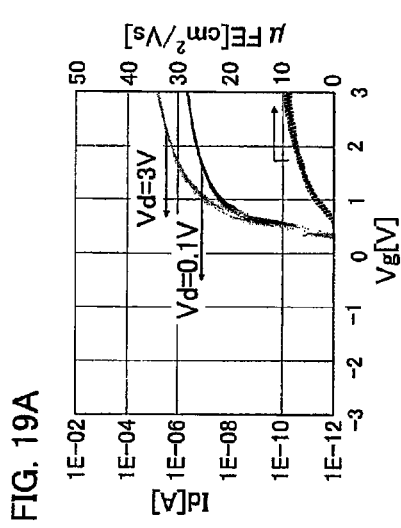
Figure 19E:
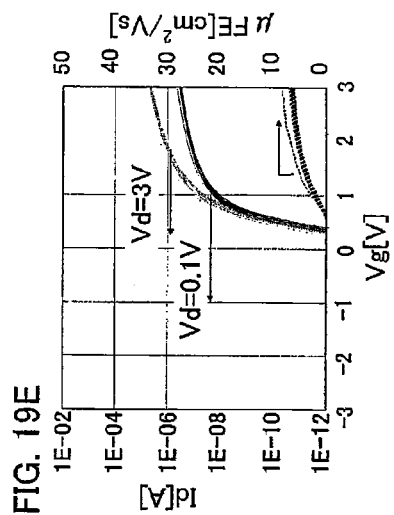

FIG. 19A shows evaluation results of electrical characteristics of the transistors in which the thickness of the first oxide layer (also referred to as S1) is 20 nm. FIG. 19B shows evaluation results of electrical characteristics of the transistors in which the thickness of the first oxide layer is 40 nm. FIG. 19C shows evaluation results of electrical characteristics of the transistors in which the thickness of the first oxide layer is 50 nm. FIG. 19D shows evaluation results of electrical characteristics of the transistors in which the thickness of the first oxide layer is 60 nm. FIG. 19E shows evaluation results of electrical characteristics of the transistors in which the thickness of the first oxide layer is 80 nm.

According to FIGS. 19A to 19E, the threshold voltage at a drain voltage of 3 V of the transistors of this example is 0.86 V when the thickness of the first oxide layer is 20 nm, 0.80 V when the thickness of the first oxide layer is 40 nm, 0.91 V when the thickness of the first oxide layer is 50 nm, 0.94 V when the thickness of the first oxide layer is 60 nm, and 0.91 V when the thickness of the first oxide layer is 80 nm. Note that the threshold voltage mentioned above for each condition is the median value of 25 transistor samples.

The S value at a drain voltage of 0.1 V in the transistors of this example is 83.4 (mV/dec.) when the thickness of the first oxide layer is 20 nm, 89.6 (mV/dec.) when the thickness of the first oxide layer is 40 nm, 92.1 (mV/dec.) when the thickness of the first oxide layer is 50 nm, 93.2 (mV/dec.) when the thickness of the first oxide layer is 60 nm, and 92.0 (mV/dec.) when the thickness of the first oxide layer is 80 nm. Note that the S value mentioned above for each condition is the median value of 25 transistor samples.

Furthermore, the field-effect mobility at a drain voltage of 0.1 V in the transistors of this example is 9.1 (cm$^2$/Vs) when the thickness of the first oxide layer is 20 nm, 9.7 (cm$^2$/Vs) when the thickness of the first oxide layer is 40 nm, 8.3 (cm$^2$/Vs) when the thickness of the first oxide layer is 50 nm, 6.9 (cm$^2$/Vs) when the thickness of the first oxide layer is 60 nm, and 6.6 (cm$^2$/Vs) when the thickness of the first oxide layer is 80 nm. Note that the field-effect mobility mentioned above for each condition is the median value of 25 transistor samples.

The above results show that the transistors of this example can have favorable initial characteristics. Further, the transistors of this example have normally-off characteristics independent of the thickness of the first oxide layer.

Next, to measure the reliability of the transistors fabricated in this example, plus gate BT test and minus gate BT test were performed. For these tests, the transistors having a channel length (L) of 0.82 μm (S1=20 nm, 40 nm) or 0.81 μm (S1=50 nm, 60 nm, 80 nm) and a channel width (W) of 10 μm were used.

In the plus gate BT test, the substrate temperature was first set at 40° C. and the gate voltage ($V_g$)-drain current ($I_d$) characteristics were measured. Then, the substrate temperature was set at 125° C., the gate voltage ($V_g$) was set at 3.3 V, the drain voltage ($V_d$) was set at 0 V, and the transistors were held. Then, the gate voltage ($V_g$) was set at 0 V and the substrate temperature was set at 40° C., and the gate voltage ($V_g$)-drain current ($I_d$) characteristics were measured. This measurement was performed with various holding time conditions: every hour from 1 hour to 9 hours, and 25 hours.

In the minus gate BT test, the substrate temperature was first set at 40° C. and the gate voltage ($V_g$)-drain current ($I_d$) characteristics were measured. Then the substrate temperature was set at 125° C., the gate voltage ($V_g$) was set at −3.3 V, the drain voltage ($V_d$) was set at 0 V, and the transistors were held. Then, the gate voltage ($V_g$) was set at 0 V and the substrate temperature was set at 40° C., and the gate voltage ($V_g$)-drain current ($I_d$) characteristics were measured. This measurement was performed with various holding time conditions: every hour from 1 hour to 9 hours, and 25 hours.

Figure 20A:
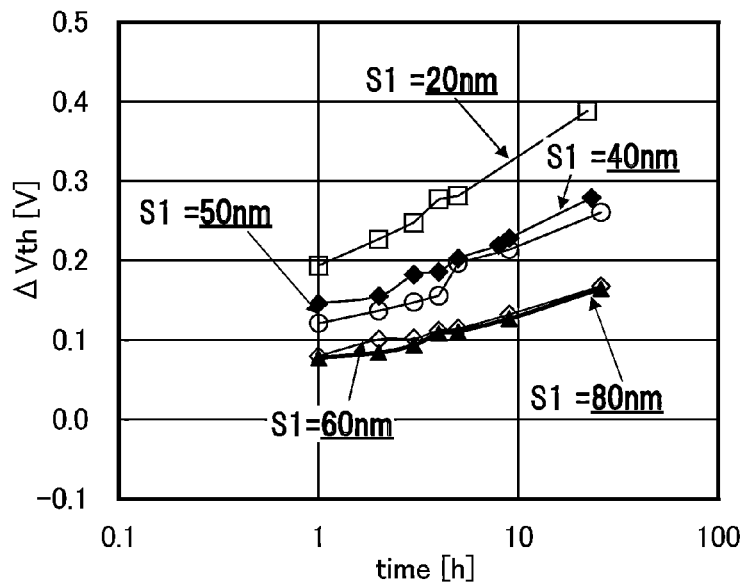
FIGS. 20A and 20B show evaluation results of the reliability test of transistors fabricated in Example 2.
Figure 20B:
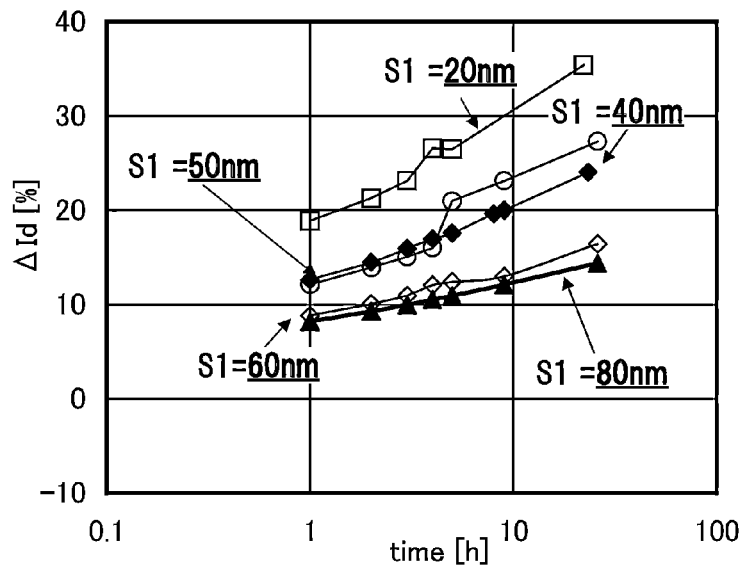

FIGS. 20A and 20B show the results of the plus gate BT test. FIG. 20A shows the evaluation results of variations in threshold voltage by the plus gate BT test, where the horizontal axis represents the holding time (h) and the vertical axis represents a variation in threshold voltage (V). Further, FIG. 20B shows the evaluation results of variations in drain current by the plus gate BT test, where the horizontal axis represents the holding time (h) and the vertical axis represents a variation in drain current (%).

The results of FIGS. 20A and 20B indicate that the variation in threshold voltage and the variation in drain current both become smaller as the first oxide layer has a larger thickness. A possible reason for this result is that a larger thickness of the first oxide layer can prevent more trap states that may be generated at the interface between the base insulating layer and the first oxide layer from influencing the channel.

In the transistors of this example, since the base insulating layer is covered with the second oxide film at the time of forming the gate insulating layer, release of oxygen from the base insulating layer can be prevented. In addition, since the aluminum oxide film with a low permeability to oxygen is provided as the protective insulating layer over the gate electrode layer, release of oxygen from the base insulating layer at the time of forming the protective insulating layer can be prevented. Thus, release of oxygen from the base insulating layer is prevented in the manufacturing process of the transistors, and this helps effectively supply oxygen from the base insulating layer to the oxide semiconductor layer through the first oxide layer even when the thickness of the first oxide layer is 80 nm.

Figure 21A:
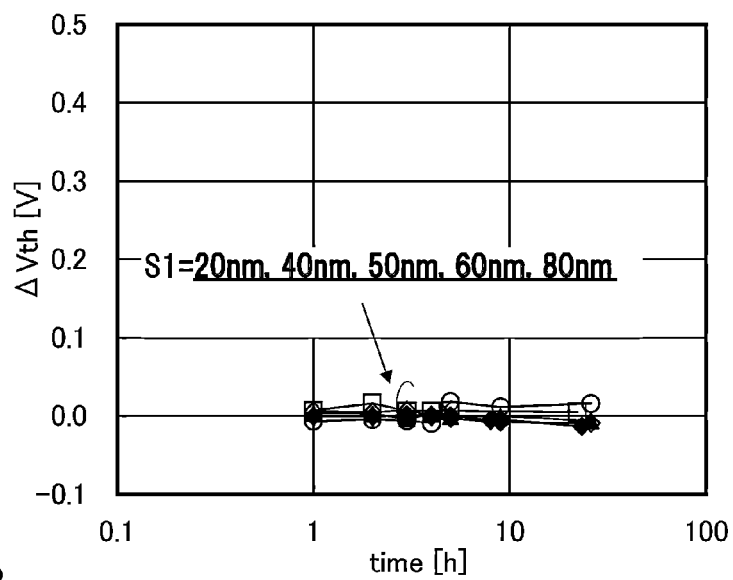
FIGS. 21A and 21B show evaluation results of the reliability test of transistors fabricated in Example 2.
Figure 21B:
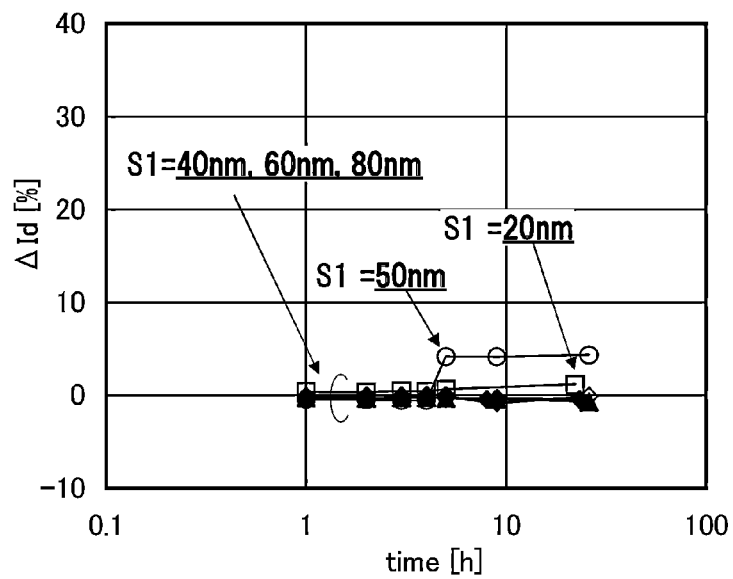

Further, FIGS. 21A and 21B show the results of the minus gate BT test. FIG. 21A shows the evaluation results of variations in threshold voltage by the minus gate BT test, where the horizontal axis represents the holding time (h) and the vertical axis represents a variation in threshold voltage (V). Further, FIG. 21B shows the evaluation results of variations in drain current by the minus gate BT test, where the horizontal axis represents the holding time (h) and the vertical axis represents a variation in drain current (%).

The results of FIGS. 21A and 21B indicate that the variations in both the threshold voltage and the drain current are tiny under every condition independently of the thickness of the first oxide layer.

The above-described results show that the transistors of this example can have favorable initial characteristics and reliability. In particular, the transistors of this example have favorable long-term reliability in both the plus gate BT test and minus gate BT test when the first oxide layer has a large thickness (e.g., 60 nm to 80 nm inclusive).

This application is based on Japanese Patent Application serial no. 2013-025140 filed with Japan Patent Office on Feb. 13, 2013 and Japanese Patent Application serial no. 2013-038705 filed with Japan Patent Office on Feb. 28, 2013, the entire contents of which are hereby incorporated by reference.

What is claimed is:

1. A semiconductor device comprising:
a first oxide layer;
an oxide semiconductor layer over and in contact with the first oxide layer;
a source electrode layer and a drain electrode layer electrically connected to the oxide semiconductor layer;
a second oxide layer over the source electrode layer and the drain electrode layer and in contact with the oxide semiconductor layer;
a gate insulating layer over the second oxide layer;
a gate electrode layer over the gate insulating layer; and
an insulating layer over the gate electrode layer,
wherein the insulating layer is in contact with a side surface of the second oxide layer and a side surface of the gate insulating layer,
wherein the oxide semiconductor layer includes one or more metal elements,
wherein the first oxide layer and the second oxide layer include at least one of the metal elements included in the oxide semiconductor layer, and
wherein the insulating layer has lower permeability to oxygen than the second oxide layer and the gate insulating layer.

2. The semiconductor device according to claim 1,
wherein in a cross-section of the semiconductor device, an upper edge of the second oxide layer coincides with a lower edge of the gate insulating layer, and an upper edge of the gate insulating layer coincides with a lower edge of the gate electrode layer.

3. The semiconductor device according to claim 1,
wherein the first oxide layer, the second oxide layer, and the oxide semiconductor layer include at least indium, and
wherein an atomic ratio of the indium in the oxide semiconductor layer is higher than an atomic ratio of the indium in the first oxide layer and an atomic ratio of the indium in the second oxide layer.

4. The semiconductor device according to claim 3,
wherein the first oxide layer, the second oxide layer, and the oxide semiconductor layer include indium, gallium and zinc.

5. The semiconductor device according to claim 1,
wherein the insulating layer comprises one of an aluminum oxide layer, a silicon nitride layer and a silicon nitride oxide layer.

6. The semiconductor device according to claim 1,
wherein a concentration of hydrogen in the insulating layer is lower than $5 \times 10^{19}$ atoms·cm$^{-3}$.

7. The semiconductor device according to claim 1,
wherein the oxide semiconductor layer includes crystals with c-axes aligned in a direction substantially perpendicular to a surface of the oxide semiconductor layer.

8. A semiconductor device comprising:
a first insulating layer containing oxygen;
a first oxide layer over and in contact with the first insulating layer;
an oxide semiconductor layer over and in contact with the first oxide layer;
a source electrode layer and a drain electrode layer electrically connected to the oxide semiconductor layer;
a second oxide layer over the source electrode layer and the drain electrode layer and in contact with the oxide semiconductor layer;
a gate insulating layer over the second oxide layer;
a gate electrode layer over the gate insulating layer; and
a second insulating layer over the gate electrode layer,
wherein the second insulating layer is in contact with a side surface of the second oxide layer and a side surface of the gate insulating layer,
wherein the oxide semiconductor layer includes one or more metal elements,
wherein the first oxide layer and the second oxide layer include at least one of the metal elements included in the oxide semiconductor layer, and
wherein the second insulating layer has lower permeability to oxygen than the second oxide layer and the gate insulating layer.

9. The semiconductor device according to claim 8,
wherein the second insulating layer is in contact with the first insulating layer.

10. The semiconductor device according to claim 8,
wherein in a cross-section of the semiconductor device, an upper edge of the second oxide layer coincides with a lower edge of the gate insulating layer, and an upper edge of the gate insulating layer coincides with a lower edge of the gate electrode layer.

11. The semiconductor device according to claim 8,
wherein the first oxide layer, the second oxide layer, and the oxide semiconductor layer include at least indium, and
wherein an atomic ratio of the indium in the oxide semiconductor layer is higher than an atomic ratio of the indium in the first oxide layer and an atomic ratio of the indium in the second oxide layer.

12. The semiconductor device according to claim 11,
wherein the first oxide layer, the second oxide layer, and the oxide semiconductor layer include indium, gallium and zinc.

13. The semiconductor device according to claim 8,
wherein the second insulating layer comprises one of an aluminum oxide layer, a silicon nitride layer and a silicon nitride oxide layer.

14. The semiconductor device according to claim 8,
wherein a concentration of hydrogen in the second insulating layer is lower than $5 \times 10^{19}$ atoms·cm$^{-3}$.

15. The semiconductor device according to claim 8,
wherein the oxide semiconductor layer includes crystals with c-axes aligned in a direction substantially perpendicular to a surface of the oxide semiconductor layer.

* * * * *